(12) United States Patent
Kusunoki et al.

(10) Patent No.: US 12,069,876 B2
(45) Date of Patent: Aug. 20, 2024

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Koji Kusunoki, Kanagawa (JP); Kazunori Watanabe, Tokyo (JP); Tomoaki Atsumi, Kanagawa (JP); Satoshi Yoshimoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/546,685

(22) PCT Filed: Feb. 14, 2022

(86) PCT No.: PCT/IB2022/051271
§ 371 (c)(1),
(2) Date: Aug. 16, 2023

(87) PCT Pub. No.: WO2022/180480
PCT Pub. Date: Sep. 1, 2022

(65) Prior Publication Data
US 2024/0138169 A1  Apr. 25, 2024
US 2024/0237376 A9  Jul. 11, 2024

(30) Foreign Application Priority Data
Feb. 25, 2021  (JP) .................................. 2021-028671

(51) Int. Cl.
*G02F 1/1333*  (2006.01)
*G06F 3/042*  (2006.01)
(Continued)

(52) U.S. Cl.
CPC ............. *H10K 39/34* (2023.02); *G06F 3/042* (2013.01); *G06V 40/1318* (2022.01);
(Continued)

(58) Field of Classification Search
CPC .......... G06F 2203/04108; G06F 3/042; G09G 3/3233; H10K 59/131; H10K 39/34; G06V 40/1318
See application file for complete search history.

(56) References Cited

U.S. PATENT DOCUMENTS

| | | |
|---|---|---|
| 5,953,985 A | 9/1999 | Kobayashi |
| 6,120,338 A | 9/2000 | Hirano et al. |

(Continued)

FOREIGN PATENT DOCUMENTS

| | | |
|---|---|---|
| CN | 109922283 A | 6/2019 |
| JP | 2000-036385 A | 2/2000 |

(Continued)

OTHER PUBLICATIONS

International Search Report (Application No. PCT/IB2022/051271) Dated May 24, 2022.

(Continued)

*Primary Examiner* — Abbas I Abdulselam
(74) *Attorney, Agent, or Firm* — Fish & Richardson P.C.

(57) ABSTRACT

A semiconductor device having a light sensing function and including a high-resolution display portion is provided. The semiconductor device includes a plurality of pixels, and the pixels each include first and second light-receiving devices, first to fifth transistors, a capacitor, and a first wiring. One electrode of the first light-receiving device is electrically connected to the first wiring, and the other electrode is electrically connected to one of a source and a drain of the first transistor. One electrode of the second light-receiving device is electrically connected to the first wiring, and the (Continued)

other electrode is electrically connected to one of a source and a drain of the second transistor. The other of the source and the drain of the second transistor is electrically connected to the other of the source and the drain of the first transistor. The other of the source and the drain of the first transistor is electrically connected to one electrode of the capacitor, one of a source and a drain of the third transistor, and a gate of the fourth transistor.

9 Claims, 41 Drawing Sheets

(51) Int. Cl.
*G06V 40/13* (2022.01)
*G09G 3/3233* (2016.01)
*H10K 39/34* (2023.01)
*H10K 59/131* (2023.01)

(52) U.S. Cl.
CPC ......... *G09G 3/3233* (2013.01); *H10K 59/131* (2023.02); *G06F 2203/04108* (2013.01); *G09G 2300/0819* (2013.01); *G09G 2300/0852* (2013.01); *G09G 2354/00* (2013.01); *G09G 2360/14* (2013.01)

(56) References Cited

U.S. PATENT DOCUMENTS

| | | |
|---|---|---|
| 7,965,266 B2 | 6/2011 | Yamaguchi et al. |
| 8,907,928 B2 | 12/2014 | Yamaguchi et al. |
| 10,834,339 B2 | 11/2020 | Numata |
| 2002/0072139 A1 | 6/2002 | Kashiwabara |
| 2006/0244693 A1 | 11/2006 | Yamaguchi et al. |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0120331 A1 | 5/2013 | Yamamoto et al. |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2014/0056493 A1 | 2/2014 | Gozzini |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2016/0172595 A1 | 6/2016 | Malinowski et al. |
| 2016/0315133 A1 | 10/2016 | Sato |
| 2017/0141167 A1 | 5/2017 | Naganuma |
| 2017/0256754 A1 | 9/2017 | Defranco et al. |
| 2018/0190908 A1 | 7/2018 | Ke et al. |
| 2019/0174075 A1 | 6/2019 | Numata |
| 2020/0203662 A1 | 6/2020 | Mollard et al. |

FOREIGN PATENT DOCUMENTS

| | | |
|---|---|---|
| JP | 2003-059663 A | 2/2003 |
| JP | 2006-301864 A | 11/2006 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-103004 A | 6/2019 |
| JP | 2019-179696 A | 10/2019 |
| JP | 2020-160305 A | 10/2020 |
| WO | WO-2012/014864 | 2/2012 |

OTHER PUBLICATIONS

Written Opinion (Application No. PCT/IB2022/051271) Dated May 24, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

22

21

11A

180A

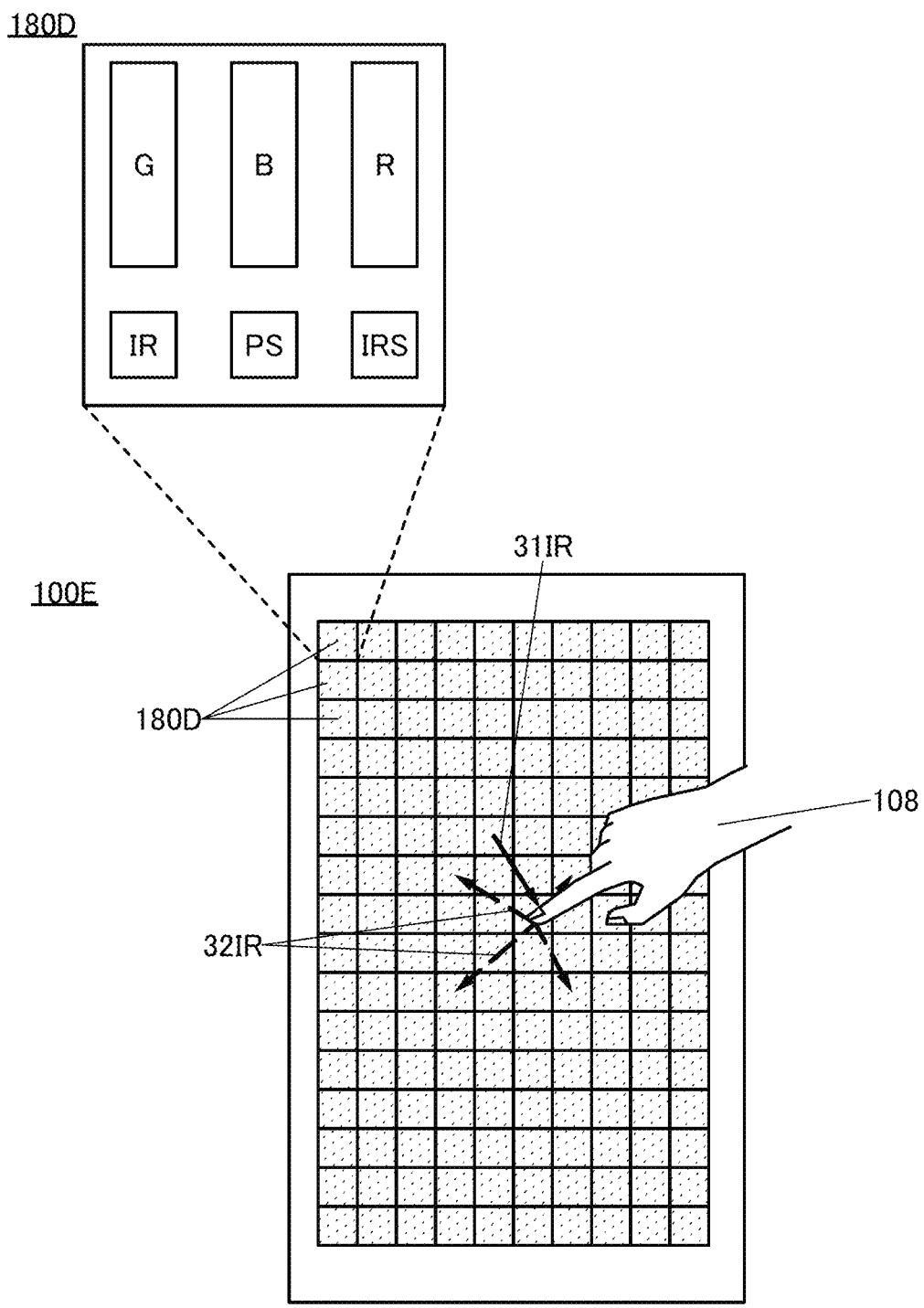

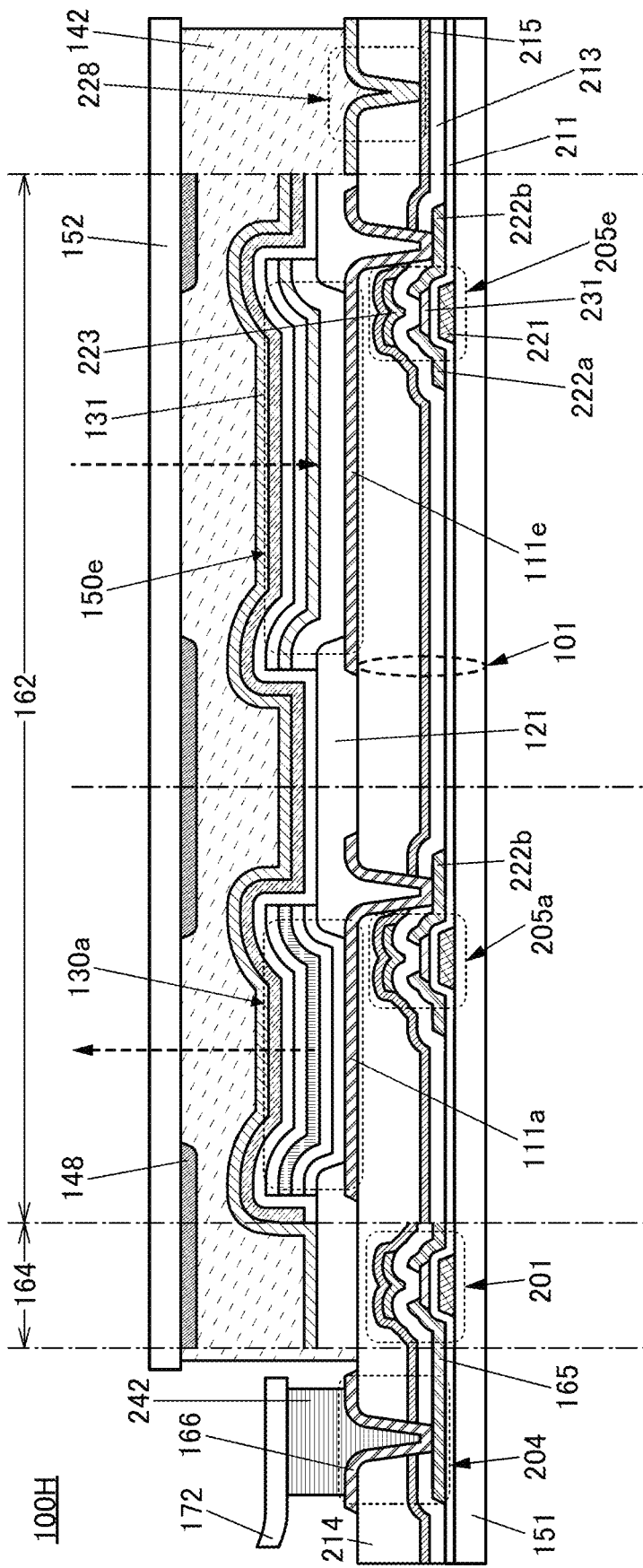
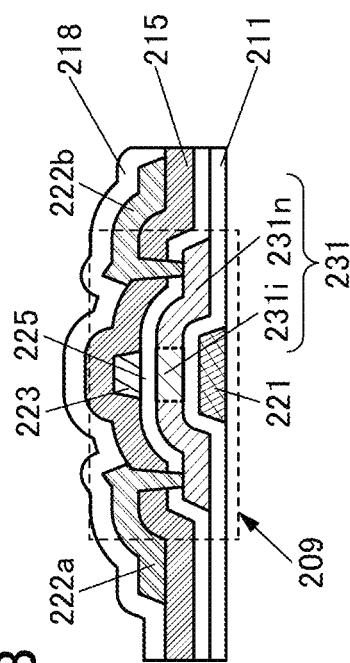
FIG. 32A
FIG. 32B
FIG. 32C

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2022/051271, filed on Feb. 14, 2022, which is incorporated by reference and claims the benefit of a foreign priority application filed in Japan on Feb. 25, 2021, as Application No. 2021-028671.

TECHNICAL FIELD

One embodiment of the present invention relates to a semiconductor device, a display apparatus, a display module, and an electronic device. One embodiment of the present invention relates to a method for fabricating a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, information terminal devices, for example, mobile phones such as smartphones, tablet information terminals, and laptop PCs (personal computers) have been widely used. Such information terminal devices often include personal information or the like, and thus various authentication technologies for preventing unauthorized use have been developed. Information terminal devices have been required to have a variety of functions such as an image display function, a touch sensor function, and a function of capturing images of fingerprints for authentication.

For example, Patent Document 1 discloses an electronic device including a fingerprint sensor in a push button switch portion.

Light-emitting apparatuses including light-emitting devices have been developed as display apparatuses, for example. Light-emitting devices utilizing an electroluminescence (hereinafter, referred to as EL) phenomenon (also referred to as EL devices or EL elements) have features such as ease of reduction in thickness and weight, high-speed response to input signals, and driving with a constant DC voltage power source, and have been used in display apparatuses.

REFERENCE

Patent Document

[Patent Document 1] United States Published Patent Application No. 2014/0056493

SUMMARY OF THE INVENTION

Problems to be Solved by the Invention

An object of one embodiment of the present invention is to provide a semiconductor device having a light sensing function and including a high-resolution display portion. An object of one embodiment of the present invention is to provide a semiconductor device having a light sensing function and including a high-definition display portion. An object of one embodiment of the present invention is to provide a semiconductor device having a light sensing function and including a large display portion. An object of one embodiment of the present invention is to provide a highly reliable semiconductor device having a light sensing function.

An object of one embodiment of the present invention is to provide a method for fabricating a semiconductor device having a light sensing function and including a high-resolution display portion. An object of one embodiment of the present invention is to provide a method for fabricating a semiconductor device having a light sensing function and including a high-definition display portion. An object of one embodiment of the present invention is to provide a method for fabricating a semiconductor device having a light sensing function and including a large display portion. An object of one embodiment of the present invention is to provide a method for fabricating a highly reliable semiconductor device having a light sensing function. An object of one embodiment of the present invention is to provide a method for fabricating a semiconductor device having a light sensing function with high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a semiconductor device including a plurality of pixels. The pixels each include a first pixel circuit. The first pixel circuit includes a first light-receiving device, a second light-receiving device, a first transistor, a second transistor, a third transistor, a fourth transistor, a fifth transistor, a capacitor, and a first wiring. One electrode of the first light-receiving device is electrically connected to the first wiring, and the other electrode of the first light-receiving device is electrically connected to one of a source and a drain of the first transistor. One electrode of the second light-receiving device is electrically connected to the first wiring, and the other electrode of the second light-receiving device is electrically connected to one of a source and a drain of the second transistor. The other of the source and the drain of the second transistor is electrically connected to the other of the source and the drain of the first transistor. The other of the source and the drain of the first transistor is electrically connected to one electrode of the capacitor. The other of the source and the drain of the first transistor is electrically connected to one of a source and a drain of the third transistor. The other of the source and the drain of the first transistor is electrically connected to a gate of the fourth transistor. One of a source and a drain of the fourth transistor is electrically connected to one of a source and a drain of the fifth transistor.

In the above-described semiconductor device, it is preferable that the first light-receiving device have a function of sensing visible light and the second light-receiving device have a function of sensing infrared light.

The above-described semiconductor device preferably includes a second wiring. The second wiring is electrically connected to the other of the source and the drain of the third transistor. A potential of the second wiring is preferably lower than a potential of the first wiring.

The above-described semiconductor device preferably includes a second wiring. The second wiring is electrically connected to the other of the source and the drain of the third transistor. A potential of the second wiring is preferably higher than a potential of the first wiring.

In the above-described semiconductor device, the pixels each preferably include a second pixel circuit. The second pixel circuit includes a first light-emitting device. The first light-emitting device has a function of emitting visible light, and one electrode of the first light-emitting device is electrically connected to the first wiring.

In the above-described semiconductor device, the pixels each preferably include a third pixel circuit. The third pixel circuit includes a second light-emitting device. The second light-emitting device has a function of emitting infrared light, and one electrode of the second light-emitting device is electrically connected to the first wiring.

One embodiment of the present invention is an electronic device including the above-described semiconductor device, the second light-emitting device, and a housing. The second light-emitting device has a function of emitting infrared light, and the second light-emitting device has a function of emitting light to the outside through the semiconductor device.

Effect of the Invention

According to one embodiment of the present invention, a semiconductor device having a light sensing function and including a high-resolution display portion can be provided. According to one embodiment of the present invention, a semiconductor device having a light sensing function and including a high-definition display portion can be provided. According to one embodiment of the present invention, a semiconductor device having a light sensing function and including a large display portion can be provided. According to one embodiment of the present invention, a highly reliable semiconductor device having a light sensing function can be provided.

According to one embodiment of the present invention, a method for fabricating a semiconductor device having a light sensing function and including a high-resolution display portion can be provided. According to one embodiment of the present invention, a method for fabricating a semiconductor device having a light sensing function and including a high-definition display portion can be provided. According to one embodiment of the present invention, a method for fabricating a semiconductor device having a light sensing function and including a large display portion can be provided. According to one embodiment of the present invention, a method for fabricating a highly reliable semiconductor device having a light sensing function can be provided. According to one embodiment of the present invention, a method for fabricating a semiconductor device having a light sensing function with high yield can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 22 is a diagram illustrating an example of a layout of a display apparatus.

FIG. 32A is a cross-sectional view illustrating an example of a display apparatus. FIG. 32B and FIG. 32C are cross-sectional views illustrating examples of a transistor.

MODE FOR CARRYING OUT THE INVENTION

Figure 1A:
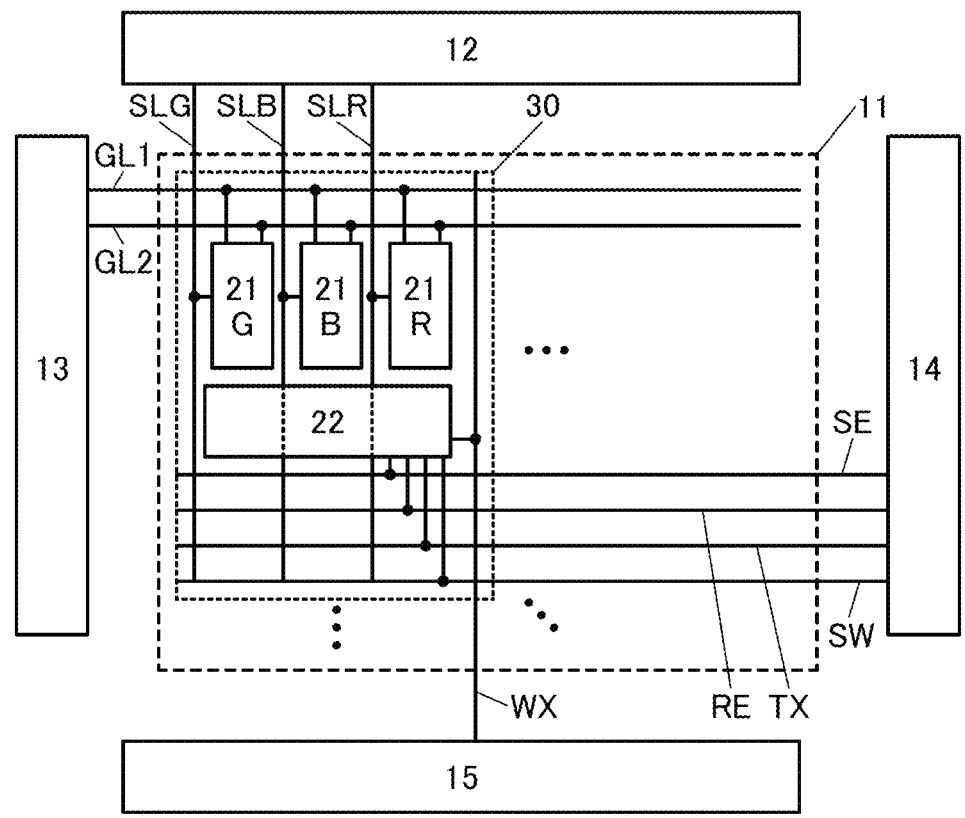
FIG. 1A is a block diagram illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". For another example, the term "insulating film" can be replaced with the term "insulating layer".

Embodiment 1

In this embodiment, a display apparatus will be described as a semiconductor device of one embodiment of the present invention.

A display apparatus of one embodiment of the present invention includes a pixel including a light-emitting device, a first light-receiving device, and a second light-receiving device.

The display apparatus of one embodiment of the present invention can display an image with the use of the light-emitting device. The display apparatus of one embodiment of the present invention can perform one or both of image capturing and sensing with the use of the first light-receiving device or the second light-receiving device.

More specific examples will be described below with reference to drawings.

Structure Example

FIG. 1A is a block diagram of the display apparatus of one embodiment of the present invention. A display apparatus 10 illustrated in FIG. 1A includes a display portion 11, a driver circuit portion 12, a driver circuit portion 13, a driver circuit portion 14, and a circuit portion 15. The display portion 11 includes a plurality of pixels 30 arranged in a matrix.

Figure 1B:
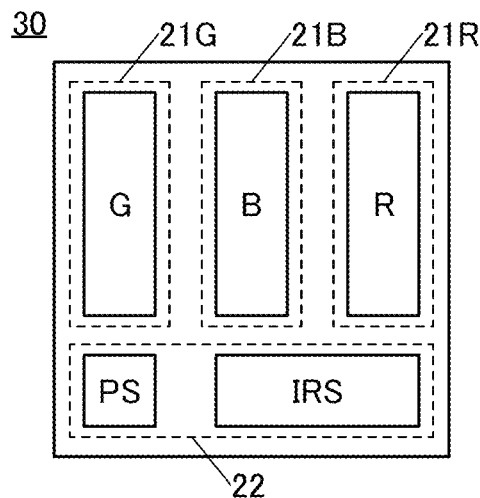
FIG. 1B is a diagram illustrating an example of a pixel of the display apparatus.

FIG. 1B illustrates a structure example of each of the pixels 30. The pixel 30 includes a subpixel G, a subpixel B, a subpixel R, a subpixel PS, and a subpixel IRS. The subpixel G, the subpixel B, and the subpixel R each have a function of emitting light (hereinafter, also referred to as a light-emitting function). The subpixel PS and the subpixel IRS each have a function of receiving light (hereinafter, also referred to as a light-receiving function). The display portion of the display apparatus of one embodiment of the present invention has one or both of an image capturing function and a sensing function in addition to an image display function.

A structure can be employed in which the subpixel R emits red light, the subpixel G emits green light, and the subpixel B emits blue light, for example. Thus, the display apparatus can perform full-color display. Although the example in which the pixel 30 includes subpixels of three colors is illustrated here, subpixels of four or more colors may be included. The pixel may include a subpixel that emits light of a color other than red, green, and blue. For example, the pixel 30 may include, in addition to the three subpixels, a subpixel emitting white light, a subpixel emitting yellow light, or the like.

The subpixel PS has a function of receiving visible light. The subpixel IRS has a function of receiving infrared light.

The subpixel R, the subpixel G, and the subpixel B each include a light-emitting device (also referred to as a light-emitting element). The subpixel R includes a light-emitting device that emits red light. The subpixel G includes a light-emitting device that emits green light. The subpixel B includes a light-emitting device that emits blue light.

The subpixel PS and the subpixel IRS each include a light-receiving device (also referred to as a light-receiving element) that functions as a photoelectric conversion element. The light-receiving device functions as a photoelectric conversion device that senses light entering the light-receiving device and generates electric charge. The amount of generated electric charge depends on the amount of light entering the light-receiving device. The subpixel PS includes a light-receiving device having a function of receiving visible light. The subpixel IRS includes a light-receiving device having a function of receiving infrared light. The light-receiving device having a function of receiving visible light has sensitivity to visible light (light with a wavelength greater than or equal to 400 nm and less than 700 nm). The light-receiving device that receives infrared light has sensitivity to infrared light (light with a wavelength greater than or equal to 700 nm and less than 900 nm).

In FIG. 1B, a light-emitting region of the subpixel R is denoted by R, a light-emitting region of the subpixel G is denoted by G, a light-emitting region of the subpixel B is denoted by B, a light-receiving region of the subpixel PS is denoted by PS, and a light-receiving region of the subpixel IRS is denoted by IRS to easily differentiate the light-emitting devices and the light-receiving devices.

Although the light-emitting regions and the light-receiving regions are shown by rectangles in FIG. 1B, one embodiment of the present invention is not limited thereto. There is no particular limitation on the shapes of the light-emitting regions and the light-receiving regions.

The area of the light-receiving region (also simply referred to as a light-receiving area) of the subpixel PS is preferably smaller than a light-receiving area of the subpixel IRS. When the light-receiving area of the subpixel PS is made small, that is, an image-capturing range is made narrow, the subpixel PS can perform image capturing with higher resolution than the subpixel IRS. In this case, the subpixel PS can be used to capture an image for personal authentication using a fingerprint, a palm print, the iris, the shape of a blood vessel (including the shape of a vein and the shape of an artery), a face, or the like, for example. Note that the wavelength of light sensed by the subpixel PS may be determined as appropriate depending on the intended use.

The subpixel IRS can be used in a touch sensor (also referred to as a direct touch sensor), a near touch sensor (also referred to as a hover sensor, a hover touch sensor, a contactless sensor, or a touchless sensor), or the like. For example, the subpixel IRS sensing infrared light allows touch sensing even in a dark place. Note that the wavelength of light sensed by the subpixel IRS may be determined as appropriate depending on the intended use.

Here, a touch sensor or a near touch sensor can sense an approach or touch of an object (e.g., a finger, a hand, or a pen). A touch sensor can sense an object when a display apparatus and the object come in direct contact with each other. A near touch sensor can sense an object even when the object does not touch a display apparatus. For example, a display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of the object. In other words, the display apparatus can be operated in a contactless (touchless) manner. With the above-described structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of a touch sensor or a near touch sensor may be changed in accordance with the refresh rate. In the case where the refresh rate of the display apparatus is 120 Hz, for example, the driving frequency of a touch sensor or a near touch sensor can be higher than 120 Hz (typically, 240 Hz). This structure can achieve low power consumption and can increase the response speed of a touch sensor or a near touch sensor.

Since the light-receiving device included in the subpixel PS and the light-receiving device included in the subpixel IRS have difference in the sensing accuracy, methods for sensing an object may be selected depending on the functions. For example, a function of scrolling a display screen may be achieved by a near touch sensor function using the subpixel IRS, and an input function with a keyboard displayed on a screen may be achieved by a high-resolution touch sensor function using the subpixel PS.

When one pixel includes two kinds of light-receiving devices, the display apparatus can have two additional functions as well as a display function, enabling a multifunctional display apparatus.

For high-resolution image capturing, the subpixels PS are preferably provided in all the pixels included in the display apparatus. Meanwhile, the subpixels IRS used in a touch sensor, a near touch sensor, or the like may be provided in some of the pixels included in the display apparatus because sensing with the subpixels IRS is not required to have high accuracy as compared to sensing with the subpixels PS. When the number of subpixels IRS included in the display apparatus is smaller than the number of subpixels PS, the sensing speed can be increased.

FIG. 1B illustrates an example in which the subpixels are provided in two rows and three columns in one pixel 30. The pixel 30 includes three subpixels (the subpixel G, the subpixel B, and the subpixel R) in the upper row (first row) and two subpixels (the subpixel PS and the subpixel IRS) in the lower row (second row). In other words, the pixel 30 includes two subpixels (the subpixel G and the subpixel PS) in the left column (first column), the subpixel B in the center column (second column), the subpixel R in the right column (third column), and the subpixel IRS across these two columns. Note that the arrangement of the subpixels is not limited to that in the structure in FIG. 1B.

As illustrated in FIG. 1A, the pixel 30 includes a pixel circuit 21R, a pixel circuit 21G, a pixel circuit 21B, and a pixel circuit 22. The pixel circuit 21R has a function of controlling light emission from the subpixel R. The pixel circuit 21G has a function of controlling light emission from the subpixel G. The pixel circuit 21B has a function of controlling light emission from the subpixel B. The pixel circuit 22 has a function of controlling light reception of the subpixel PS and a function of controlling light reception of the subpixel IRS. The pixel circuit 22 can be regarded as being shared by the subpixel PS and the subpixel IRS.

A wiring SE, a wiring RE, a wiring TX, a wiring SW, and a wiring WX are electrically connected to the pixel circuit 22.

The wiring SE, the wiring RE, the wiring TX, and the wiring SW are electrically connected to the pixel circuits 22 arranged in the row direction (the extending direction of the wiring SE and the like). The wiring SE, the wiring RE, the wiring TX, and the wiring SW are electrically connected to the driver circuit portion 14. The driver circuit portion 14 has a function of generating signals for driving the pixel circuits 22 and outputting the signals to the pixel circuits 22 through the wiring SE, the wiring RE, the wiring TX, and the wiring SW. The driver circuit portion 14 has a function of selecting the pixel 30 from which image capturing data is read. Specifically, the pixel 30 from which image capturing data is read can be selected by supply of a signal to the wiring SE.

The wiring WX is electrically connected to the pixel circuits 22 arranged in the column direction (the extending direction of the wiring WX). The wiring WX is electrically connected to the circuit portion 15. The circuit portion 15 has a function of receiving signals output from the pixel circuits 22 through the wiring WX and outputting the signals to the outside as image capturing data. The circuit portion 15 functions as a read circuit. The wiring WX can be referred to as a read line.

In this specification and the like, image capturing data refers to data corresponding to the amount of light entering the light-receiving devices included in the pixel circuit 22. A signal output from the pixel circuit 22 to the circuit portion 15 is sometimes referred to as image capturing data. In addition, a signal output from the circuit portion 15 to the outside is sometimes referred to as image capturing data.

A wiring SLR, a wiring GL1, and a wiring GL2 are electrically connected to the pixel circuit 21R. A wiring SLG, the wiring GL1, and the wiring GL2 are electrically connected to the pixel circuit 21G. A wiring SLB, the wiring GL1, and the wiring GL2 are electrically connected to the pixel circuit 21B.

The wiring SLR, the wiring SLG, and the wiring SLB are electrically connected to the pixel circuits 21R, the pixel circuits 21G, and the pixel circuits 21B arranged in the column direction (the extending direction of the wiring SLR and the like), respectively. The wiring SLR, the wiring SLG, and the wiring SLB are electrically connected to the driver circuit portion 12. The driver circuit portion 12 functions as a source line driver circuit (also referred to as a source driver) and supplies data signals (data potentials) to the pixel circuits 21R, the pixel circuits 21G, and the pixel circuits 21B through the wiring SLR, the wiring SLG, and the wiring SLB, respectively.

The wiring GL1 and the wiring GL2 are electrically connected to the pixel circuits 21R, the pixel circuits 21G, and the pixel circuits 21B arranged in the row direction (the extending direction of the wiring GL1 and the wiring GL2). The wiring GL1 and the wiring GL2 are electrically connected to the driver circuit portion 13. The driver circuit portion 13 functions as a gate line driver circuit (also referred to as a gate driver) and supplies selection signals to the wiring GL1 and the wiring GL2.

As illustrated in FIG. 1A, the pixels 30 each including the pixel circuit 21R, the pixel circuit 21G, the pixel circuit 21B, and the pixel circuit 22 are arranged in a matrix, which makes the definition (the number of pixels) of display equal to the definition (the number of pixels) of image capturing. Note that a high definition is not required in some cases, for example, when the pixel circuits 22 are used only for a touch panel function. In such a case, the pixels 30 including the pixel circuits 22 and pixels not including the pixel circuits 22 (i.e., pixels each formed with the pixel circuit 21R, the pixel circuit 21G, and the pixel circuit 21B) may be configured to be both provided.

<Structure Example of Pixel Circuit 22>

Figure 2A:
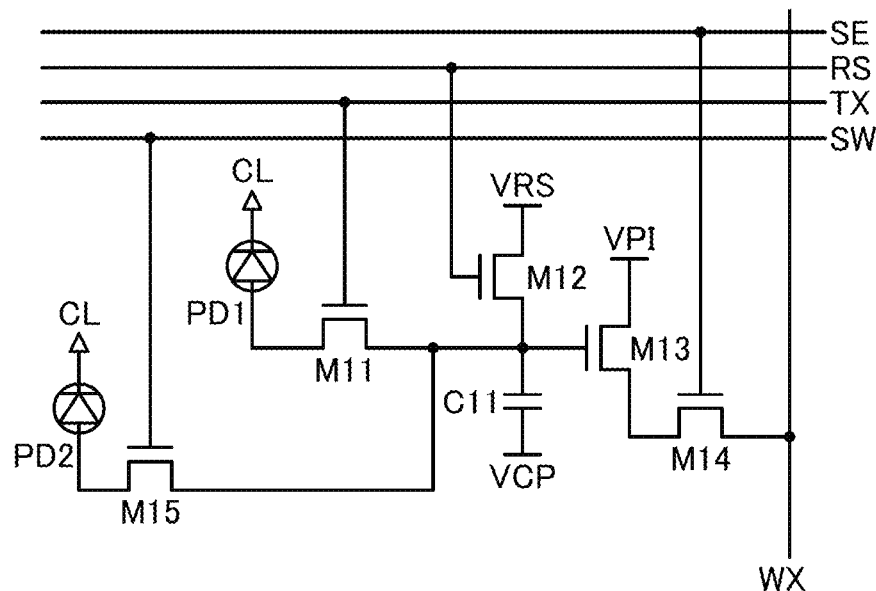
FIG. 2A and FIG. 2B are diagrams each illustrating an example of a pixel circuit.

FIG. 2A illustrates an example of a pixel circuit that can be used as the pixel circuit 22.

The pixel circuit 22 includes a transistor M11, a transistor M12, a transistor M13, a transistor M14, a transistor M15, a capacitor C11, a light-receiving device PD1, and a light-receiving device PD2.

One terminal of the light-receiving device PD1 is electrically connected to one of a source and a drain of the transistor M11. The other terminal of the light-receiving device PD1 is electrically connected to a wiring CL. A gate of the transistor M11 is electrically connected to the wiring TX. One terminal of the light-receiving device PD2 is electrically connected to one of a source and a drain of the transistor M15. The other terminal of the light-receiving device PD2 is electrically connected to the wiring CL. A gate of the transistor M15 is electrically connected to the wiring SW. The other of the source and the drain of the transistor M15 is electrically connected to the other of the source and the drain of the transistor M11. The other of the source and the drain of the transistor M11 is electrically connected to one electrode of the capacitor C11. The other electrode of the capacitor C11 is electrically connected to a wiring VCP. The other of the source and the drain of the transistor M11 is electrically connected to one of a source and a drain of the transistor M12. A gate of the transistor M12 is electrically connected to the wiring RS. The other of the source and the drain of the transistor M12 is electrically connected to a wiring VRS. The other of the source and the drain of the transistor M11 is electrically connected to a gate of the transistor M13. One of a source and a drain of the transistor M13 is electrically connected to a wiring VPI. The other of the source and the drain of the transistor M13 is electrically connected to one of a source and a drain of the transistor M14. A gate of the transistor M14 is electrically connected to the wiring SE. The other of the source and the drain of the transistor M14 is electrically connected to the wiring WX.

A signal for controlling the conduction or non-conduction of the transistor M14 is supplied to the wiring SE. A signal for controlling the conduction or non-conduction of the transistor M12 is supplied to the wiring RS. A signal for controlling the conduction or non-conduction of the transistor M11 is supplied to the wiring TX. A signal for controlling the conduction or non-conduction of the transistor M15 is supplied to the wiring SW. A constant potential is supplied to the wiring VCP. A constant potential is supplied as a reset potential to the wiring VRS. A constant potential is supplied to the wiring VPI.

Each of the transistor M11, the transistor M12, the transistor M14, and the transistor M15 functions as a switch. The transistor M13 functions as an amplifier element (amplifier).

In the case where the cathode of the light-receiving device PD1 and the cathode of the light-receiving device PD2 are electrically connected to the wiring CL as illustrated in FIG. 2A, a potential supplied to the wiring VRS is preferably lower than a potential supplied to the wiring CL. By contrast, in the case where the anode of the light-receiving device PD1 and the anode of the light-receiving device PD2 are electrically connected to the wiring CL, the potential supplied to the wiring VRS is preferably higher than the potential supplied to the wiring CL.

A light-receiving device having a function of receiving visible light can be used as the light-receiving device PD1, and a light-receiving device having a function of receiving infrared light can be used as the light-receiving device PD2. Alternatively, a light-receiving device having a function of receiving infrared light may be used as the light-receiving device PD1, and a light-receiving device having a function of receiving visible light may be used as the light-receiving device PD2.

In the display apparatus of one embodiment of the present invention, the pixel circuit 22 has a function of controlling light reception of the subpixel PS and a function of controlling light reception of the subpixel IRS. With the pixel circuit 22, the numbers of transistors, wirings, and the like can be smaller and the pixel size can be smaller than those in the case where a pixel circuit having a function of controlling light reception of the subpixel PS and a pixel circuit having a function of controlling light reception of the subpixel IRS are separately provided, so that the display apparatus can have a high resolution.

In the display apparatus of one embodiment of the present invention, it is preferable to use transistors containing a metal oxide (hereinafter, also referred to as an oxide semiconductor) in their semiconductor layers where channels are formed (such transistors are hereinafter also referred to as OS transistors) as all the transistors included in the pixel circuit 22. An OS transistor has an extremely low off-state current and enables electric charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors containing silicon in their semiconductor layers where channels are formed (such transistors are hereinafter also referred to as Si transistors) as all the transistors included in the pixel circuit. Examples of silicon include single crystal silicon, polycrystalline silicon, and amorphous silicon. It is particularly preferable to use transistors containing low-temperature polysilicon (LTPS) in their semiconductor layers (such transistors are hereinafter also referred to as LTPS transistors). An LTPS transistor has high field-effect mobility and can operate at high speed.

In the display apparatus of one embodiment of the present invention, two kinds of transistors are preferably used in the pixel circuit. Specifically, the pixel circuit preferably includes an OS transistor and an LTPS transistor. Changing the material of the semiconductor layer depending on the desired function of the transistor can increase the quality of the pixel circuit and the accuracy of sensing or image capturing.

For example, it is preferable to use, as all of the transistor M11 to the transistor M15, LTPS transistors containing low-temperature polysilicon in their semiconductor layers. Alternatively, it is preferable that OS transistors containing a metal oxide in their semiconductor layers be used as the transistor M11, the transistor M12, and the transistor M15 and an LTPS transistor be used as the transistor M13. In this case, the transistor M14 may be either an OS transistor or an LTPS transistor.

By using OS transistors as the transistor M11, the transistor M12, and the transistor M15, a potential retained in the gate of the transistor M13 on the basis of electric charge generated in the light-receiving device PD1 and the light-receiving device PD2 can be prevented from leaking through the transistor M11, the transistor M12, or the transistor M15.

By contrast, an LTPS transistor is preferably used as the transistor M13. The LTPS transistor can have a higher field-effect mobility than the OS transistor, and has excellent drive capability and current capability. Thus, the transistor M13 can operate at higher speed than the transistor M11, the transistor M12, and the transistor M15. By using the LTPS transistor as the transistor M13, an output corresponding to the extremely low potential based on the amount of light received by the light-receiving device PD1 or the light-receiving device PD2 can be quickly supplied to the transistor M14.

In other words, in the pixel circuit 22 illustrated in FIG. 2A, the transistor M11, the transistor M12, and the transistor M15 have low leakage current and the transistor M13 has high drive capability, whereby, when the light-receiving device PD1 and the light-receiving device PD2 receive light, the electric charge transferred through the transistor M11 and the transistor M15 can be retained without leakage and high-speed reading can be performed.

Low off-state current, high-speed operation, and the like, which are required for the transistor M11 to the transistor M13 and the transistor M15, are not necessarily required for the transistor M14, which functions as a switch for supplying the output from the transistor M13 to the wiring WX. For this reason, either low-temperature polysilicon or an oxide semiconductor may be used for the semiconductor layer of the transistor M14.

Although n-channel transistors are illustrated as the transistors in FIG. 2A, p-channel transistors can be used.

As described above, in the case where a high-resolution and clear image is required to be captured for personal authentication or the like, the aperture ratio (the light-receiving area) of the light-receiving device is preferably small. By contrast, in the case of a near touch sensor which only needs to sense an approximate position, for example, the aperture ratio (the light-receiving area) of the light-receiving device is preferably large. Accordingly, the aperture ratio (the light-receiving area) of the light-receiving device PD1 is preferably smaller than the aperture ratio (the light-receiving area) of the light-receiving device PD2. In addition, in the case where a high-resolution image is required to be captured, it is preferable that the image be captured only with the light-receiving device PD1 by turning on the transistor M11 and turning off the transistor M15. By contrast, in the case where sensing in a large area is performed, it is preferable to capture an image with both the light-receiving device PD1 and the light-receiving device PD2 by turning on both the transistor M11 and the transistor M15. In this manner, the amount of light received for image capturing can be increased and an object at a position away from the display apparatus can be easily sensed.

As described above, one pixel includes two kinds of light-receiving devices in the display apparatus of this embodiment, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

<Structure Example of Pixel Circuit 21>

Figure 2B:
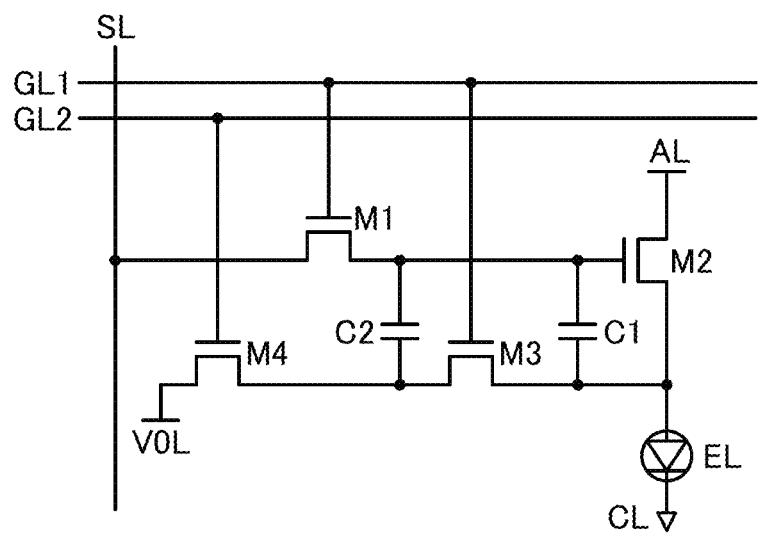

FIG. 2B illustrates an example of a pixel circuit that can be used as the pixel circuit 21R, the pixel circuit 21G, and the pixel circuit 21B. A pixel circuit 21 illustrated in FIG. 2B includes a transistor M1, a transistor M2, a transistor M3, a transistor M4, a capacitor C1, a capacitor C2, and a light-emitting device EL.

A gate of the transistor M1 is electrically connected to the wiring GL1, one of a source and a drain of the transistor M1 is electrically connected to the wiring SL, and the other of the source and the drain of the transistor M1 is electrically connected to one electrode of the capacitor C1, one electrode of the capacitor C2, and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL1, and the other of the source and the drain of the transistor M3 is electrically connected to the other electrode of the capacitor C2. A gate of the transistor M4 is electrically connected to the wiring GL2, one of a source and a drain of the transistor M4 is electrically connected to the other electrode of the capacitor C2, and the other of the source and the drain of the transistor M4 is electrically connected to a wiring VOL. The other electrode of the light-emitting device EL is electrically connected to the wiring CL.

Each of the transistor M1, the transistor M3, and the transistor M4 functions as a switch. The transistor M2 functions as a transistor that controls current flowing through the light-emitting device EL.

Here, it is preferable to use LTPS transistors as all of the transistor M1 to the transistor M4. Alternatively, it is preferable to use OS transistors as the transistor M1, the transistor M3, and the transistor M4 and to use an LTPS transistor as the transistor M2.

A data potential is supplied to the wiring SL. Selection signals are supplied to the wiring GL1 and the wiring GL2. The selection signals each include a potential for turning on a transistor and a potential for turning off a transistor. A constant potential is supplied to the wiring AL. A constant potential is supplied to the wiring CL.

In the case where the cathode of the light-emitting device EL is electrically connected to the wiring CL as illustrated in FIG. 2B, a potential supplied to the wiring AL is preferably higher than a potential supplied to the wiring CL. By contrast, in the case where the anode of the light-emitting device EL is electrically connected to the wiring CL, the potential supplied to the wiring AL is preferably lower than the potential supplied to the wiring CL.

Note that the pixel circuit that can be used as the pixel circuit 21R, the pixel circuit 21G, and the pixel circuit 21B is not limited to the pixel circuit 21 illustrated in FIG. 2B.

<Structure Example of Pixel 30>

Figure 3:
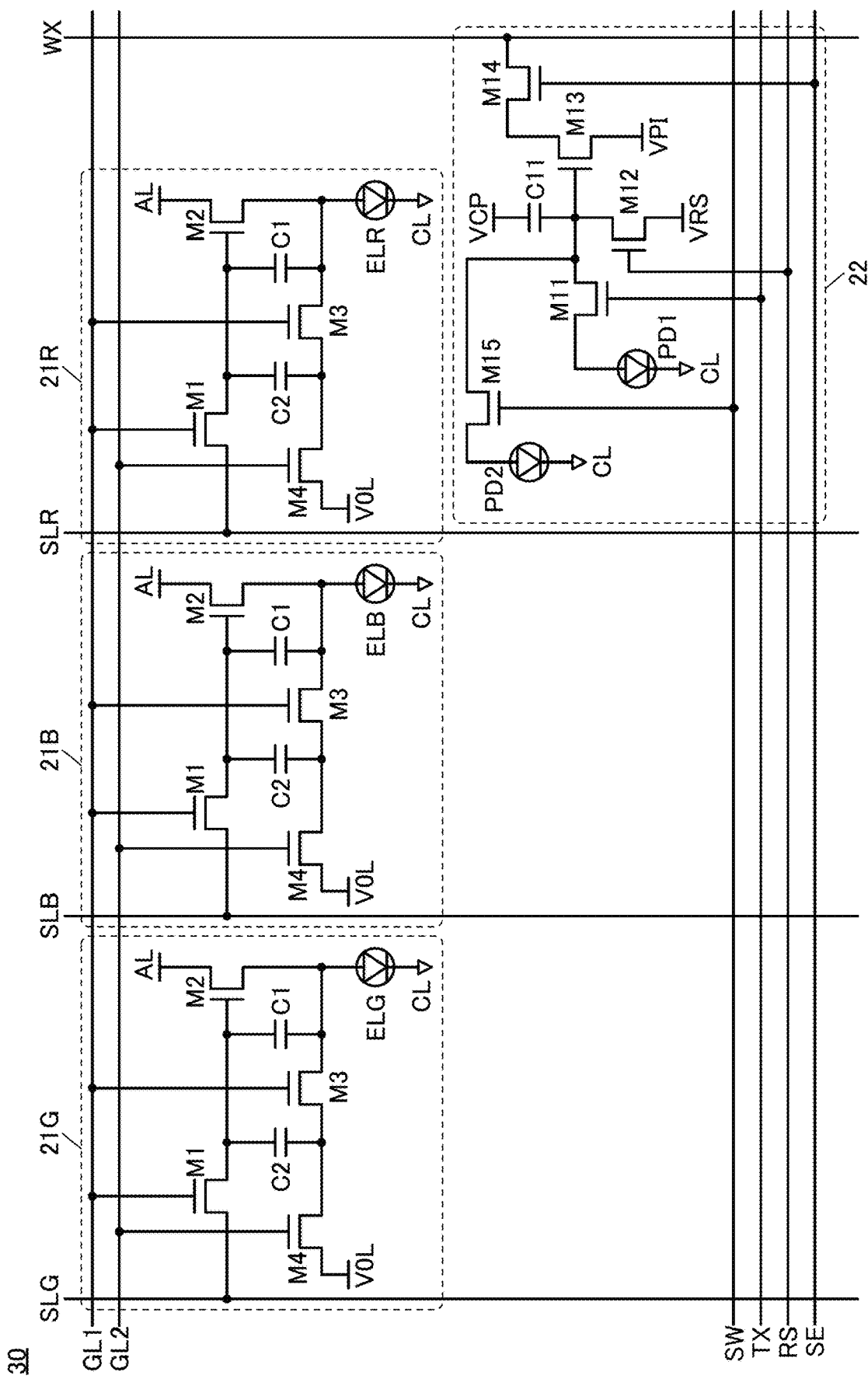
FIG. 3 is a diagram illustrating an example of a pixel circuit.

FIG. 3 illustrates an example of a circuit diagram of the pixel 30 including the pixel circuit 22, the pixel circuit 21R, the pixel circuit 21G, and the pixel circuit 21B.

The pixel circuit 21R includes a light-emitting device ELR that emits red light. The pixel circuit 21G includes a light-emitting device ELG that emits green light. The pixel circuit 21B includes a light-emitting device ELB that emits blue light. The pixel circuit 21R, the pixel circuit 21G, and the pixel circuit 21B have the same structure except for the light-emitting devices.

FIG. 3 illustrates a structure in which one electrode of the light-receiving device PD1, one electrode of the light-receiving device PD2, one electrode of the light-emitting device ELR, one electrode of the light-emitting device ELG, and one electrode of the light-emitting device ELB are each electrically connected to the wiring CL. Such a structure can reduce the number of wirings included in the pixel 30 and accordingly can reduce the size of the pixel 30, so that the display apparatus can have a high resolution. Note that the one electrode of the light-receiving device PD1, the one electrode of the light-receiving device PD2, the one electrode of the light-emitting device ELR, the one electrode of the light-emitting device ELG, and the one electrode of the light-emitting device ELB may be connected to different wirings.

Note that the structures of the pixel circuit 21R, the pixel circuit 21G, and the pixel circuit 21B are not limited to those illustrated in FIG. 3.

<Structure Example of Read Circuit>

Figure 4A:
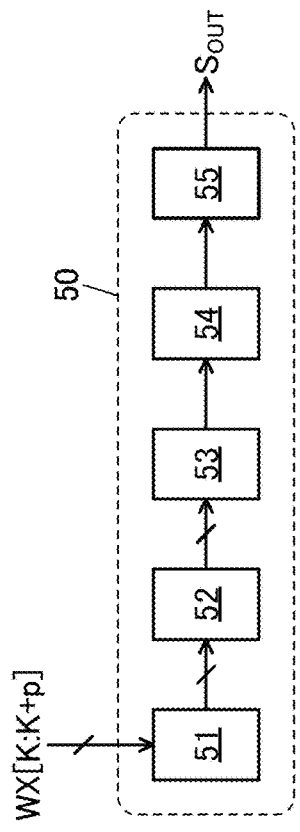
FIG. 4A is a block diagram illustrating an example of a read circuit.

FIG. 4A illustrates an example of a circuit that can be used as a read circuit. A circuit 50 illustrated in FIG. 4A can be used as the circuit portion 15 illustrated in FIG. 1A.

FIG. 4A is a block diagram of the circuit 50. The circuit 50 includes a plurality of circuits 51, a plurality of circuits 52, a circuit 53, a circuit 54, and a circuit 55.

Signals from K-th to K+p-th wirings WX[K:K+p] (K is an integer greater than or equal to 1 and less than or equal to N) are input to the circuit 50. Signals from wirings WX as many as the number obtained by dividing the number N (N is an integer greater than or equal to 2) of pixels arranged in the row direction by a given integer x can be input to one circuit 50. That is, p is an integer satisfying N/x−1, and signals from N/x wirings WX are input to the circuit 50. In this case, the display apparatus can include x circuits 50 as read circuits.

Note that when N is not a multiple of x, the number of wirings WX connected to one circuit 50 can be adjusted as appropriate.

The circuit 51 is a circuit that converts current output to one of the wirings WX into voltage and outputs the voltage. As the circuit 51, a circuit that configures a source follower circuit with the transistor M13 in the above-described pixel circuit 22 can be used.

As the circuit 52, a correlated double sampling (CDS) circuit can be suitably used. The circuit 52 can generate a signal with less noise.

As the circuit 53, a multiplexer circuit can be used. The circuit 53 can convert parallel signals input from the plurality of circuits 52 into a serial signal and output the serial signal to the circuit 54.

As the circuit 54, a source follower circuit can be used. The circuit 54 has a function of amplifying a signal input from the circuit 53 and outputting the amplified signal.

As the circuit 55, an analog-to-digital converter circuit can be used. The circuit 55 has a function of converting an analog signal input from the circuit 54 into a signal $S_{OUT}$ that is a digital signal and outputting the signal $S_{OUT}$.

Figure 4B:
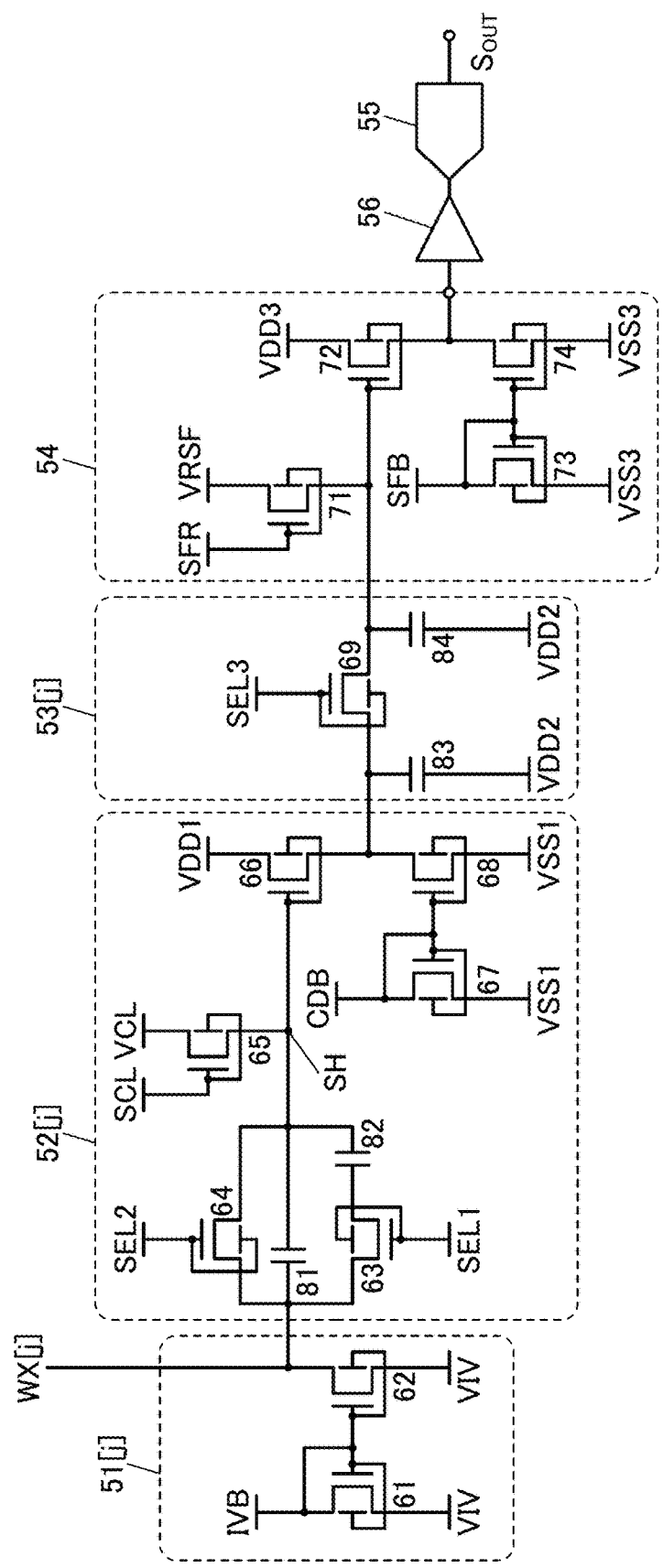
FIG. 4B is a circuit diagram of the read circuit.

FIG. 4B illustrates an example of a more specific circuit diagram of the circuit 50. FIG. 4B illustrates a circuit 51[j] and a circuit 52[j] that are connected to a j-th wiring WX[j], part of the circuit 53, the circuit 54, the circuit 55, and a circuit 56. As for the circuit 53, some components connected to the circuit 52[j] are illustrated as a circuit 53[j]. The circuit 53 includes a plurality of the circuits 53[j].

The circuit 51[j] includes a transistor 61 and a transistor 62. A wiring IVB and a wiring VIV each of which is supplied with a constant potential are connected to the circuit 51[j]. The transistor 62 and the transistor M13 included in the pixel circuit 22 form a source follower circuit. The transistor 61 functions as a constant current source. The transistor 61 and the transistor 62 form a current mirror.

The circuit 52[j] includes a transistor 63 to a transistor 68, a capacitor 81, and a capacitor 82. A wiring SEL1, a wiring SEL2, and a wiring SCL each of which is supplied with a signal for controlling the conducting state of the transistor, and a wiring VCL, a wiring CDB, a wiring VDD1, and a wiring VSS1 each of which is supplied with a constant potential are connected to the circuit 52[j]. For example, high potentials can be supplied to the wiring VCL, the wiring VDD1, and the wiring CDB, and a low potential can be supplied to the wiring VSS1.

The transistor 66 and the transistor 68 form a source follower circuit. The transistor 67 functions as a constant current source and forms a current mirror with the transistor 68. The capacitor 81 is provided between a gate of the transistor 66 and an output wiring of the circuit 51[j]. A signal supplied from the circuit 51[j] to the circuit 52[j] is transmitted to the gate of the transistor 66 through capacitor 81.

The transistor 65 has a function of supplying a constant potential (also referred to as an initial potential) to a node SH to which the gate of the transistor 66 is connected. First, the potential of the wiring WX[j] is obtained in a state where the initial potential is supplied from the wiring VCL to the node SH. After that, the transistor 65 is turned off and the transistor M12 included in the pixel circuit 22 is turned on, and the potential of the wiring WX[j] is obtained. Thus, a potential corresponding to a difference from the initial potential can be read as image capturing data. With such a correlated double sampling operation, a signal with less noise can be output from the circuit 50.

The transistor 63 has a function of adjusting the capacitance of the CDS circuit. By turning on the transistor 63, the capacitor 81 and the capacitor 82 are connected in parallel. Thus, the sensitivity of the CDS circuit can be increased. On the other hand, by turning off the transistor 63, the speed of the reading operation can be increased. For example, when an image of an object with a low contrast or luminance is captured, the sensitivity can be increased by turning on the transistor 63 to increase the capacitance of the CDS circuit. Meanwhile, when high-speed reading is required, the capacitance of the CDS circuit can be decreased by turning off the transistor 63. The on/off state of the transistor 63 can be switched by a signal supplied to the wiring SEL1.

The transistor 64 has a function of establishing electrical continuity between the wiring WX[j] and the node SH. By turning on the transistor 64, a reading operation without using correlated double sampling can be performed. The on/off state of the transistor 64 can be switched by a signal supplied to the wiring SEL2.

The circuit 53 [j] includes a transistor 69, a capacitor 83, and a capacitor 84. A wiring SEL3 supplied with a signal for controlling the conducting state of the transistor and a wiring VDD2 supplied with a constant potential are connected to the circuit 53 [j]. The capacitor 83 and the capacitor 84 have a function of retaining the potential of the wiring. One or both of the capacitor 83 and the capacitor 84 may be omitted when not needed.

To select the circuit 53[j] from the circuit 53, the transistor 69 is turned on. Thus, a signal output from the circuit 52[j] can be output to the circuit 54 through the transistor 69. By sequentially selecting a plurality of the transistors 69 included in the circuit 53, parallel signals input from the plurality of circuits 52 can be converted into a serial signal to be output to the circuit 54.

The circuit 54 includes a transistor 71 to a transistor 74. A wiring SFR supplied with a signal for controlling the conducting state of the transistor and a wiring VRSF, a wiring SFB, a wiring VDD3, and a wiring VSS3 each of which is supplied with a constant potential are connected to the circuit 54.

The transistor 72 and the transistor 74 form a source follower circuit. The transistor 73 functions as a constant current source and forms a current mirror with the transistor 74.

The transistor 71 has a function of resetting the potential of a node to which a gate of the transistor 72 is connected, with the use of a potential supplied to the wiring VRSF.

As illustrated in FIG. 4B, the circuit 56 functioning as an amplifier circuit may be provided between the circuit 54 and the circuit 55. The circuit 56 has a function of amplifying a signal input from the circuit 54 and outputting the amplified signal to the circuit 55.

An example in which n-channel transistors are used as all the transistors included in the circuit 51, the circuit 52, the circuit 53, and the circuit 54 is illustrated here. In this case, each of the transistors is preferably a transistor using an oxide semiconductor in a semiconductor layer where a channel is formed. Transistors with an extremely low off-state current are preferably used particularly as the transistor 63, the transistor 64, the transistor 65, the transistor 69, the transistor 71, and the like, which function as switches. Note that without limitation to the above, some or all of the transistors may be transistors using silicon. Alternatively, some or all of the transistors may be p-channel transistors.

FIG. 4B illustrates an example in which all the transistors included in the circuit 51, the circuit 52, the circuit 53, and the circuit 54 are transistors each having a pair of gates electrically connected to each other. Note that without limitation thereto, some or all of the transistors may be transistors each having a single gate. Alternatively, some or all of the transistors may be transistors in each of which one of the gates is electrically connected to one of a source and a drain. Alternatively, some or all of the transistors may be transistors in each of which one of the gates is supplied with a constant potential or a signal for controlling the threshold voltage.

The circuit 51, the circuit 52, the circuit 53, and the circuit 54 are preferably formed over a substrate where pixels are provided, through the same process as the pixels. This allows the number of components of the display apparatus to be reduced, resulting in lower costs. An IC chip may be used as one or both of the circuit 56 and the circuit 55, and one or both of the circuit 56 and the circuit 55 may be formed over the substrate where the pixels are provided.

The above is the description of the structure example of the read circuit.

Note that the structure of the circuit that can be used as the circuit portion 15 is not limited to that illustrated in FIG. 4A and FIG. 4B.

Note that the transistors included in the display apparatus of one embodiment of the present invention may each have a back gate. Supplying the same potential to the back gate and a front gate can increase the on-state current of the transistor. In addition, supplying a constant potential to the back gate can adjust the threshold voltage of the transistor.

<Structure Example 1 of Display Portion>

Figure 5:
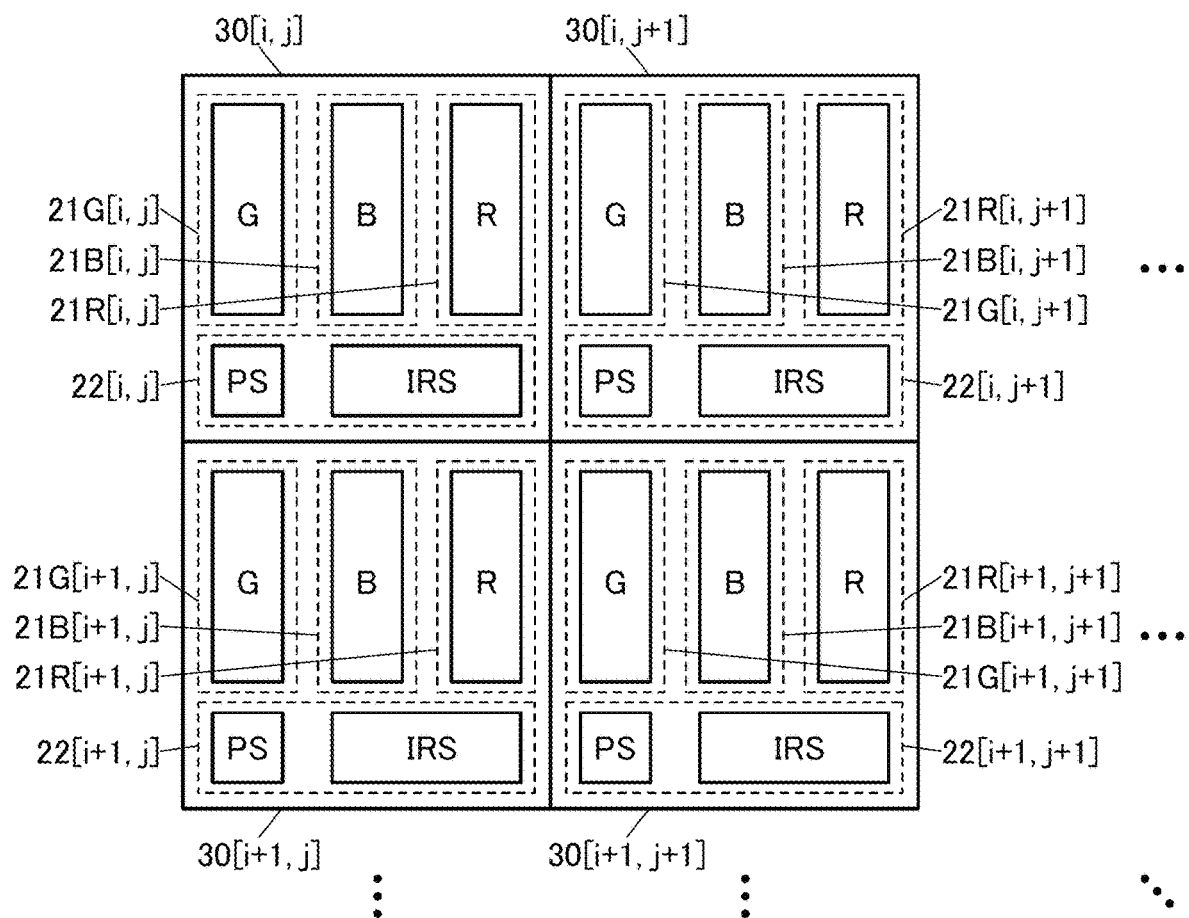
FIG. 5 is a diagram illustrating an example of a display portion of a display apparatus.
Figure 6:
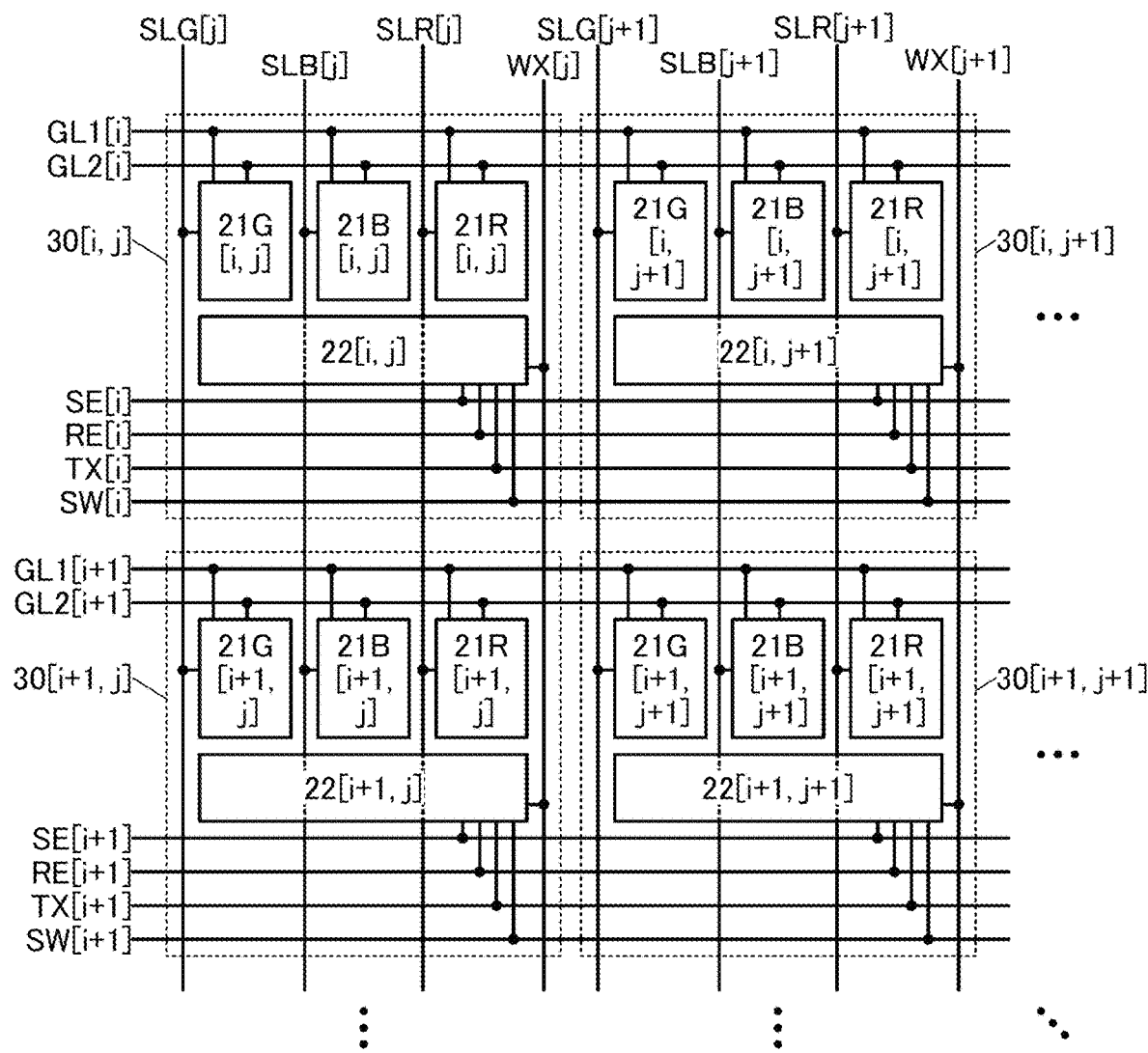
FIG. 6 is a diagram illustrating an example of a display portion of a display apparatus.

FIG. 5 and FIG. 6 illustrate a structure example of the display portion 11. The display portion 11 has a structure in which the pixels 30 are arranged in a matrix of M rows and N columns (M and N are each independently an integer greater than or equal to 2). FIG. 5 and FIG. 6 illustrate four pixels 30 in the i-th row and the j-th column (i and j are each independently an integer greater than or equal to 1) to the i+1-th row and the j+1-th column.

In this specification and the like, when a plurality of components are denoted with the same reference numerals, and in particular, need to be distinguished from each other, an identification sign such as "[1]", "[m]", "[1,1]", or "[m,n]" is sometimes added to the reference numerals. For example, the pixel 30 in the i-th row and the j-th column is denoted as a pixel 30[i,j].

FIG. 5 illustrates arrangement of the subpixel R, the subpixel G, the subpixel B, the subpixel PS, and the subpixel IRS. FIG. 6 illustrates a connection relationship between the pixel circuit 21R, the pixel circuit 21G, the pixel circuit 21B, the pixel circuit 22, and the wirings.

A wiring SE[i], a wiring RE[i], a wiring TX[i], and a wiring SW[i] are electrically connected to a pixel circuit 22[i,j] and a pixel circuit 22[i,j+1] arranged in the i-th row direction. A wiring SE[i+1], a wiring RE[i+1], a wiring TX[i+1], and a wiring SW[i+1] are electrically connected to a pixel circuit 22[i+1, j] and a pixel circuit 22[i+1,j+1] arranged in the i+1-th row direction.

The wiring WX[j] is electrically connected to the pixel circuit 22[i,j] and the pixel circuit 22[i+1,j] arranged in the j-th column direction. A wiring WX[j+1] is electrically connected to the pixel circuit 22[i,j+1] and the pixel circuit 22[i+1,j+1] arranged in the j+1-th column direction.

A wiring GL1[i] and a wiring GL2[i] are electrically connected to a pixel circuit 21R[i,j], a pixel circuit 21G[i,j], a pixel circuit 21B[i,j], a pixel circuit 21R[i,j+1], a pixel circuit 21G[i,j+1], and a pixel circuit 21B[i,j+1] arranged in the i-th row direction. A wiring GL1[i+1] and a wiring GL2[i+1] are electrically connected to a pixel circuit 21R

[i+1,j], a pixel circuit 21G[i+1,j], a pixel circuit 21B[i+1,j], a pixel circuit 21R[i+1,j+1], a pixel circuit 21G[i+1,j+1], and a pixel circuit 21B[i+1,j+1] arranged in the i+1-th row direction.

A wiring SLR[j] is electrically connected to the pixel circuit 21R[i,j] and the pixel circuit 21R[i+1,j] arranged in the j-th column direction. A wiring SLG[j] is electrically connected to the pixel circuit 21G[i,j] and the pixel circuit 21G[i+1,j] arranged in the j-th column direction. A wiring SLB [j] is electrically connected to the pixel circuit 21B[i,j] and the pixel circuit 21B[i+1,f] arranged in the j-th column direction. A wiring SLR[j+1] is electrically connected to the pixel circuit 21R[i,j+1] and the pixel circuit 21R[i+1,j+1] arranged in the j+1-th column direction. A wiring SLG[j+1] is electrically connected to the pixel circuit 21G[i,j+1] and the pixel circuit 21G[i+1,j+1] arranged in the j+1-th column direction. A wiring SLB[j+1] is electrically connected to the pixel circuit 21B [i,j+1] and the pixel circuit 21B[i+1,j+1] arranged in the j+1-th column direction.

<Driving Method Example>

Figure 7:
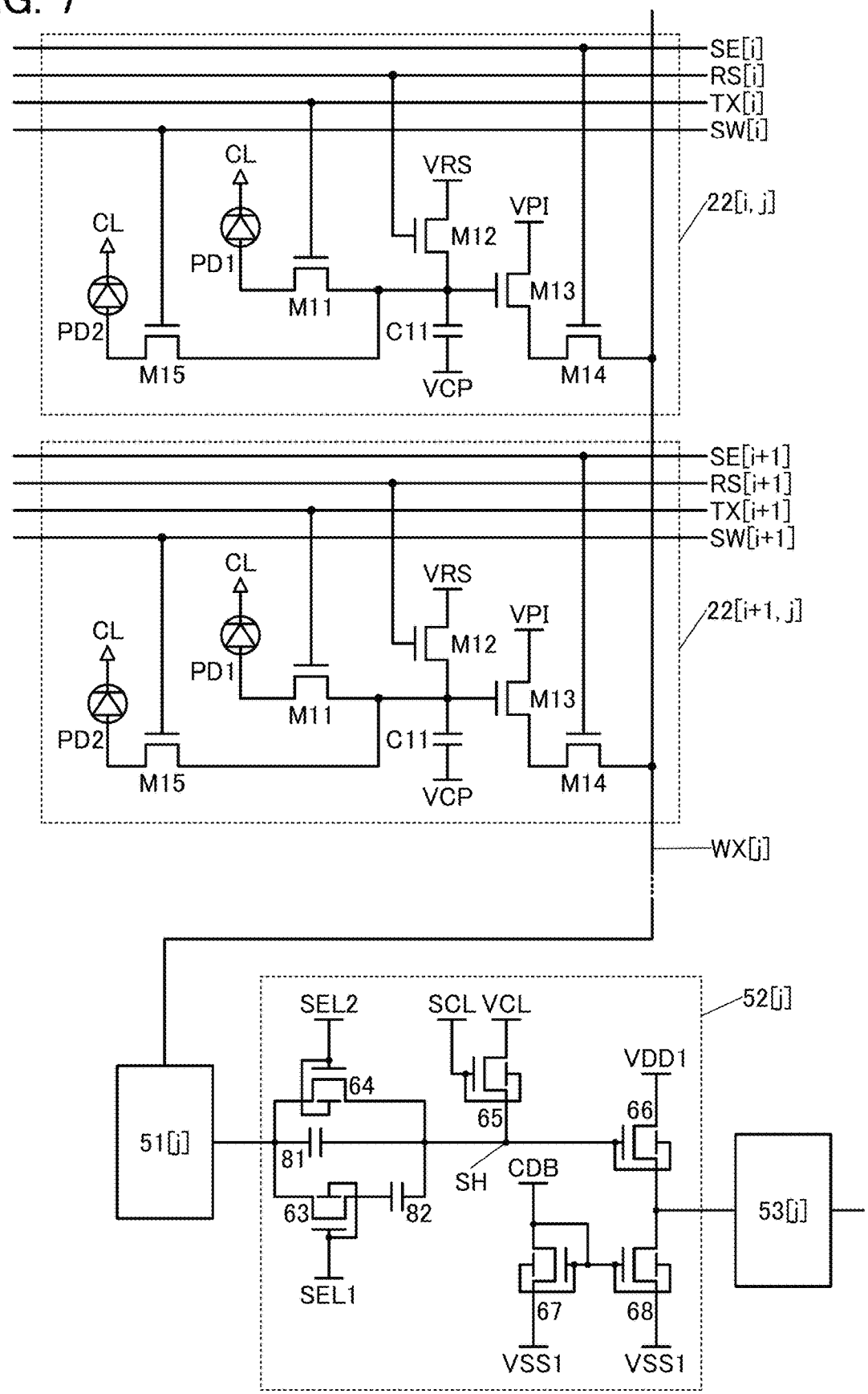
FIG. 7 is a diagram illustrating an example of a display apparatus.

An example of a method for driving the pixel circuit 22 is described using a structure illustrated in FIG. 7. An example in which the circuit 50 has the structure illustrated in FIG. 4B is given here. FIG. 7 illustrates the pixel circuit 22[i,j], the pixel circuit 22[i+1,j], and the circuit 52[j] functioning as the CDS circuit.

Figure 8A:
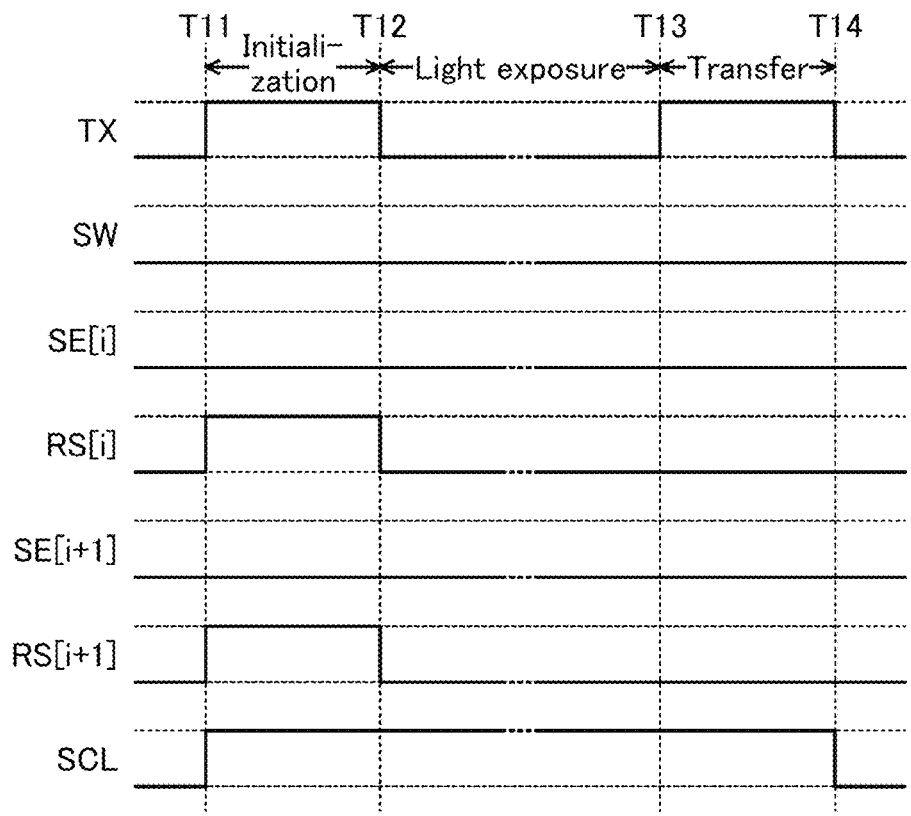
FIG. 8A and FIG. 8B are diagrams showing an example of an operation method of a display apparatus.
Figure 8B:
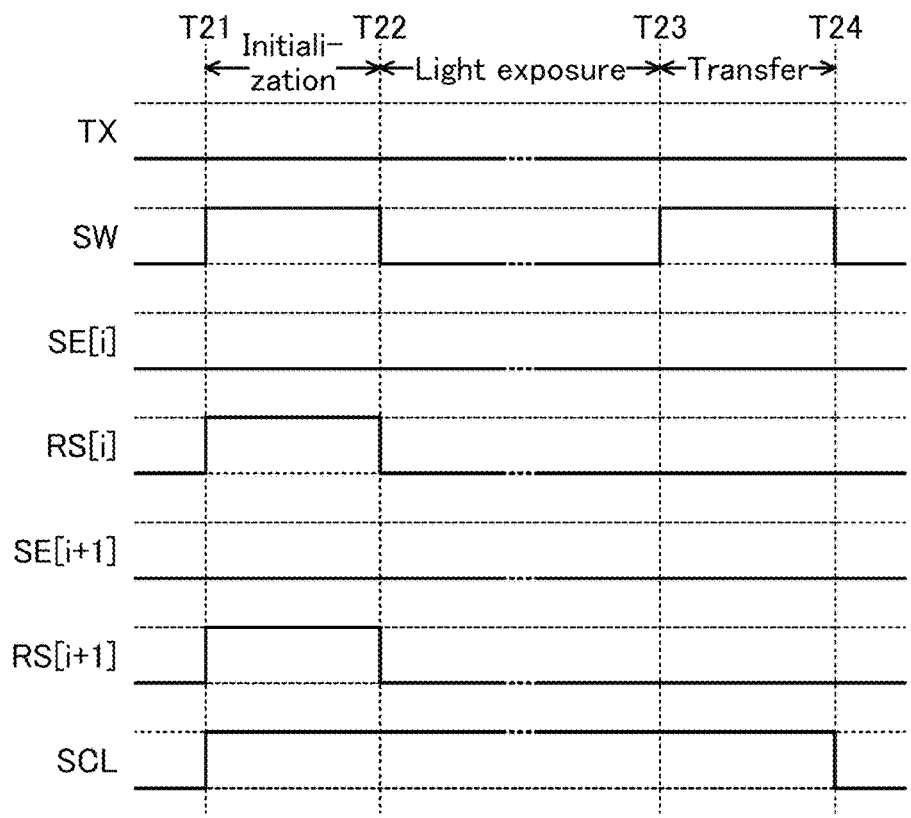
Figure 9:
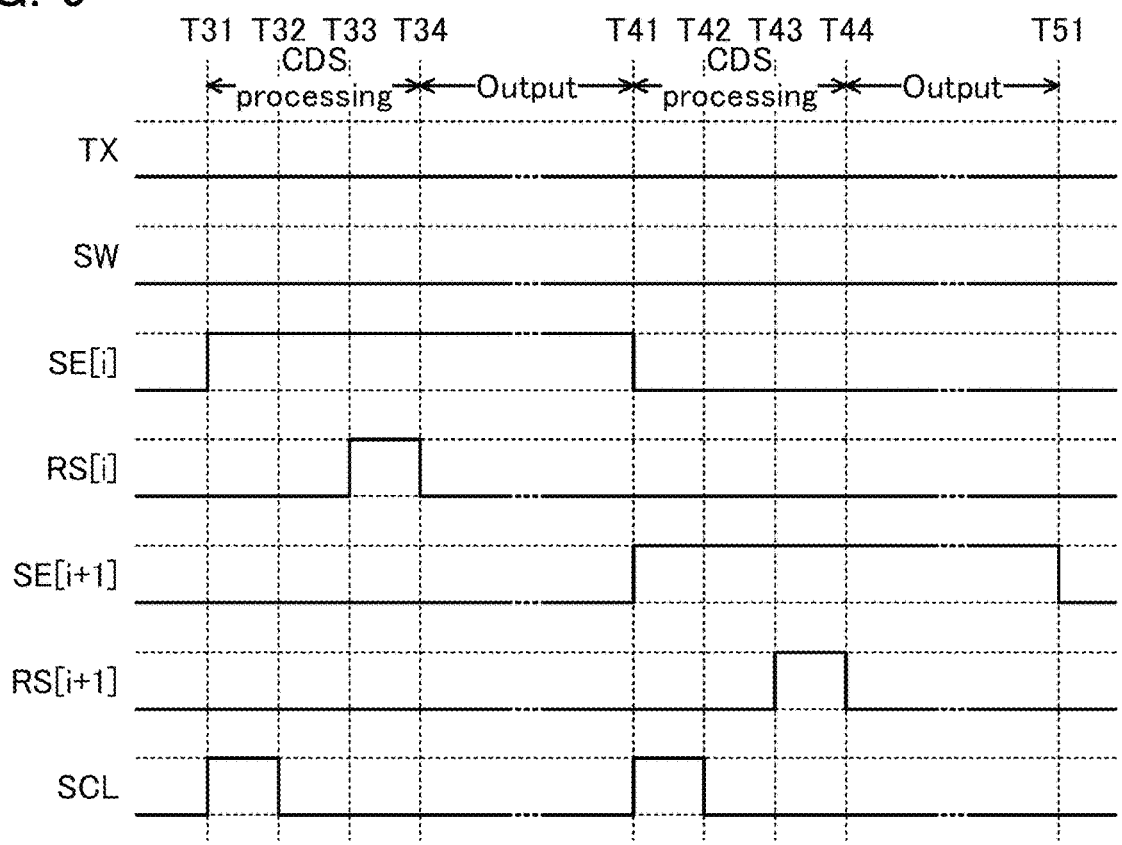
FIG. 9 is a diagram showing an example of an operation method of a display apparatus.

FIG. 8A, FIG. 8B, and FIG. 9 show timing charts for the operation of the pixel circuit 22. FIG. 8A, FIG. 8B, and FIG. 9 show signals input to the wiring TX, the wiring SW, the wiring SE[i] in the i-th row, the wiring RS[i] in the i-th row, the wiring SE[i+1] in the i+l-th row, the wiring RS [i+1] in the i+l-th row, and the wiring SCL.

First, an example of the operation relating to light exposure of the subpixel PS having a function of receiving visible light will be described with reference to FIG. 8A. Here, light exposure refers to obtaining image capturing data.

<Before Time T11>

Before Time T11, low-level potentials are supplied to the wiring TX, the wiring SW, the wiring SE, and the wiring RS.

<Period T11-T12>

A period from Time T11 to Time T12 corresponds to an initialization period (also referred to as a reset period). At Time T11, a potential for turning on a transistor (here, a high-level potential) is supplied to each of the wiring TX and the wiring RS. A potential for turning off a transistor (here, a low-level potential) is supplied to each of the wiring SW and the wiring SE. Thus, the transistor M11 and the transistor M12 are turned on.

When the transistor M11 and the transistor M12 are turned on, electric charge accumulated in the capacitor C11 is initialized (reset). In addition, a potential lower than a potential of the cathode electrode of the light-receiving device PD1 is supplied to the anode electrode thereof from the wiring VRS through the transistor M11 and the transistor M12. That is, reverse bias voltage is applied to the light-receiving device PD1.

<Period T12-T13>

A period from Time T12 to Time T13 corresponds to a light exposure period (a period during which image capturing data is obtained). At Time T12, low-level potentials are supplied to the wiring TX and the wiring RS. Thus, the transistor M11 and the transistor M12 are turned off.

Since the transistor M11 is turned off, the reverse bias voltage is retained in the light-receiving device PD1. Here, photoelectric conversion is caused by light (here, visible light) entering the light-receiving device PD1, and electric charge is accumulated in the anode electrode of the light-receiving device PD1.

The light exposure period is set in accordance with the sensitivity of the light-receiving device PD1, the amount of incident light, or the like and is preferably set to be much longer than at least the initialization period.

<Period T13-T14>

A period from Time T13 to Time T14 corresponds to a transfer period. At Time T13, a high-level potential is supplied to the wiring TX. Thus, the transistor M11 is turned on, and the electric charge accumulated in the light-receiving device PD1 is transferred to the one electrode of the capacitor C11 through the transistor M11. Accordingly, the potential of a node to which the one electrode of the capacitor C11 is connected increases in accordance with the amount of electric charge accumulated in the light-receiving device PD1. Consequently, a potential corresponding to the amount of light to which the light-receiving device PD1 is exposed is supplied to the gate of the transistor M13.

<After Time T14>

At Time T14, a low-level potential is supplied to the wiring TX. Thus, the transistor M11 is turned off, and a node to which the gate of the transistor M13 is connected is brought into a floating state. Since the light-receiving device PD1 is continuously exposed to light, a change in the potential of the node to which the gate of the transistor M13 is connected can be prevented by turning off the transistor M11 after the transfer operation in Period T13-T14 is completed.

The above is the description of the example of the operation relating to the light exposure of the subpixel PS having a function of receiving visible light.

Next, an example of the operation relating to light exposure of the subpixel IRS having a function of receiving infrared light will be described with reference to FIG. 8B.

<Before Time T21>

Before Time T21, low-level potentials are supplied to the wiring TX, the wiring SW, the wiring SE, and the wiring RS.

<Period T21-T22>

A period from Time T21 to Time T22 corresponds to an initialization period (also referred to as a reset period). At Time T21, high-level potentials are supplied to the wiring SW and the wiring RS. Low-level potentials are supplied to the wiring TX and the wiring SE. Thus, the transistor M15 and the transistor M12 are turned on.

When the transistor M15 and the transistor M12 are turned on, electric charge accumulated in the capacitor C11 is initialized (reset). In addition, a potential lower than a potential of the cathode electrode of the light-receiving device PD2 is supplied to the anode electrode thereof from the wiring VRS through the transistor M15 and the transistor M12. That is, reverse bias voltage is applied to the light-receiving device PD2.

<Period T22-T23>

A period from Time T22 to Time T23 corresponds to a light exposure period. At Time T22, low-level potentials are supplied to the wiring SW and the wiring RS. Thus, the transistor M15 and the transistor M12 are turned off.

Since the transistor M15 is turned off, the reverse bias voltage is retained in the light-receiving device PD2. Here, photoelectric conversion is caused by light (here, infrared light) entering the light-receiving device PD2, and electric charge is accumulated in the anode electrode of the light-receiving device PD2.

The light exposure period is set in accordance with the sensitivity of the light-receiving device PD2, the amount of incident light, or the like and is preferably set to be much longer than at least the initialization period.

<Period T23-T24>

A period from Time T23 to Time T24 corresponds to a transfer period. At Time T23, a high-level potential is supplied to the wiring SW. Thus, the transistor M15 is turned on, and the electric charge accumulated in the light-receiving device PD2 is transferred to the one electrode of the capacitor C11 through the transistor M15. Accordingly, the potential of the node to which the one electrode of the capacitor C11 is connected increases in accordance with the amount of electric charge accumulated in the light-receiving device PD2. Consequently, a potential corresponding to the amount of light to which the light-receiving device PD2 is exposed is supplied to the gate of the transistor M13.

<After Time T24>

At Time T24, a low-level potential is supplied to the wiring SW. Thus, the transistor M15 is turned off, and the node to which the gate of the transistor M13 is connected is brought into a floating state. Since the light-receiving device PD2 is continuously exposed to light, a change in the potential of the node to which the gate of the transistor M13 is connected can be prevented by turning off the transistor M15 after the transfer operation in Period T23-T24 is completed.

The above is the description of the example of the operation relating to the light exposure of the subpixel IRS having a function of receiving infrared light.

Next, an example of the operation relating to reading of the subpixel PS and the subpixel IRS will be described with reference to FIG. 9. Period T31-T41 shows reading of the pixel circuits 22 in the i-th row, and Period T41-T51 shows reading of the pixel circuits 22 in the i+1-th row.

<Before Time T31>

Before Time T31, low-level potentials are supplied to the wiring TX, the wiring SW, the wiring SE, the wiring RS, and the wiring SCL.

<Period T31-T34>

A period from Time T31 to Time T34 corresponds to a correlated double sampling (CDS) processing period.

At Time T31, high-level potentials are supplied to the wiring SE[i] and the wiring SCL. Low-level potentials are supplied to the wiring TX and the wiring RS[i]. Thus, the transistor M14 in the pixel circuit 22[i,j] and the transistor 65 in the circuit 52[j] are turned on.

When the transistor 65 is turned on, the potential of the node SH electrically connected to the gate of the transistor 66 becomes a potential (an initial potential) supplied to the wiring VCL. When the transistor M14 in the pixel circuit 22[i,j] is turned on, image capturing data is output from the pixel circuit 22[i,j] and a potential corresponding to the image capturing data is supplied to one electrode of the capacitor 81.

At Time T32, a low-level potential is supplied to the wiring SCL. Accordingly, the transistor 65 is turned off.

When the transistor 65 is turned off, the potential of the one electrode of the capacitor 81 is retained at the potential corresponding to the image capturing data output from the pixel circuit 22[i,j]. At this time, the potential of the node SH becomes lower than the potential (the initial potential) supplied to the wiring VCL due to feedthrough.

At Time T33, a high-level potential is supplied to the wiring RS [i]. Accordingly, the transistor M12 in the pixel circuit 22[i,j] is turned on.

When the transistor M12 is turned on, the potential (the reset potential) supplied to the wiring VRS is supplied to the circuit 52[j] through the wiring WX[j].

Thus, a potential corresponding to a difference from the initial potential can be read as the image capturing data. With such a correlated double sampling operation, a signal with less noise can be output from the circuit 52[j].

<Period T34-T41>

A period from Time T34 to Time T41 corresponds to an output period.

At Time T34, a low-level potential is supplied to the wiring RS[i]. Accordingly, the transistor M12 in the pixel circuit 22[i,j] is turned off. The potential corresponding to the image capturing data is output from the circuit 52[j] to the circuit 53[j].

The above is the operation relating to reading of the pixel circuits 22 in the i-th row.

Then, reading of the pixel circuits 22 in the i+1-th row is performed. An operation similar to that in Period T31-T41 described above is performed in the pixel circuits 22 in the i+1-th row.

<Period T41-T44>

A period from Time T41 to Time T44 corresponds to the correlated double sampling (CDS) processing period.

At Time T41, high-level potentials are supplied to the wiring SE[i+1] and the wiring SCL. Low-level potentials are supplied to the wiring TX and the wiring RS[i+1]. Thus, the transistor M14 in the pixel circuit 22[i+1,j] and the transistor 65 in the circuit 52[j] are turned on.

When the transistor 65 is turned on, the potential of the node SH electrically connected to the gate of the transistor 66 becomes the potential (the initial potential) supplied to the wiring VCL. When the transistor M14 in the pixel circuit 22[i+1,j] is turned on, image capturing data is output from the pixel circuit 22[i+1,j] and a potential corresponding to the image capturing data is supplied to the one electrode of the capacitor 81.

At Time T42, a low-level potential is supplied to the wiring SCL. Accordingly, the transistor 65 is turned off.

When the transistor 65 is turned off, the potential of the one electrode of the capacitor 81 is retained at the potential corresponding to the image capturing data output from the pixel circuit 22[i+1,j]. At this time, the potential of the node SH becomes lower than the potential (the initial potential) supplied to the wiring VCL due to feedthrough.

At Time T43, a high-level potential is supplied to the wiring RS[i+1]. Accordingly, the transistor M12 in the pixel circuit 22[i+1,j] is turned on.

When the transistor M12 is turned on, the potential (the reset potential) supplied to the wiring VRS is supplied to the circuit 52[j] through the wiring WX[j].

Thus, a potential corresponding to a difference from the initial potential can be read as the image capturing data. With such a correlated double sampling operation, a signal with less noise can be output from the circuit 52[j].

<Period T44-T51>

A period from Time T44 to Time T51 corresponds to the output period.

At Time T44, a low-level potential is supplied to the wiring RS [i+1]. Accordingly, the transistor M12 in the pixel circuit 22[i+1,j] is turned off. The potential corresponding to the image capturing data is output from the circuit 52[j] to the circuit 53[j].

<After Time T51>

At Time T51, a low-level potential is supplied to the wiring SE[i+1]. Thus, the transistor M14 is turned off. Accordingly, data reading in the pixel circuits 22 in the i+1-th row is completed. After Time T51, data reading operations are sequentially performed in the subsequent rows.

Reading operations are performed sequentially from the first row to the M-th row. To the wiring WX, M data potentials are sequentially output.

When the driving method exemplified in FIG. 8A, FIG. 8B, and FIG. 9 is used, the light exposure period and the reading period can be set separately; thus, light exposure can be concurrently performed on all the pixel circuits 22 provided in the display portion 11, and then data can be sequentially read. Accordingly, what is called global shutter driving can be achieved. In the case of performing global shutter driving, a transistor using an oxide semiconductor, which has an extremely low leakage current in an off state, is preferably used as a transistor functioning as a switch in the pixel circuit 22 (in particular, each of the transistor M11, the transistor M12, and the transistor M15).

In the example shown above, data reading is performed on all of the M×N pixel circuits 22; however, a high definition is not required in some cases, for example, when a touch panel operation is needed, i.e., the positional information of an object is to be detected. In that case, the rows, the columns, or the rows and the columns from which data is to be read are thinned out, so that a smaller amount of data can be read. This can reduce the time taken for reading data, achieving a high frame frequency. For example, the reading period can be reduced by half when data is read only from odd-numbered rows or even-numbered rows. The reading method is preferably switched between high-resolution image capturing (e.g., image scanning) and touch sensing.

The above is the description of the example of the driving method of the pixel circuit 22.

<Structure Example 2 of Display Portion>

Figure 10:
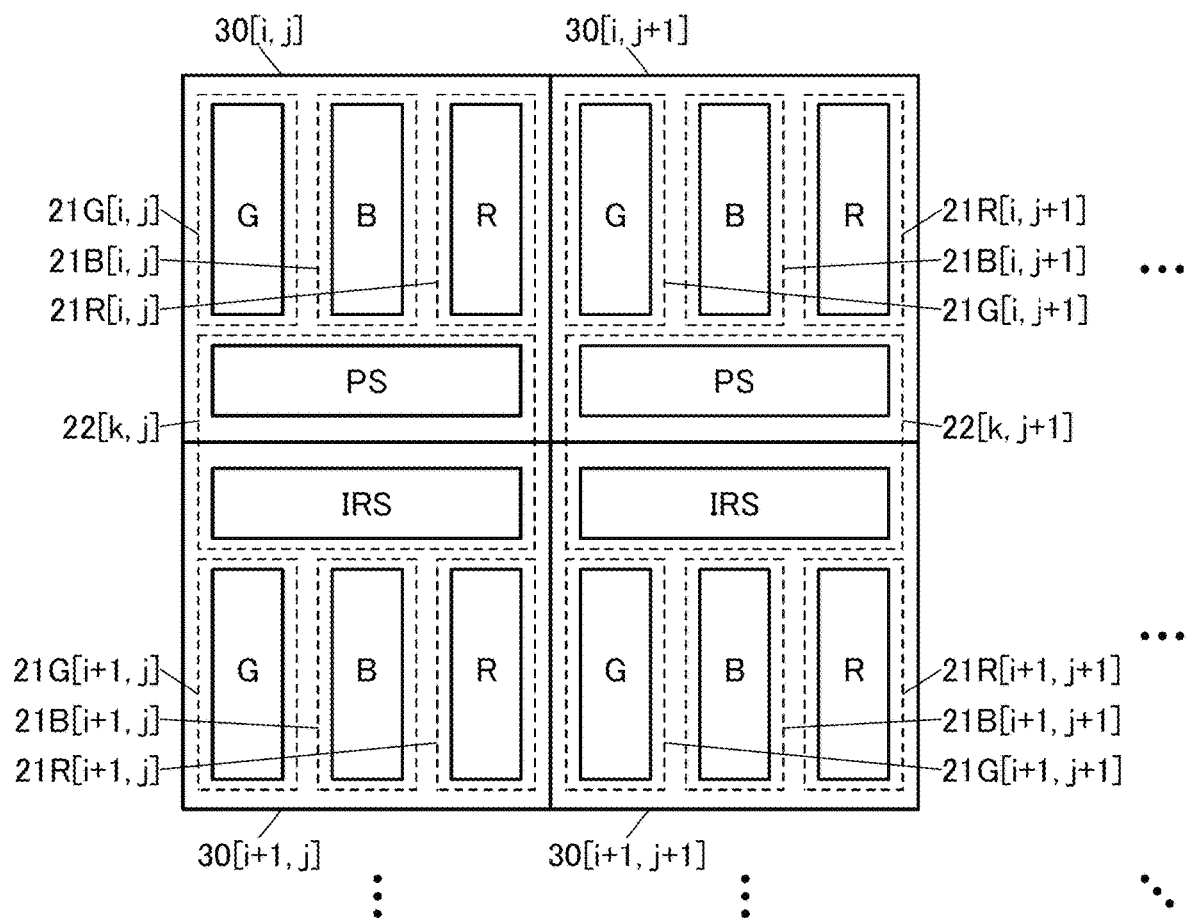
FIG. 10 is a diagram illustrating an example of a display portion of a display apparatus.
Figure 11:
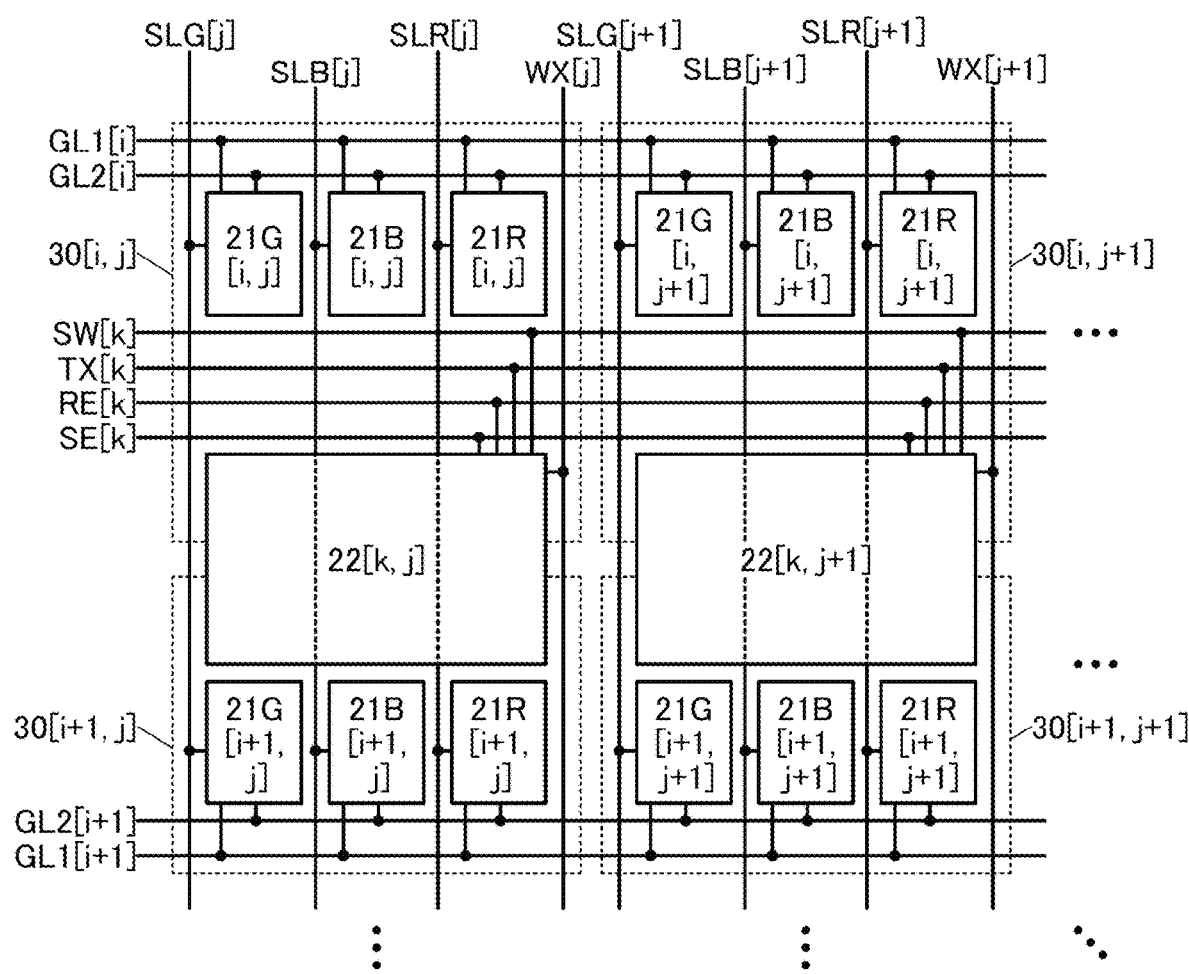
FIG. 11 is a diagram illustrating an example of a display portion of a display apparatus.

FIG. 10 and FIG. 11 illustrate an example of the display portion 11 different from that illustrated in FIG. 5 and FIG. 6.

A display portion 11A illustrated in FIG. 10 and FIG. 11 is different from the display portion 11 illustrated in FIG. 5 and FIG. 6 mainly in that the pixel circuit 22 is provided in every two rows of the pixel 30. In the display portion 11A, one pixel circuit 22 can be regarded as being shared by two pixels 30 adjacent in the column direction. Specifically, one pixel circuit 22[$k,j$] is provided for the pixel 30[$i,j$] and the pixel 30[$i+1,j$], and one pixel circuit 22[$k,j+1$] is provided for the pixel 30[$i,j+1$] and the pixel 30[$i+1,j+1$]. Here, k is an integer greater than or equal to 1 and less than or equal to M/2. In the display portion 11A, the two pixels 30 adjacent in the column direction include one subpixel PS and one subpixel IRS.

The wiring SE, the wiring RE, the wiring TX, and the wiring SW are provided in every two rows of the pixel 30. FIG. 11 illustrates an example in which a wiring SE[k], a wiring RE[k], a wiring TX[k], and a wiring SW[k] are provided for the pixels 30 in the i-th row and the pixels 30 in the i+1-th row. The wiring SE[k], the wiring RE[k], the wiring TX[k], and the wiring SW[k] are electrically connected to the pixel circuit 22[$k,j$] and the pixel circuit 22[$k,j+1$].

FIG. 10 illustrates an example in which the subpixels PS are provided in the pixels 30 in the i-th row and the subpixels IRS are provided in the pixels 30 in the i+1-th row. Note that arrangement of the subpixels PS and the subpixels IRS is not limited to that in the structure illustrated in FIG. 10.

Figure 12A:
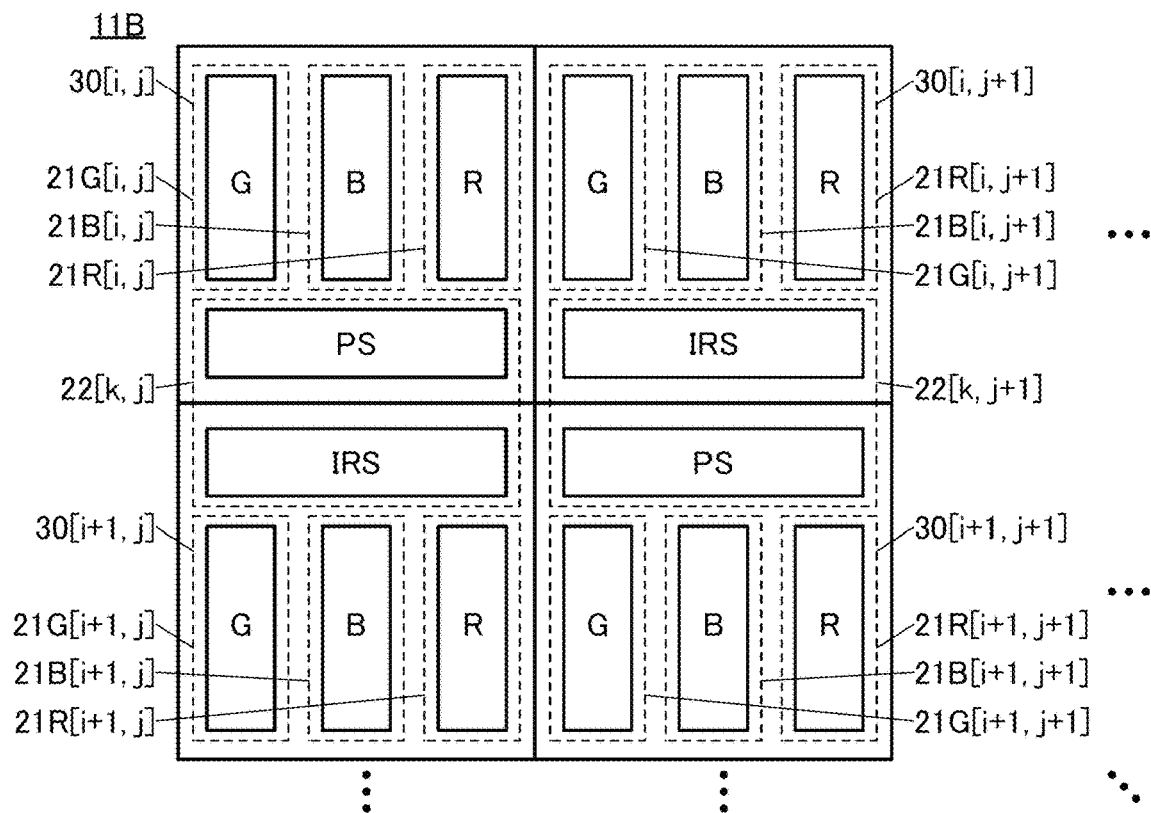
FIG. 12A and FIG. 12B are diagrams each illustrating an example of a display portion of a display apparatus.

As in a display portion 11B illustrated in FIG. 12A, the subpixels PS and the subpixels IRS may be alternately arranged.

Figure 12B:
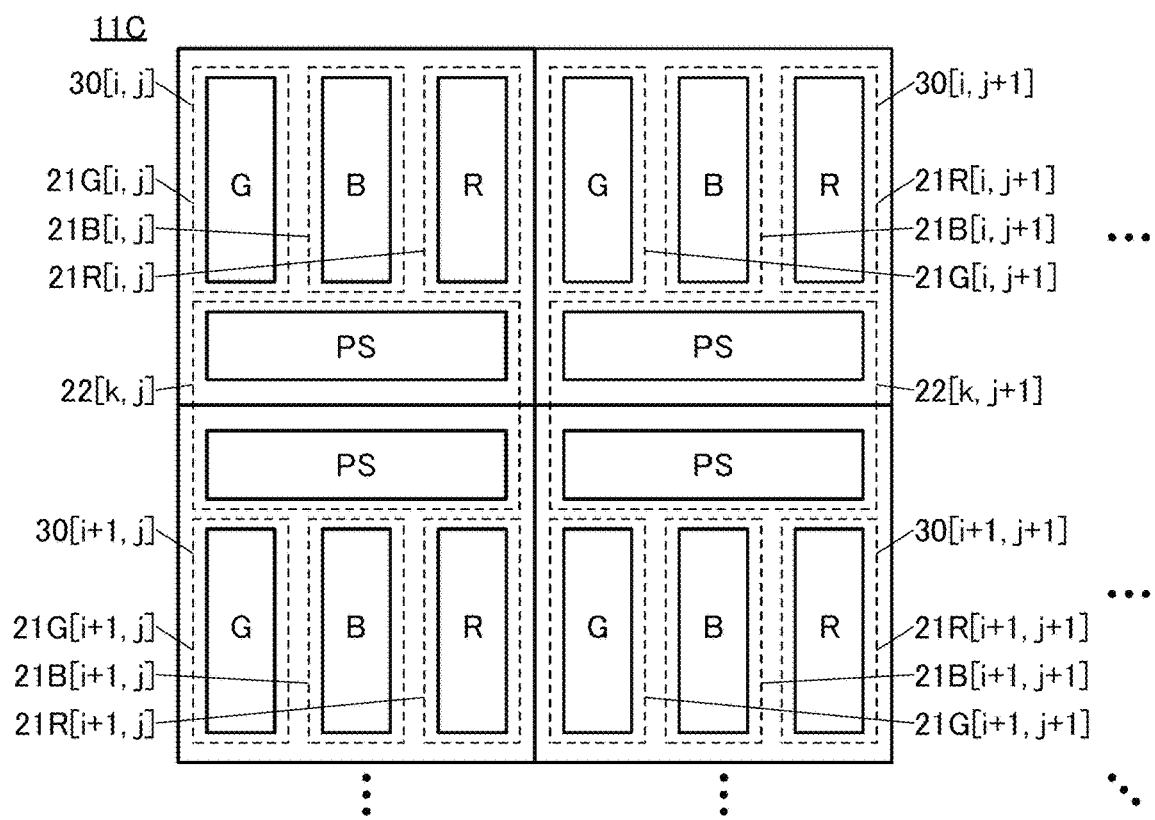

As in a display portion 11C illustrated in FIG. 12B, the subpixels PS may be provided instead of the subpixels IRS. That is, one pixel circuit 22 can include two light-receiving devices having a function of receiving visible light. In that case, one pixel circuit 22 has a function of controlling light reception of the two subpixels PS.

Figure 13A:
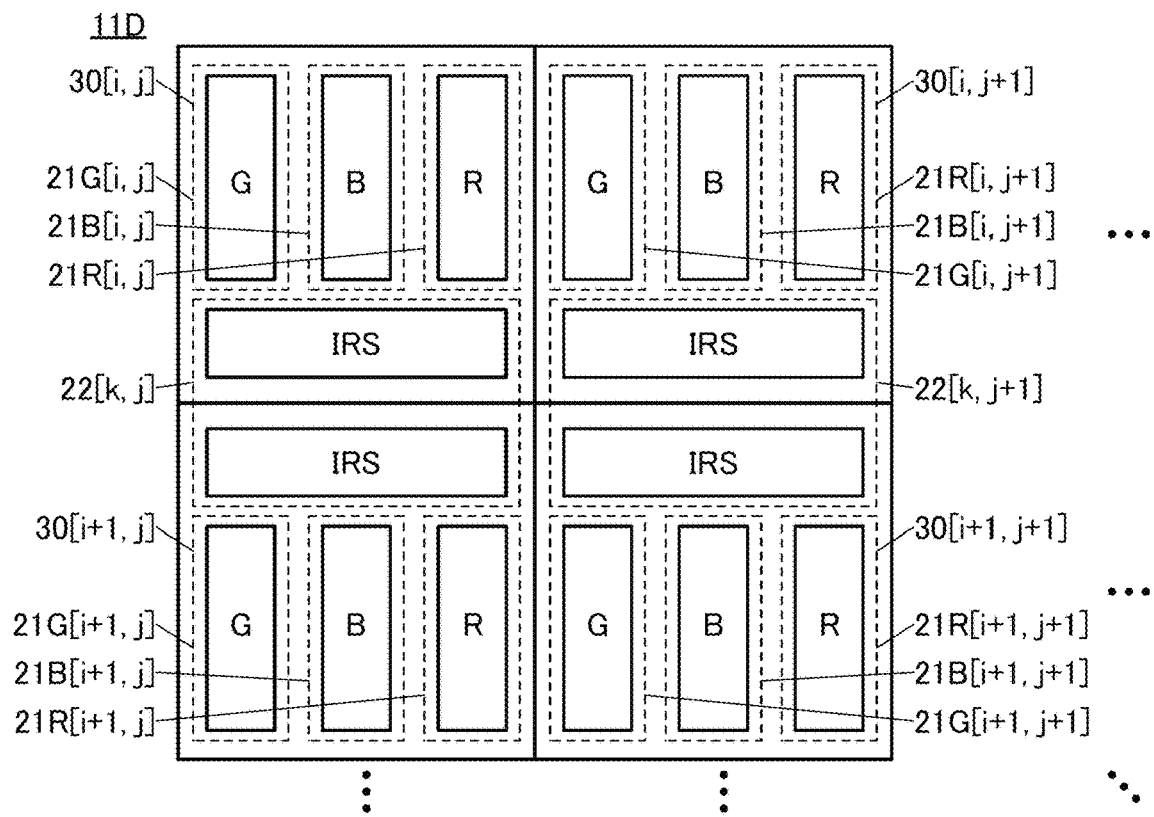
FIG. 13A and FIG. 13B are diagrams each illustrating an example of a display portion of a display apparatus.

As in a display portion 11D illustrated in FIG. 13A, the subpixels IRS may be provided instead of the subpixels PS. That is, one pixel circuit 22 can include two light-receiving devices having a function of receiving infrared light. In that case, one pixel circuit 22 has a function of controlling light reception of the two subpixels IRS.

Figure 13B:
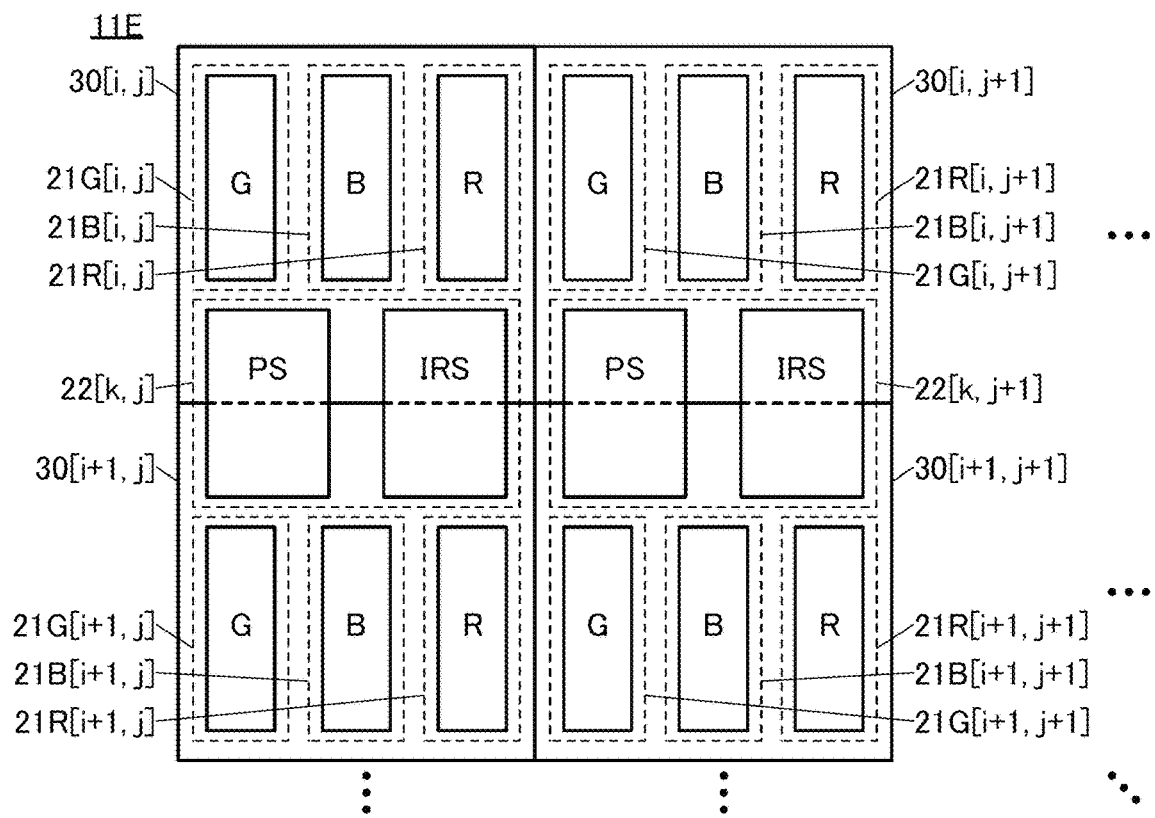

Although FIG. 10 and FIG. 12A illustrate the structures in each of which the subpixels PS and the subpixels IRS are arranged in the row direction, one embodiment of the present invention is not limited thereto. As in a display portion 11E illustrated in FIG. 13B, the subpixels PS and the subpixels IRS may be arranged in the column direction.

This embodiment can be combined with the other embodiments as appropriate. In the case where a plurality of structure examples are described in one embodiment in this specification, the structure examples can be combined as appropriate.

Embodiment 2

In this embodiment, electronic devices including display apparatuses of one embodiment of the present invention will be described with reference to drawings.

Figure 14A:
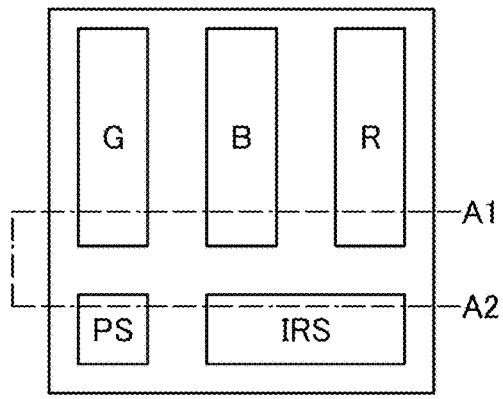
FIG. 14A is a diagram illustrating an example of a pixel of a display apparatus.
Figure 14B:
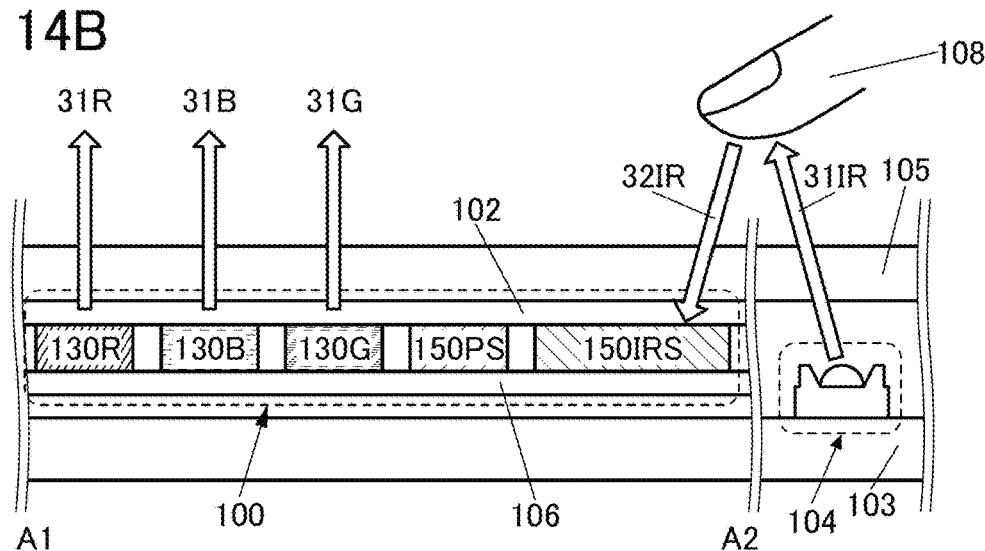
FIG. 14B and FIG. 14C are cross-sectional views each illustrating an example of an electronic device.
Figure 14C:
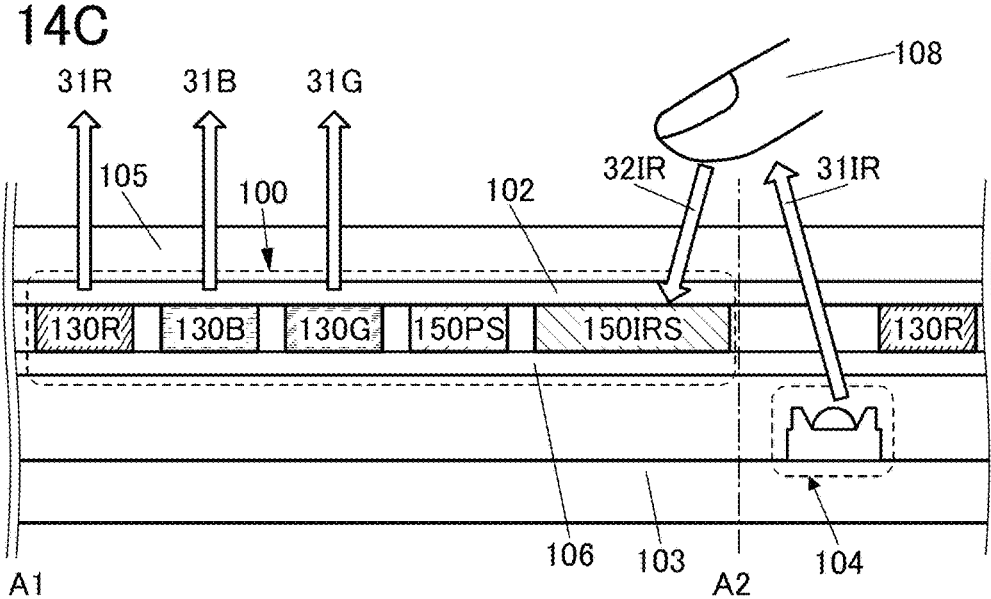

The display apparatus described in Embodiment 1 can be used in an electronic device of one embodiment of the present invention. FIG. 14A illustrates an example of a pixel included in the display apparatus of one embodiment of the present invention. FIG. 14B and FIG. 14C each illustrate an example of a cross-sectional view of an electronic device including the display apparatus of one embodiment of the present invention.

A pixel 180A illustrated in FIG. 14A includes the subpixel G, the subpixel B, the subpixel R, the subpixel PS, and the subpixel IRS. The above description of the pixel 30 can be referred to for the pixel 180A; thus, the detailed description thereof is omitted.

The electronic devices illustrated in FIG. 14B and FIG. 14C each include a display apparatus 100 and a light source 104 between a housing 103 and a protection member 105. The display apparatus 10 described in Embodiment 1 can be used as the display apparatus 100.

The light source 104 includes a light-emitting device that emits infrared light 311R. For example, a light-emitting diode (LED) is preferably used for the light source 104.

FIG. 14B illustrates an example in which the light source 104 is positioned so as not to overlap with the display apparatus 100. In this case, light from the light source 104 is emitted to the outside of the electronic device through the protection member 105.

FIG. 14C illustrates an example in which the display apparatus and the light source 104 are provided to overlap with each other. In this case, light from the light source 104 is emitted to the outside of the electronic device through the display apparatus 100 and the protection member 105.

FIG. 14B and FIG. 14C illustrate cross-sectional structures taken along the dashed-dotted line A1-A2 in FIG. 14A. The display apparatus 100 includes a plurality of light-emitting devices and a plurality of light-receiving devices between a substrate 106 and a substrate 102.

The subpixel R includes a light-emitting device 130R that emits red light 31R. The subpixel G includes a light-emitting device 130G that emits green light 31G. The subpixel B includes a light-emitting device 130B that emits blue light 31B.

The subpixel PS includes a light-receiving device 150PS, and the subpixel IRS includes a light-receiving device 150IRS.

As illustrated in FIG. 14B and FIG. 14C, the infrared light 31IR emitted from the light source 104 is reflected by an object 108 (here, a finger), and reflected light 32IR from the object 108 enters the light-receiving device 150IRS. The object 108 is not touching the electronic device, but the object 108 can be sensed with the light-receiving device 150IRS.

An example in which an object is sensed with the use of the infrared light 311R is described in this embodiment. The wavelength of light sensed by the light-receiving device 150IRS is not particularly limited. The light-receiving device 150IRS preferably senses infrared light. Alternatively, the light-receiving device 150IRS may sense visible light or both infrared light and visible light.

In a touch sensor or a near touch sensor, an increase in the light-receiving area of a light-receiving device can facilitate sensing of an object in some cases. Thus, as illustrated in FIG. 15A, the object 108 may be sensed with both the light-receiving device 150PS and the light-receiving device 150IRS.

Figure 15A:
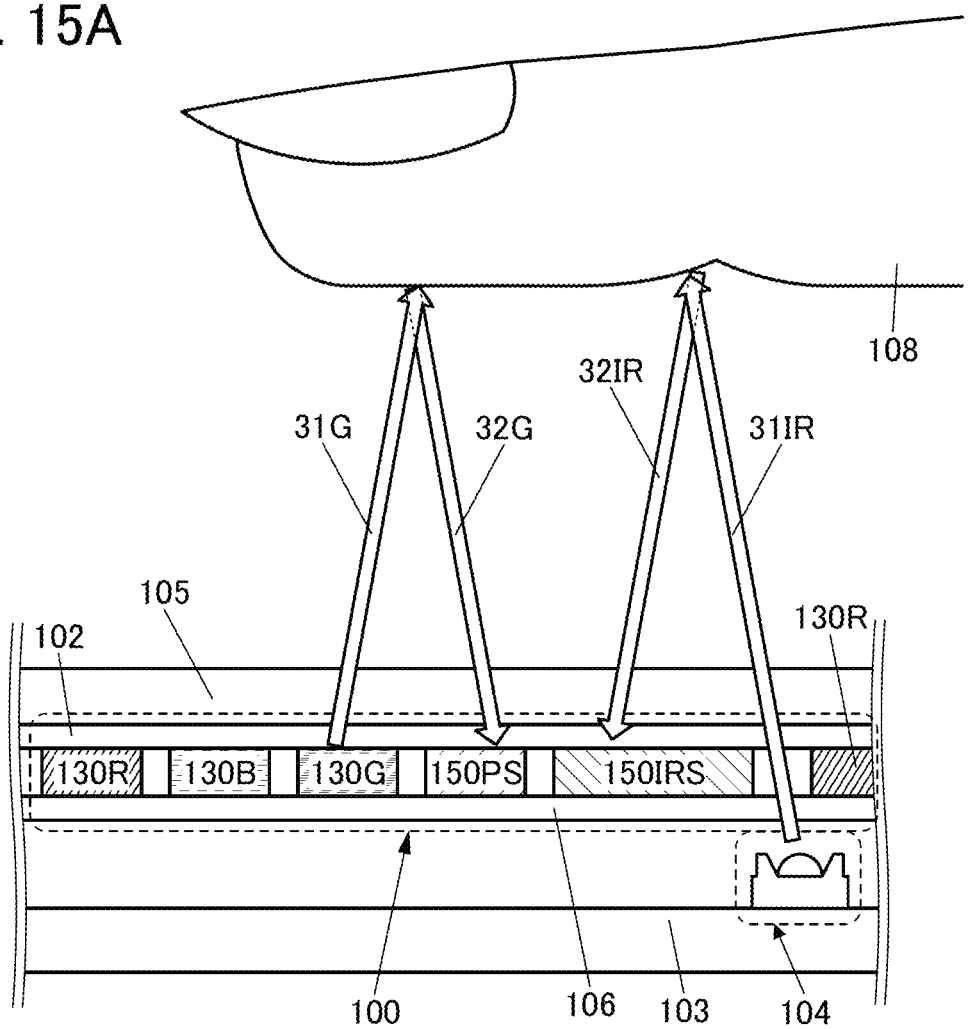
FIG. 15A and FIG. 15B are cross-sectional views illustrating an example of an electronic device.

In FIG. 15A, as in FIG. 14B and FIG. 14C, the infrared light 31IR emitted from the light source 104 is reflected by the object 108 (here, a finger), and the reflected light 32IR from the object 108 enters the light-receiving device 150IRS. In FIG. 15A, the green light 31G emitted from the light-emitting device 130G is also reflected by the object 108 and reflected light 32G from the object 108 enters the light-receiving device 150PS. The object 108 is not touching the electronic device, but the object 108 can be sensed with the light-receiving device 150IRS and the light-receiving device 150PS.

Note that the object 108 that is touching the electronic device can also be sensed with the light-receiving device 150IRS (and the light-receiving device 150PS).

The light-receiving area of the subpixel PS is smaller than the light-receiving area of the subpixel IRS. A smaller light-receiving area leads to a narrower image capturing range, inhibits a blur in a captured image, and improves the definition. Thus, the use of the subpixel PS enables higher-resolution or higher-definition image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

Figure 15B:
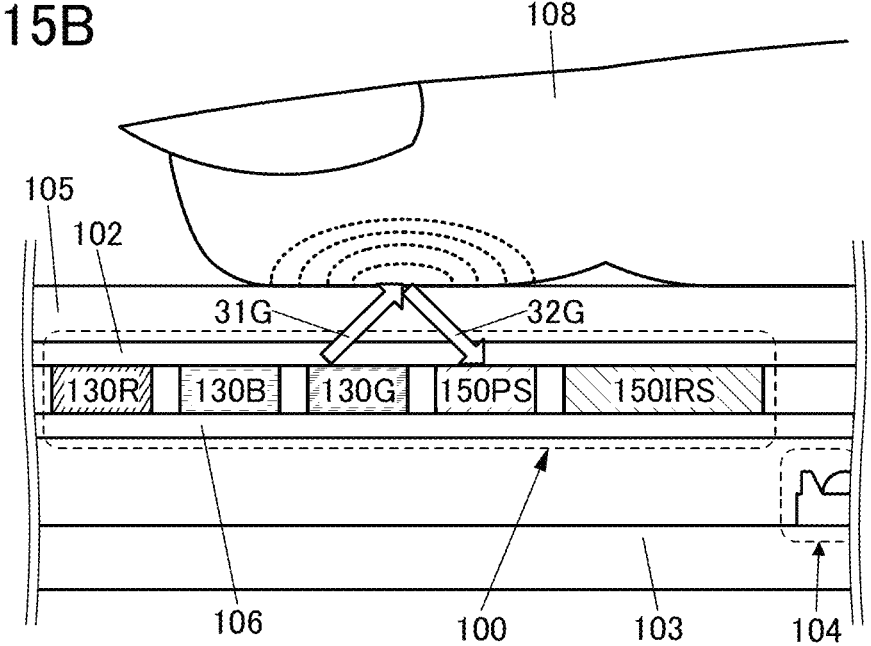

For example, as illustrated in FIG. 15B, the green light 31G emitted from the light-emitting device 130G is reflected by the object 108 and the reflected light 32G from the object 108 enters the light-receiving device 150PS. A fingerprint image of the object 108 can be captured with the light-receiving device 150PS.

In this embodiment, an example is described in which the light-receiving device 150PS senses an object with the use of the green light 31G emitted from the light-receiving device 130G. The wavelength of light sensed by the light-receiving device 150PS is not particularly limited. The light-receiving device 150PS preferably senses visible light, and preferably senses one or more of blue, violet, bluish violet, green, yellowish green, yellow, orange, red, and the like. The light-receiving device 150PS may sense infrared light.

For example, the light-receiving device 150PS may have a function of sensing the red light 31R emitted from the light-emitting device 130R. Furthermore, the light-receiving device 150PS may have a function of sensing the blue light 31B emitted from the light-emitting device 130B.

Note that a light-emitting device that emits light sensed by the light-receiving device 150PS is preferably provided in a subpixel positioned close to the subpixel PS in the pixel. For example, the pixel 180A has a structure in which light emitted from the light-emitting device 130G included in the subpixel G adjacent to the subpixel PS is sensed by the light-receiving device 150PS. With such a structure, the sensing accuracy can be increased.

In the display apparatus of one embodiment of the present invention, the structure of the pixel 180A may be employed for all the pixels; alternatively, the structure of the pixel 180A may be employed for some of the pixels and another structure may be employed for the other pixels.

Figure 16A:
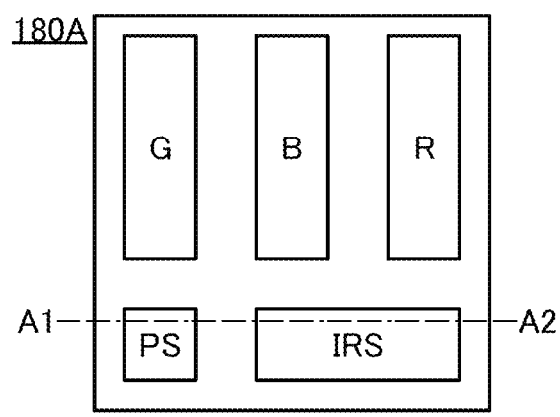
FIG. 16A to FIG. 16C are diagrams illustrating examples of pixels of a display apparatus.
Figure 16B:
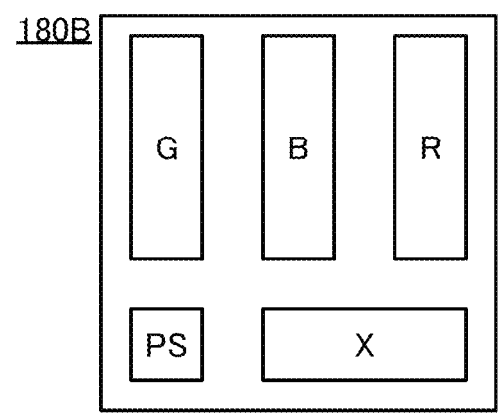

For example, the display apparatus of one embodiment of the present invention may include both the pixel 180A illustrated in FIG. 16A and a pixel 180B illustrated in FIG. 16B. The pixel 180A illustrated in FIG. 16A has a structure similar to the structure of the pixel 30 illustrated in FIG. 1B; thus, the detailed description thereof is omitted.

The pixel 180B illustrated in FIG. 16B includes the subpixel G, the subpixel B, the subpixel R, the subpixel PS, and a subpixel X.

With a device included in the subpixel X, the display apparatus or an electronic device including the display apparatus can have a variety of functions.

For example, with the device included in the subpixel X, the display apparatus or the electronic device can have a function of measuring at least one of force, displacement, position, speed, acceleration, angular velocity, rotational frequency, distance, magnetism, temperature, chemical substance, time, hardness, electric field, current, voltage, electric power, radiation, flow rate, humidity, gradient, oscillation, odor, physical condition, pulse, body temperature, and blood oxygen level.

Examples of the function of the display apparatus or the electronic device include a strobe light function, a flashlight function, a degradation correction function, an acceleration sensing function, an odor sensing function, a function of sensing the physical condition, a pulse sensing function, a body temperature sensing function, and a function of measuring the blood oxygen level.

A strobe light function can be obtained, for example, by repetition of light emission and non-light emission at short intervals.

A flashlight function can be obtained, for example, with a structure in which flash of light is caused by instantaneous discharge using principles of an electric double layer or the like.

For example, a strobe light function and a flashlight function can be used for crime prevention, self-defense, or the like. The light emission color of a strobe light and a flashlight is preferably white. There is no particular limitation on the light emission color of the strobe light and the flashlight; the practitioner can appropriately select one or more optimal light emission colors from white, blue, violet, bluish violet, green, yellowish green, yellow, orange, red, and the like.

As the degradation correction function, a function of correcting degradation of a light-emitting device included in at least one subpixel selected from the subpixel G, the subpixel B, and the subpixel R can be given. Specifically, in the case where a material used for the light-emitting device included in the subpixel G has poor reliability, a structure including two subpixels G in the pixel 180B can be employed by making the subpixel X have the same structure as the subpixel G. Such a structure can double the area of the subpixel G. When the area of the subpixel G doubles, the reliability can be approximately two times as high as the case of one subpixel G. Alternatively, when two subpixels G are provided in the pixel 180B, one subpixel G may compensate for light emission of the other subpixel G that cannot emit light due to degradation or the like.

Although the case of the subpixel G is described above, the subpixel B and the subpixel R can also have similar structures.

The acceleration sensing function, the odor sensing function, the function of sensing the physical condition, the pulse sensing function, the body temperature sensing function, and the function of measuring the blood oxygen level can each be achieved by providing a sensor device necessary for each sensing in the subpixel X. The display apparatus or the electronic device can have a variety of functions depending on the sensor device provided in the subpixel X.

When a variety of functions are given to the subpixel X illustrated in FIG. 16B as described above, the display apparatus including the pixel 180B can be referred to as a multifunctional display apparatus or a multifunctional panel. Note that the subpixel X may have one function or two or more functions, and the practitioner can appropriately select optimal function(s).

Note that the display apparatus of one embodiment of the present invention may include a pixel composed of four subpixels without the subpixel X nor the subpixel IRS. That is, the display apparatus may include a pixel composed of the subpixel G, the subpixel B, the subpixel R, and the subpixel PS. In the display apparatus, the number of subpixels may vary among pixels. However, it is preferable that all pixels have the same number of subpixels for uniform quality of the pixels.

Figure 16C:
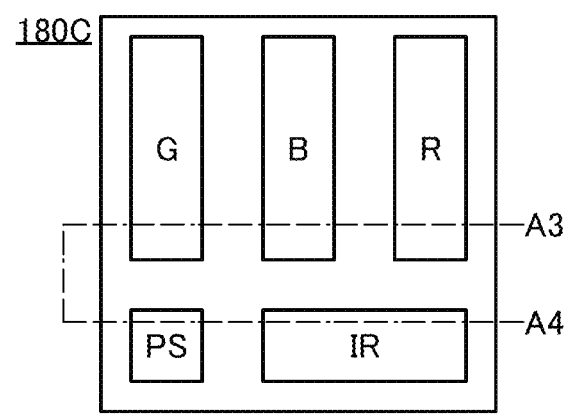

For example, the display apparatus of one embodiment of the present invention may include both the pixel 180A illustrated in FIG. 16A and a pixel 180C illustrated in FIG. 16C.

The pixel 180C illustrated in FIG. 16C includes the subpixel G, the subpixel B, the subpixel R, the subpixel PS, and a subpixel IR.

The subpixel IR includes a light-emitting device that emits infrared light. That is, the subpixel IR can be used as a light source of a sensor. When the display apparatus includes a light-emitting device that emits infrared light, a light source need not be provided separately from the display apparatus, reducing the number of components of the electronic device.

Figure 16D:
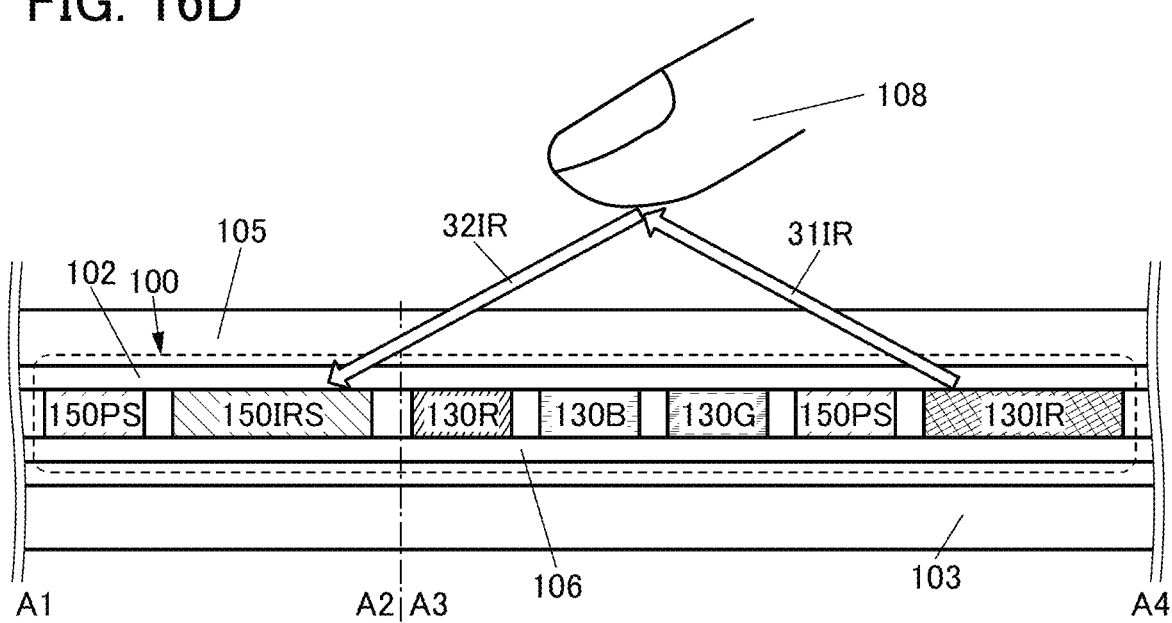
FIG. 16D is a cross-sectional view illustrating an example of an electronic device.

FIG. 16D is an example of a cross-sectional view of an electronic device including the display apparatus of one embodiment of the present invention.

The electronic device illustrated in FIG. 16D includes the display apparatus 100 between the housing 103 and the protection member 105.

The cross-sectional structure of the display apparatus 100 illustrated in FIG. 16D corresponds to the cross-sectional structure taken along the dashed-dotted line A1-A2 in FIG. 16A and the cross-sectional structure taken along the dashed-dotted line A3-A4 in FIG. 16C. That is, the display apparatus 100 illustrated in FIG. 16D includes the pixel 180A and the pixel 180C.

The subpixel R includes the light-emitting device 130R that emits the red light 31R. The subpixel G includes the light-emitting device 130G that emits the green light 31G. The subpixel B includes the light-emitting device 130B that emits the blue light 31B.

The subpixel PS includes the light-receiving device 150PS, and the subpixel IRS includes the light-receiving device 150IRS. The subpixel IR includes a light-emitting device 130IR that emits the infrared light 31IR.

As illustrated in FIG. 16D, the infrared light 31IR emitted from the light-emitting device 130IR is reflected by the object 108 (here, a finger), and the reflected light 32IR from the object 108 enters the light-receiving device 150IRS. The object 108 is not touching the electronic device, but the object 108 can be sensed with the light-receiving device 150IRS.

FIG. 17 to FIG. 20 illustrate examples of a layout of the display apparatus.

A near touch sensor function can be achieved, for example, in the following manner: an object (e.g., a finger, a hand, or a pen) is irradiated with light from a light source fixed to a specific position, reflected light from the object is sensed by a plurality of the subpixels IRS, and the position of the object is estimated from the sensing intensity ratio among the plurality of subpixels IRS.

The pixels 180A including the subpixels IRS can be arranged at regular intervals in a display portion or arranged around the display portion, for example.

The driving frequency can be increased when near touch sensing is performed using only some of the pixels. Furthermore, since the subpixel X or the subpixel IR can be included in the other pixels, a multifunctional display apparatus can be obtained.

Figure 17:
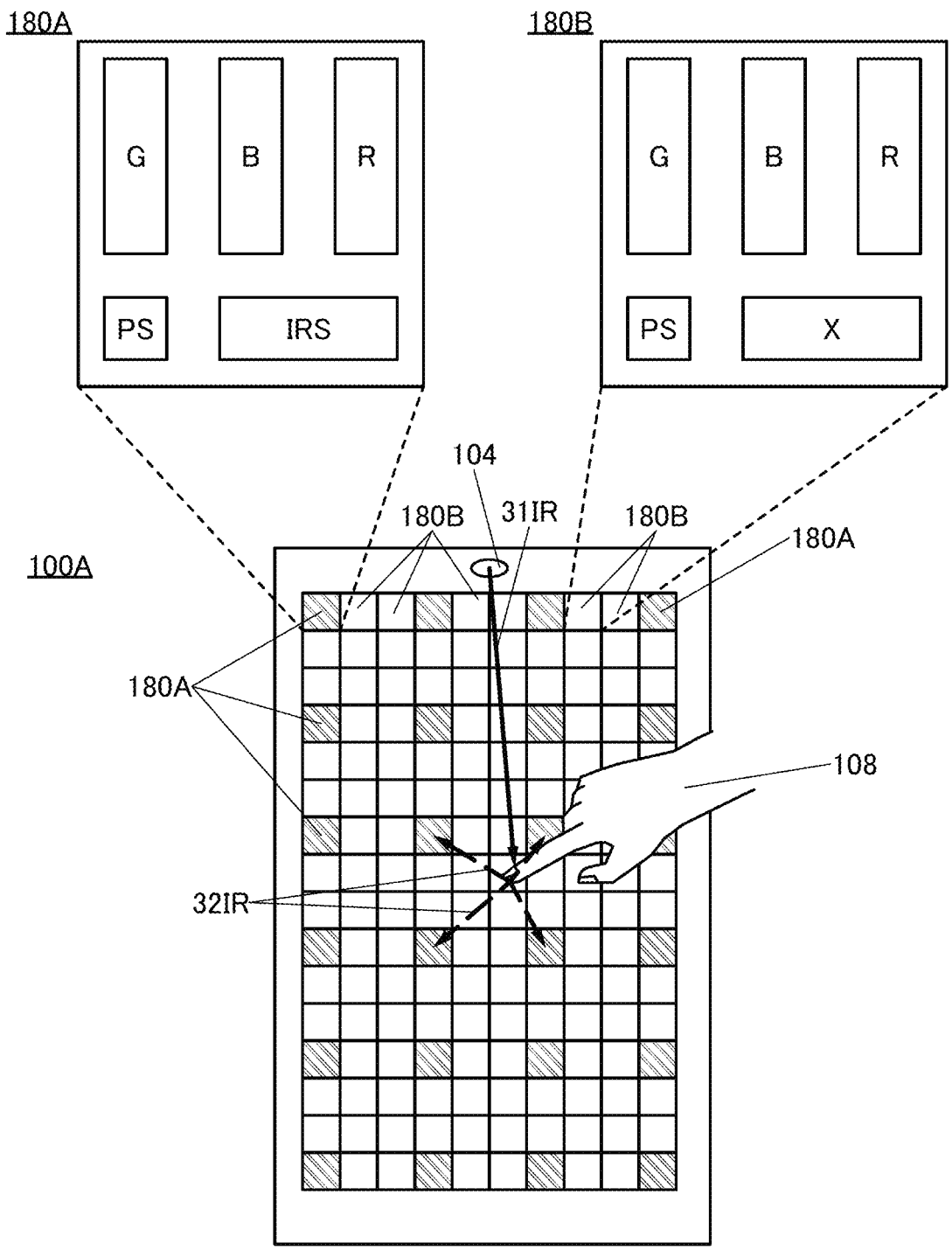
FIG. 17 is a diagram illustrating an example of a layout of a display apparatus.

A display apparatus 100A illustrated in FIG. 17 includes two kinds of pixels, the pixel 180A and the pixel 180B. In the display apparatus 100A, one pixel 180A is provided in every 3×3 pixels (9 pixels), and the other pixels are the pixels 180B.

Note that the placement interval of the pixels 180A is not limited to one in every 3×3 pixels. For example, the placement interval of pixels used for touch sensing can be determined as appropriate to be 1 pixel in every 4 pixels (2×2 pixels), 1 pixel in every 16 pixels (4×4 pixels), 1 pixel in every 100 pixels (10×10 pixels), 1 pixel in every 900 pixels (30×30 pixels), or the like.

Figure 18:
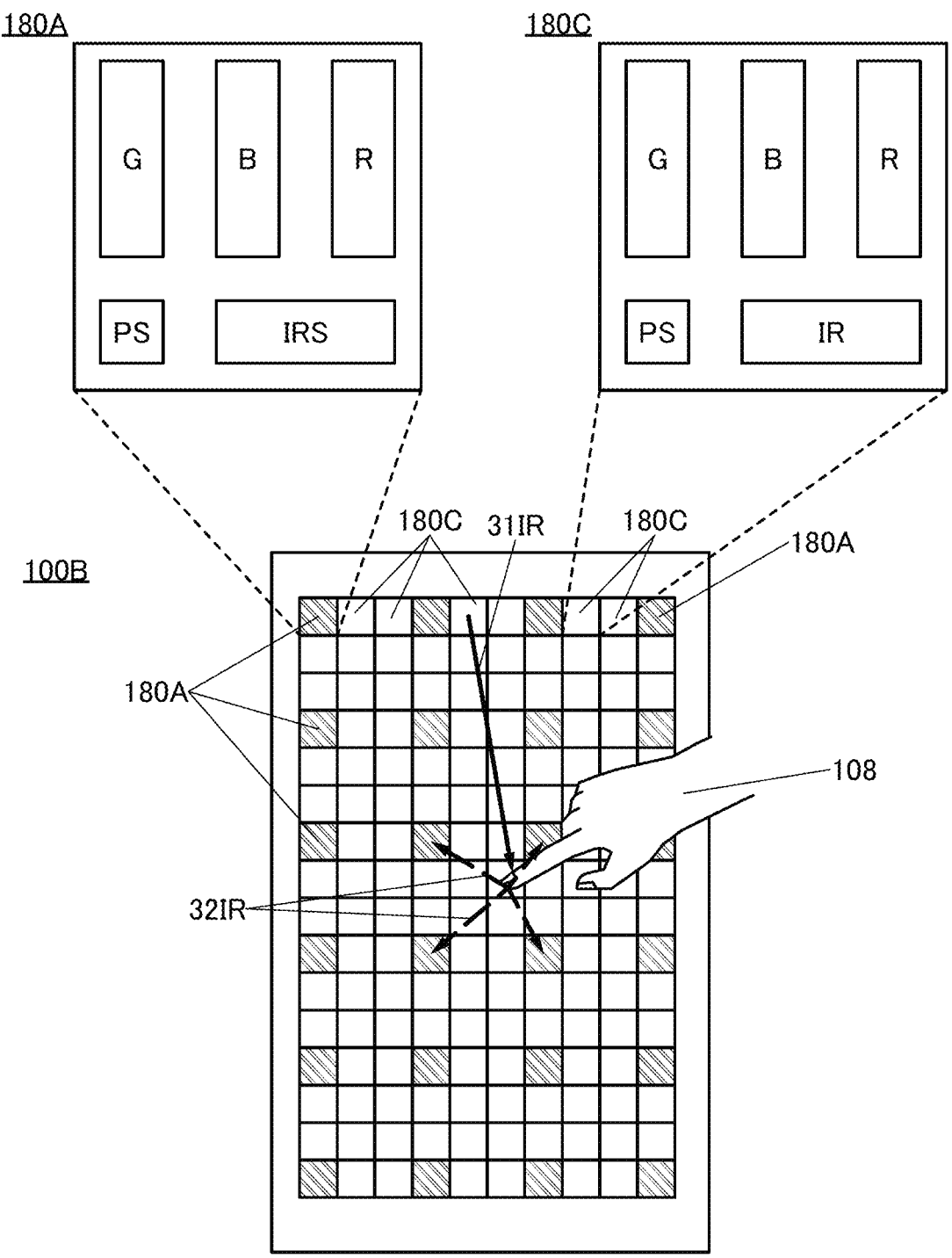
FIG. 18 is a diagram illustrating an example of a layout of a display apparatus.

A display apparatus 100B illustrated in FIG. 18 includes two kinds of pixels, the pixel 180A and the pixel 180C. In the display apparatus 100B, one pixel 180A is provided in every 3×3 pixels (9 pixels), and the other pixels are the pixels 180C.

Figure 19:
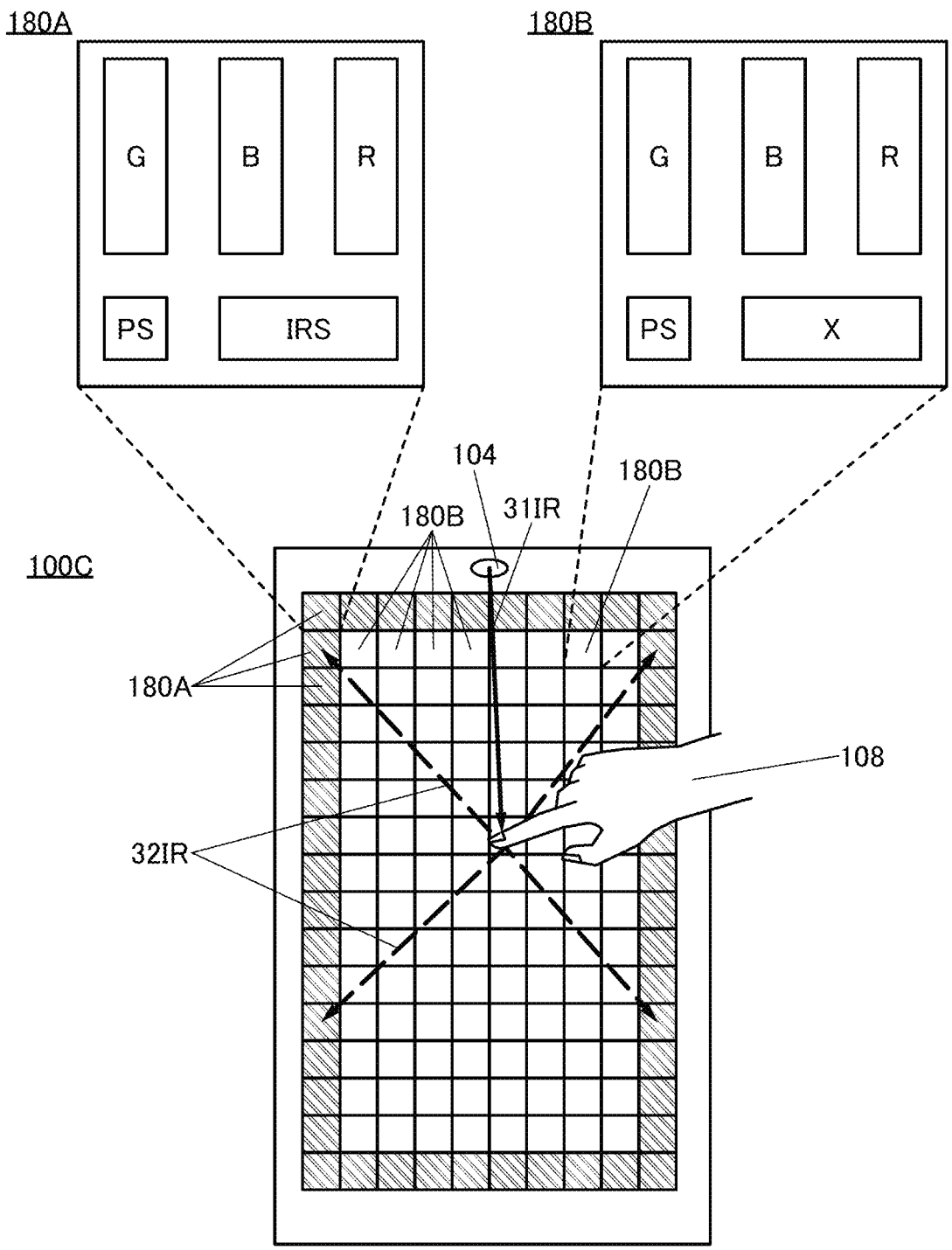
FIG. 19 is a diagram illustrating an example of a layout of a display apparatus.

A display apparatus 100C illustrated in FIG. 19 includes two kinds of pixels, the pixel 180A and the pixel 180B. In the display apparatus 100C, the pixels 180A are provided around the display portion, and the other pixels are the pixels 180B.

In the case where the pixels 180A are provided around the display portion, the pixels 180A can be arranged in a variety of ways: the pixels 180A may be arranged to surround all four sides as in FIG. 19; the pixels 180A may be provided at four corners; or one or more of the pixels 180A may be provided for each side.

Figure 20:
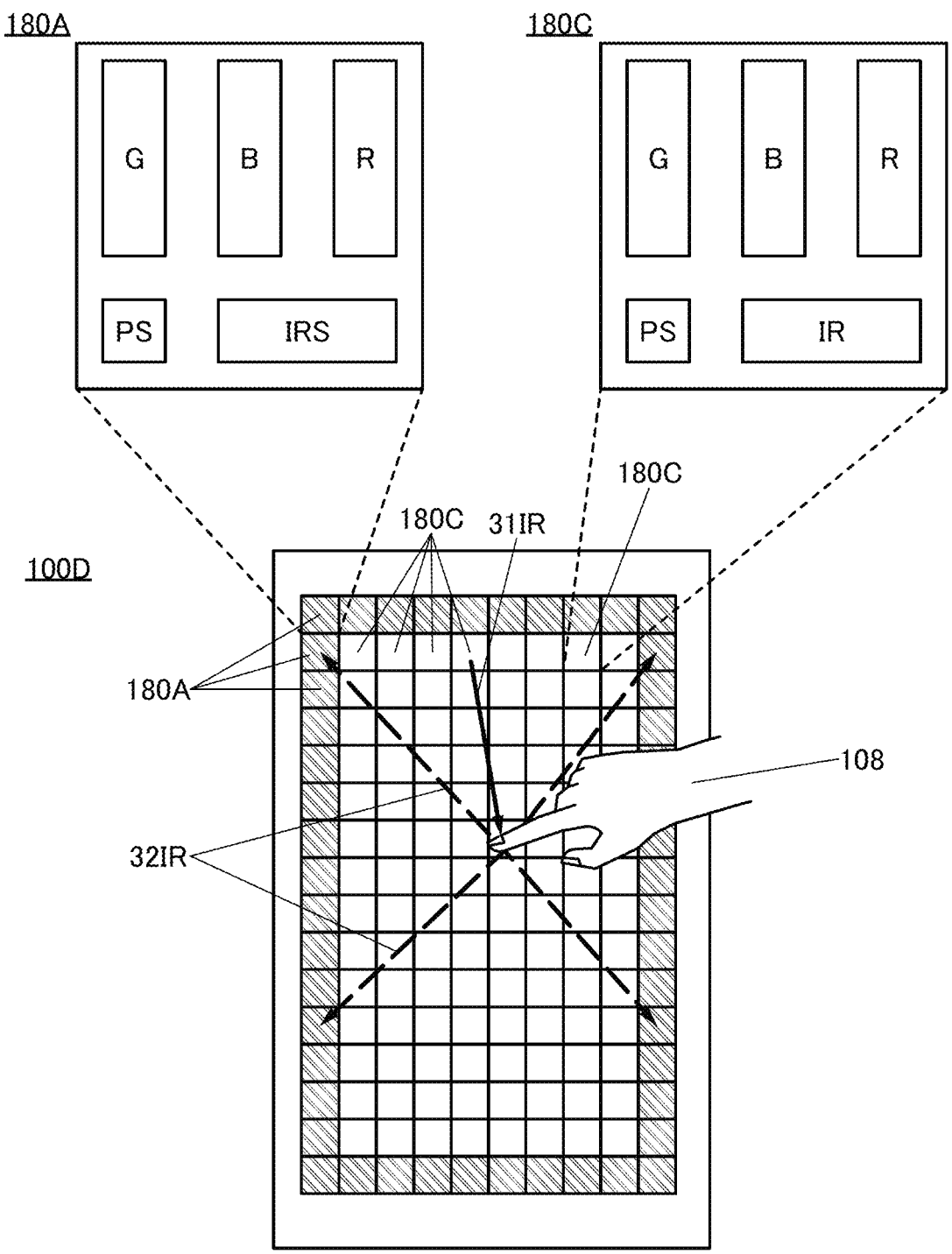
FIG. 20 is a diagram illustrating an example of a layout of a display apparatus.

A display apparatus 100D illustrated in FIG. 20 includes two kinds of pixels, the pixel 180A and the pixel 180C. In the display apparatus 100D, the pixels 180A are provided around the display portion, and the other pixels are the pixels 180C.

In FIG. 17 and FIG. 19, the infrared light 31IR emitted from the light source 104 provided in the outside of the display portion of the display apparatus is reflected by the object 108, and the reflected light 321R from the object 108 enters the plurality of pixels 180A. The reflected light 321R is sensed by the subpixels IRS provided in the pixels 180A, and thus the position of the object 108 can be estimated from the sensing intensity ratio among the plurality of subpixels IRS.

Note that the light source 104 is provided at least in the outside of the display portion of the display apparatus. The light source 104 may be incorporated in the display apparatus or mounted on an electronic device separately from the display apparatus. As the light source 104, a light-emitting diode that emits infrared light can be used, for example.

In FIG. 18 and FIG. 20, the infrared light 31IR emitted from the subpixel IR included in the pixel 180C is reflected by the object 108, and the reflected light 321R from the object 108 enters the plurality of pixels 180A. The reflected light 321R is sensed by the subpixels IRS provided in the pixels 180A, and thus the position of the object 108 can be estimated from the sensing intensity ratio among the plurality of subpixels IRS.

As described above, the display apparatus can have a variety of layouts.

Figure 21A:
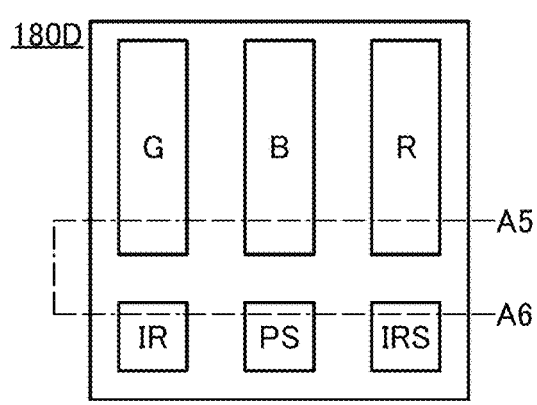
FIG. 21A and FIG. 21B are diagrams illustrating examples of a pixel of a display apparatus.

FIG. 21A illustrates an example different from the pixel 180A to the pixel 180C described above. A pixel 180D illustrated in FIG. 21A includes the subpixel G, the subpixel B, the subpixel R, the subpixel IR, the subpixel PS, and the subpixel IRS. FIG. 21A illustrates an example in which the subpixels are provided in two rows and three columns in one pixel 180D. The pixel 180D includes three subpixels (the subpixel G, the subpixel B, and the subpixel R) in the upper row (first row) and three subpixels (the subpixel IR, the subpixel PS, and the subpixel IRS) in the lower row (second row). In other words, the pixel 180D includes two subpixels (the subpixel G and the subpixel IR) in the left column (first column), two subpixels (the subpixel B and the subpixel PS) in the center column (second column), and two subpixels (the subpixel R and the subpixel IRS) in the right column (third column). Note that the arrangement of the subpixels is not limited to that in the structure in FIG. 21A.

The above description can be referred to for the subpixel G, the subpixel B, the subpixel R, the subpixel IR, the subpixel PS, and the subpixel IRS; thus, the detailed description thereof is omitted.

Figure 21B:
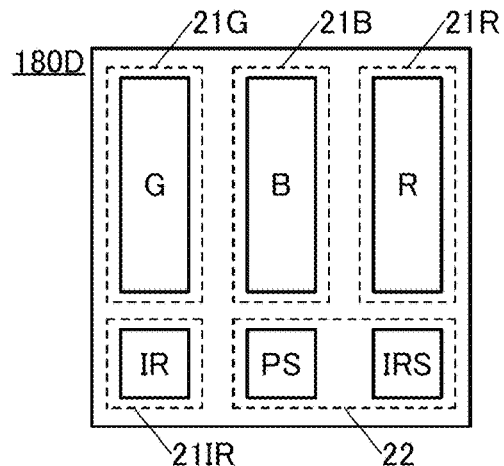

As illustrated in FIG. 21B, the pixel 180D includes the pixel circuit 21R, the pixel circuit 21G, the pixel circuit 21B, a pixel circuit 211R, and the pixel circuit 22. The above description can be referred to for the pixel circuit 21R, the pixel circuit 21G, the pixel circuit 21B, and the pixel circuit 22; thus, the detailed description thereof is omitted. The pixel circuit 211R has a function of controlling light emission from the subpixel IR. The pixel circuit 211R can have the structure of the pixel circuit 21R, the pixel circuit 21G, or the pixel circuit 21B. For example, the pixel circuit 21 illustrated in FIG. 2B can be used as the pixel circuit 211R.

Figure 21C:
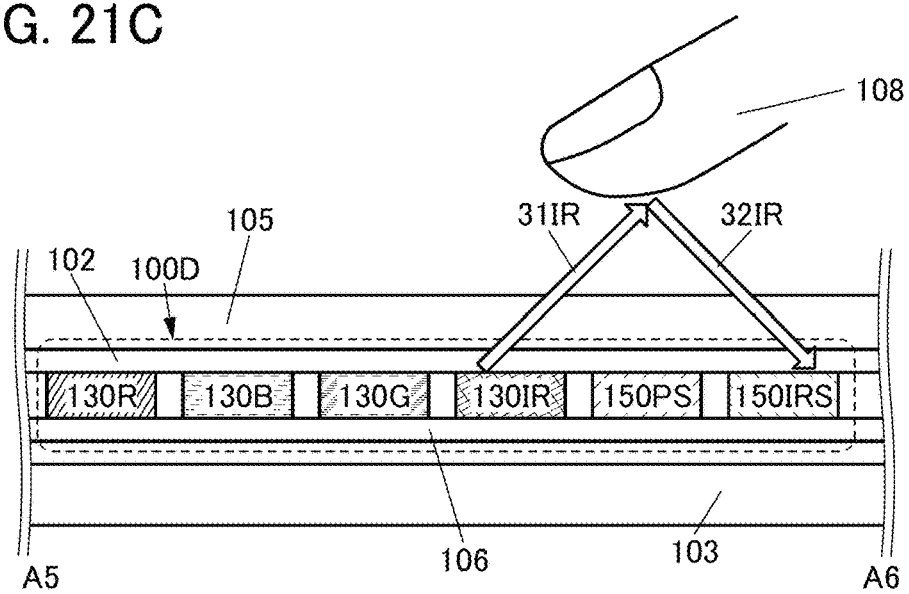
FIG. 21C and FIG. 21D are cross-sectional views illustrating an example of an electronic device.
Figure 21D:
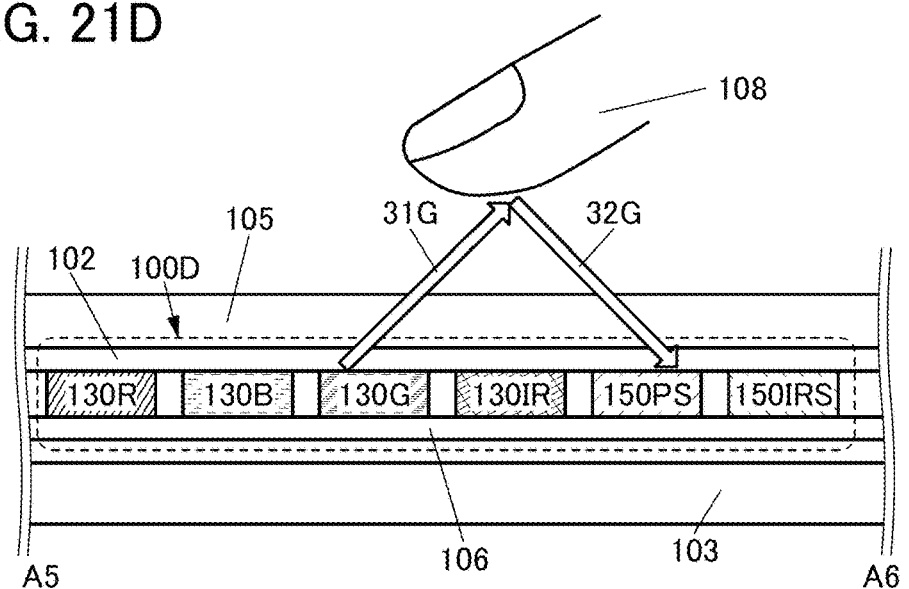

FIG. 21C and FIG. 21D illustrate cross-sectional structures taken along the dashed-dotted line A5-A6 in FIG. 21A. FIG. 21C illustrates a state in which the infrared light 31IR emitted from the light-emitting device 130IR is reflected by the object 108 (here, a finger), and the reflected light 321R from the object 108 enters the light-receiving device 150IRS. FIG. 21D illustrates a state in which the green light 31G emitted from the light-emitting device 130G is reflected by the object 108 (here, a finger), and the reflected light 32G from the object 108 enters the light-receiving device 150PS.

A display apparatus 100E illustrated in FIG. 22 includes the pixel 180D. As illustrated in FIG. 22, the infrared light 31IR emitted from the pixel 180D is reflected by the object 108 (here, a finger), and the reflected light 321R from the object 108 enters the light-receiving device 150IRS included in the pixel 180D. The touch or approach of the object 108 on/to the display apparatus 100E can be sensed.

Although FIG. 22 illustrates an example of the display apparatus including the pixel 180D, one embodiment of the present invention is not limited thereto. The display apparatus may include a combination of the pixel 180D and one or more of the pixel 180A, the pixel 180B, and the pixel 180C.

Figure 23A:
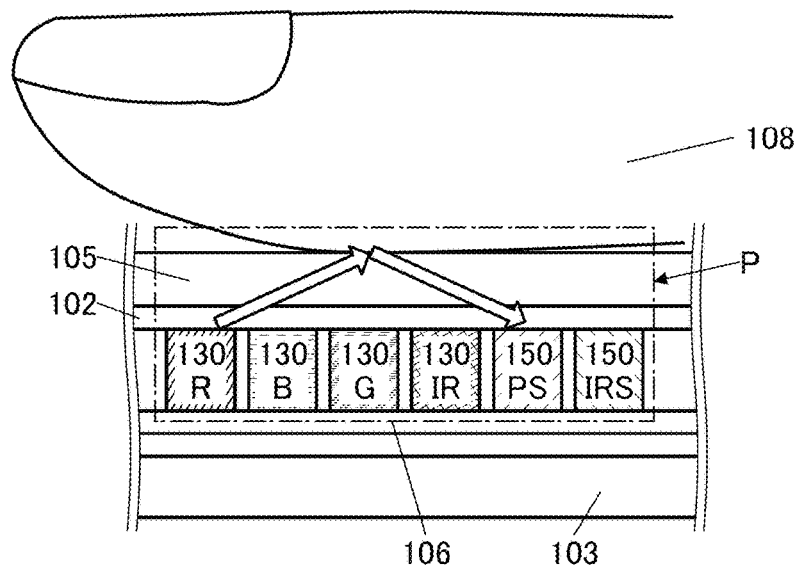
FIG. 23A to FIG. 23C are diagrams illustrating an example of a display apparatus.
Figure 23B:
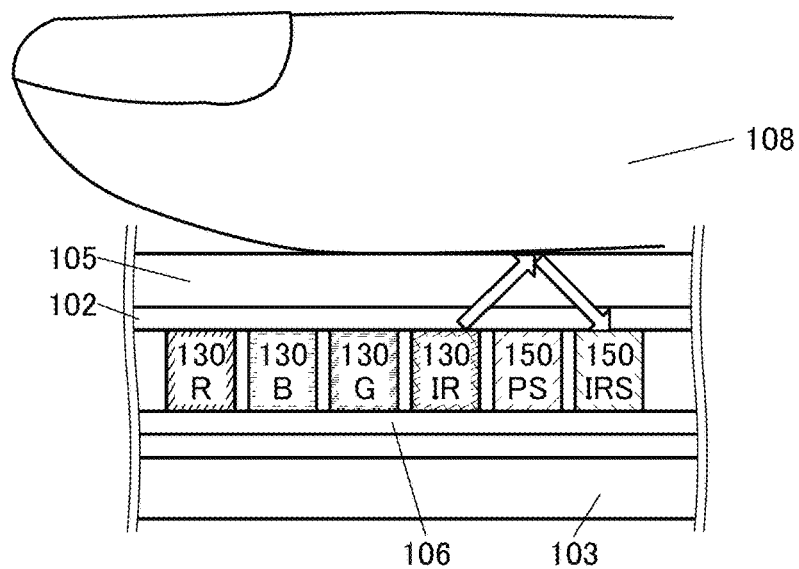

The display apparatus of one embodiment of the present invention may emit light of a particular color and receive reflected light reflected by an object. FIG. 23A schematically illustrates red light emitted from the display apparatus and red light that is reflected by the object 108 (here, a finger) and enters the display apparatus by arrows. FIG. 23B schematically illustrates infrared light emitted from the display apparatus and infrared light that is reflected by the object 108 (here, a finger) and enters the display apparatus by arrows.

When red light is emitted and reflected light from an object enters a display apparatus while the object is touching or approaching the display apparatus, the red light transmittance of the object can be measured. Similarly, when infrared light is emitted and reflected light from an object enters a display apparatus while the object is touching or approaching the display apparatus, the infrared light transmittance of the object can be measured.

Figure 23C:
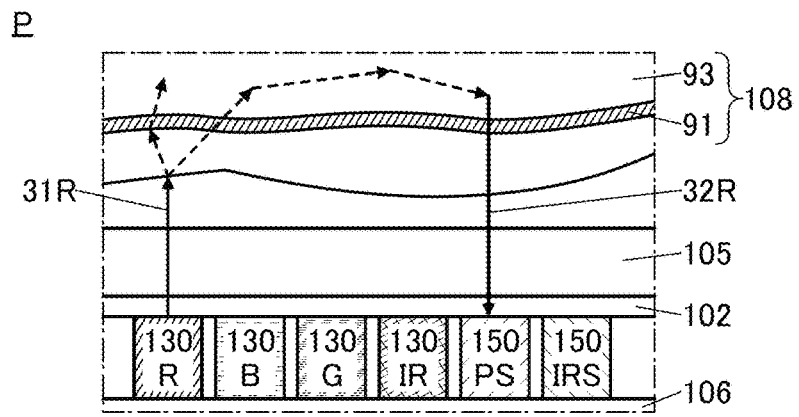

FIG. 23C is an enlarged view of a region P indicated by a dashed-dotted line in FIG. 23A. The light 31R emitted from the light-emitting device 130R is scattered by the biological tissue on the surface or at the inside of the object 108, and part of the scattered light travels toward the light-receiving device 150PS from the inside of the living body. The scattered light passes through a blood vessel 91 and light 32R passing through the blood vessel 91 enters the light-receiving device 150PS.

Similarly, the infrared light emitted from the light-emitting device 130IR is scattered by the biological tissue on the surface or at the inside of the object 108, and part of the scattered light travels toward the light-receiving device 150IRS from the inside of the living body. The scattered light passes through the blood vessel 91 and the infrared light passing through the blood vessel 91 enters the light-receiving device 150IRS.

Here, the light 32R is light passing through biological tissue 93 and the blood vessel 91 (an artery and a vein). Since artery blood pulsates with heartbeat, light absorption by the artery fluctuates in accordance with the heartbeat. By contrast, the biological tissue 93 and the vein are not influenced by the heartbeat; thus, light absorption by the biological tissue 93 and light absorption by the vein are constant. Accordingly, the light transmittance of the artery can be calculated by subtracting the components that are constant over time from the light 32R entering the display apparatus. The red light transmittance of oxygen-unbound hemoglobin (also referred to as reduced hemoglobin) is lower than that of oxygen-bound hemoglobin (also referred to as oxyhemoglobin). Oxyhemoglobin and reduced hemoglobin have substantially the same infrared light transmittance. Measuring the red light transmittance of the artery and the infrared light transmittance of the artery enables the ratio of oxyhemoglobin to the total amount of oxyhemoglobin and reduced hemoglobin, that is, the oxygen saturation (hereinafter, also referred to as percutaneous oxygen saturation ($SpO_2$: Peripheral Oxygen Saturation)), to be calculated. In this way, the display apparatus of one embodiment of the present invention can have a function of a reflective pulse oximeter.

For example, when a finger touches a display portion of a display apparatus, positional information of a region that the finger is touching is obtained. Then, pixels in the region that the finger is touching and in the vicinity thereof emit red light to measure the red light transmittance of an artery. After that, the pixels emit infrared light to measure the infrared light transmittance of the artery, so that the oxygen saturation can be calculated. Note that the order of measuring the red light transmittance and the infrared light transmittance is not particularly limited. The red light transmittance may be measured after the infrared light transmittance is measured. Although an example in which the oxygen saturation is calculated using a finger is described here, one embodiment of the present invention is not limited thereto. The oxygen saturation can be calculated with a part other than a finger. For example, the oxygen saturation can be calculated by measuring the red light transmittance of an artery and the infrared light transmittance of the artery while a palm is touching a display portion of a display apparatus.

Figure 24A:
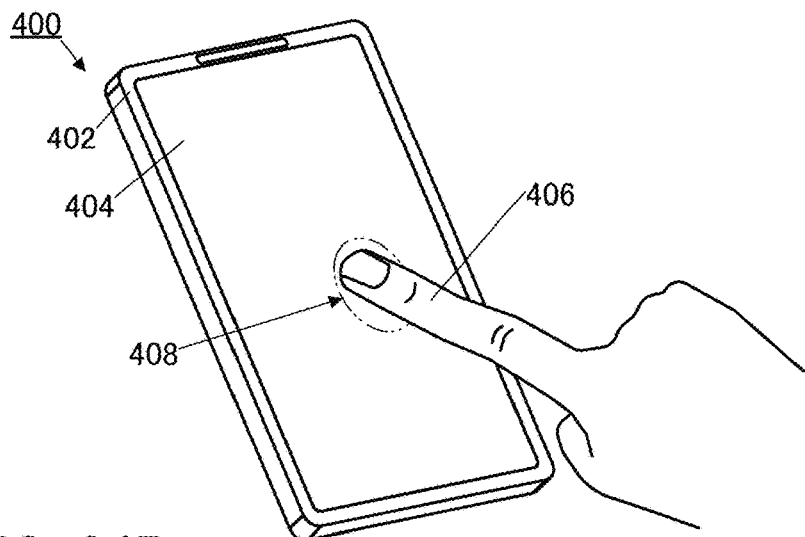
FIG. 24A to FIG. 24C are diagrams illustrating an example of an electronic device.

FIG. 24A illustrates an example of an electronic device using the display apparatus of one embodiment of the present invention. A portable information terminal 400 illustrated in FIG. 24A can be used as a smartphone, for example. The portable information terminal 400 includes a housing 402 and a display portion 404. The display portion 404 preferably includes the pixel 180D. The display apparatus 100E can be used for the display portion 404, for example.

FIG. 24A illustrates a state in which a finger 406 touches the display portion 404 of the portable information terminal 400. In FIG. 24A, a region 408 including a region where a touch is sensed and the vicinity thereof is indicated by a dashed-dotted line.

Figure 24B:
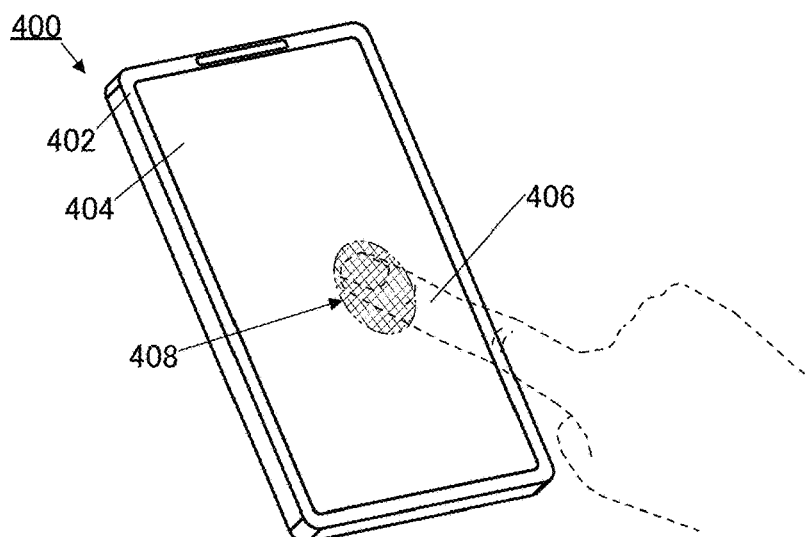

The portable information terminal 400 emits red light from pixels in the region 408 and senses red light entering the display portion 404. Similarly, infrared light is emitted from the pixels in the region 408 and infrared light entering the display portion 404 is sensed, so that the oxygen saturation of the finger 406 can be measured. FIG. 24B illustrates a state in which the pixels in the region 408 emit light. In FIG. 24B, the finger 406 is transparent with its outline indicated by a dashed line, and the region 408 is hatched. As illustrated in FIG. 24B, the region 408 that emits light is hidden by the finger 406 and thus is less likely to be recognized by a user. Thus, the oxygen saturation can be measured without causing stress to the user. The portable information terminal 400 can measure the oxygen saturation at any position on the display portion 404.

Figure 24C:
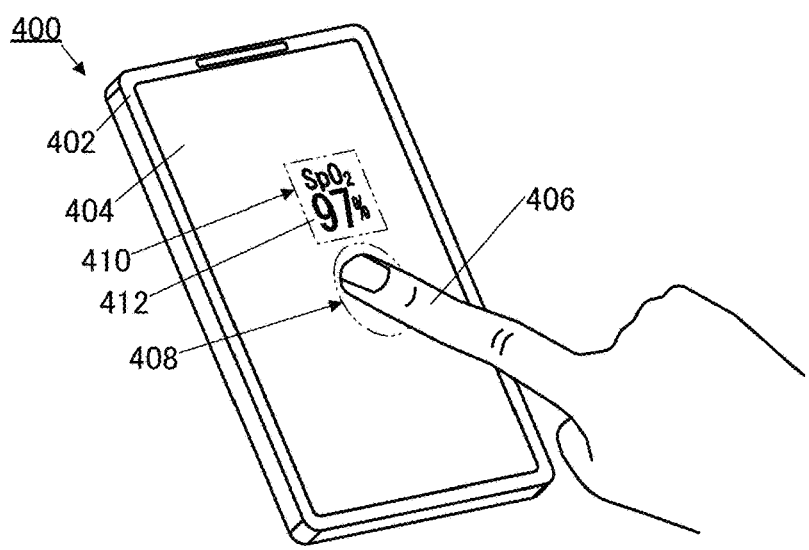

The obtained oxygen saturation may be shown on the display portion 404. FIG. 24C illustrates a state in which an image 412 showing the oxygen saturation is displayed in a region 410. FIG. 24C illustrates characters of "SpO$_2$ 97%" as an example of the image 412. Note that the image 412 may be an image or may include an image and a character. The region 410 is provided at a given position in the display portion 404.

This embodiment can be combined with the other embodiments as appropriate. In the case where a plurality of structure examples are described in one embodiment in this specification, the structure examples can be combined as appropriate.

Embodiment 3

In this embodiment, a display apparatus of one embodiment of the present invention and a fabrication method thereof will be described with reference to FIG. 25 to FIG. 29.

The display apparatus of one embodiment of the present invention includes a light-emitting device and a light-receiving device in a pixel. In the display apparatus of one embodiment of the present invention, the pixel has a light-receiving function, which enables a touch or approach of an object to be sensed while an image is displayed. For example, all the subpixels included in the display apparatus can display an image; alternatively, some of the subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image display function. The display portion can be used as an image sensor or a touch sensor. That is, by sensing light with the display portion, an image can be captured or an approach or touch of an object (e.g., a finger, a hand, or a pen) can be sensed. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light); thus, image capturing or touch sensing is possible even in a dark place.

The display apparatus of one embodiment of the present invention has a function of displaying an image using the light-emitting devices. That is, the light-emitting devices function as display devices (also referred to as display elements).

As the light-emitting device, an EL device such as an OLED (Organic Light Emitting Diode) and a QLED (Quantum-dot Light Emitting Diode) is preferably used. Examples of a light-emitting substance contained in the EL device include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can also be used as the light-emitting device. Note that as a TADF material, a material that is in a thermal equilibrium state between a singlet excited state and a triplet excited state may be used. Since such a TADF material enables a short emission lifetime (excitation lifetime), an efficiency decrease of a light-emitting device in a high-luminance region can be inhibited.

The display apparatus of one embodiment of the present invention has a function of sensing light using the light-receiving devices.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can sense an approach or touch of an object with the use of the light-receiving devices.

For example, a pn or pin photodiode can be used as the light-receiving device. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus using the organic EL device.

Since a large number of layers in the organic photodiodes can have structures in common with the layers in the organic EL devices, forming the layers having common structures concurrently can inhibit an increase in the number of film formation steps.

For example, one of a pair of electrodes (a common electrode) can be a layer shared by the light-receiving device and the light-emitting device. For another example, at least one of a hole-injection layer, a hole-transport layer, an electron-transport layer, and an electron-injection layer is preferably shared by the light-receiving device and the light-emitting device.

Note that a layer shared by the light-receiving device and the light-emitting device might have different functions in the light-emitting device and the light-receiving device. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

In the case of fabricating a display apparatus including a plurality of organic EL devices that emit light of different colors from their light-emitting layers, the light-emitting layers that emit light of different colors each need to be formed in an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of the outline of the formed film; accordingly, it is difficult to achieve high resolution and a high aperture ratio of the display apparatus.

In a method for fabricating the display apparatus of one embodiment of the present invention, an island-shaped pixel electrode (also referred to as a lower electrode) is formed, a first layer (also referred to as an EL layer or part of an EL layer) including a light-emitting layer emitting light of a first color is formed on the entire surface, and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that of the first layer, a second layer (also referred to as an EL layer or part of an EL layer) including a light-emitting layer emitting light of a second color is processed into an island shape using a second sacrificial layer and a second resist mask.

As described above, in the method for fabricating the display apparatus of one embodiment of the present invention, an island-shaped EL layer is formed by processing an EL layer formed on the entire surface, not by using a fine metal mask. Accordingly, a high-resolution display apparatus or a display apparatus with a high aperture ratio, which has been difficult to achieve, can be fabricated. Moreover, EL layers can be formed separately for the respective colors, enabling the display apparatus to perform extremely clear display with high contrast and high display quality. In addition, a sacrificial layer provided over an EL layer can reduce damage to the EL layer in the fabrication process of the display apparatus, increasing the reliability of the light-emitting device.

It is difficult to set the distance between adjacent light-emitting devices to be less than 10 μm with a formation method using a metal mask, for example; however, with the above method, the distance can be decreased to 3 μm or less, 2 μm or less, or 1 μm or less.

A pattern of the EL layer itself can be made extremely smaller than that in the case of using a metal mask. For example, in the case of using a metal mask for forming EL layers separately, a variation in the thickness of the pattern occurs between the center and the edge of the pattern, causing a reduction in effective area that can be used for a light-emitting region with respect to the entire pattern area. By contrast, in the above fabrication method, a pattern is formed by processing a film formed to have a uniform thickness, which enables a uniform thickness in the pattern; thus, even with a fine pattern, almost the entire area can be used for a light-emitting region. Thus, a display apparatus having both high resolution and a high aperture ratio can be fabricated.

Here, each of the first layer and the second layer includes at least a light-emitting layer and preferably consists of a plurality of layers. Specifically, one or more layers are preferably formed over the light-emitting layer. A layer between the light-emitting layer and the sacrificial layer can inhibit the light-emitting layer from being exposed on the outermost surface during the fabrication process of the display apparatus and can reduce damage to the light-emitting layer. Thus, the reliability of the light-emitting device can be increased.

Note that it is not necessary to form all layers included in EL layers separately between light-emitting devices that exhibit different colors, and some layers of the EL layers can be formed in the same step. In the method for fabricating the display apparatus of one embodiment of the present invention, some layers included in the EL layer are formed into an island shape separately for each color, and then the sacrificial layer is removed. After that, the other layers included in the EL layers and a common electrode (also referred to as an upper electrode) are formed so as to be shared by the light-emitting devices of different colors.

A fabrication method similar to that of the light-emitting device can be employed for the light-receiving device. An island-shaped active layer (also referred to as a photoelectric conversion layer) included in the light-receiving layer is formed by processing a film that is to be the active layer and formed on the entire surface, not by using a fine metal mask; thus, the island-shaped active layer can have a uniform thickness. In addition, a sacrificial layer provided over the active layer can reduce damage to the active layer in the fabrication process of the display apparatus, increasing the reliability of the light-receiving device.

[Structure Example 1 of Display Apparatus]

Figure 25A:
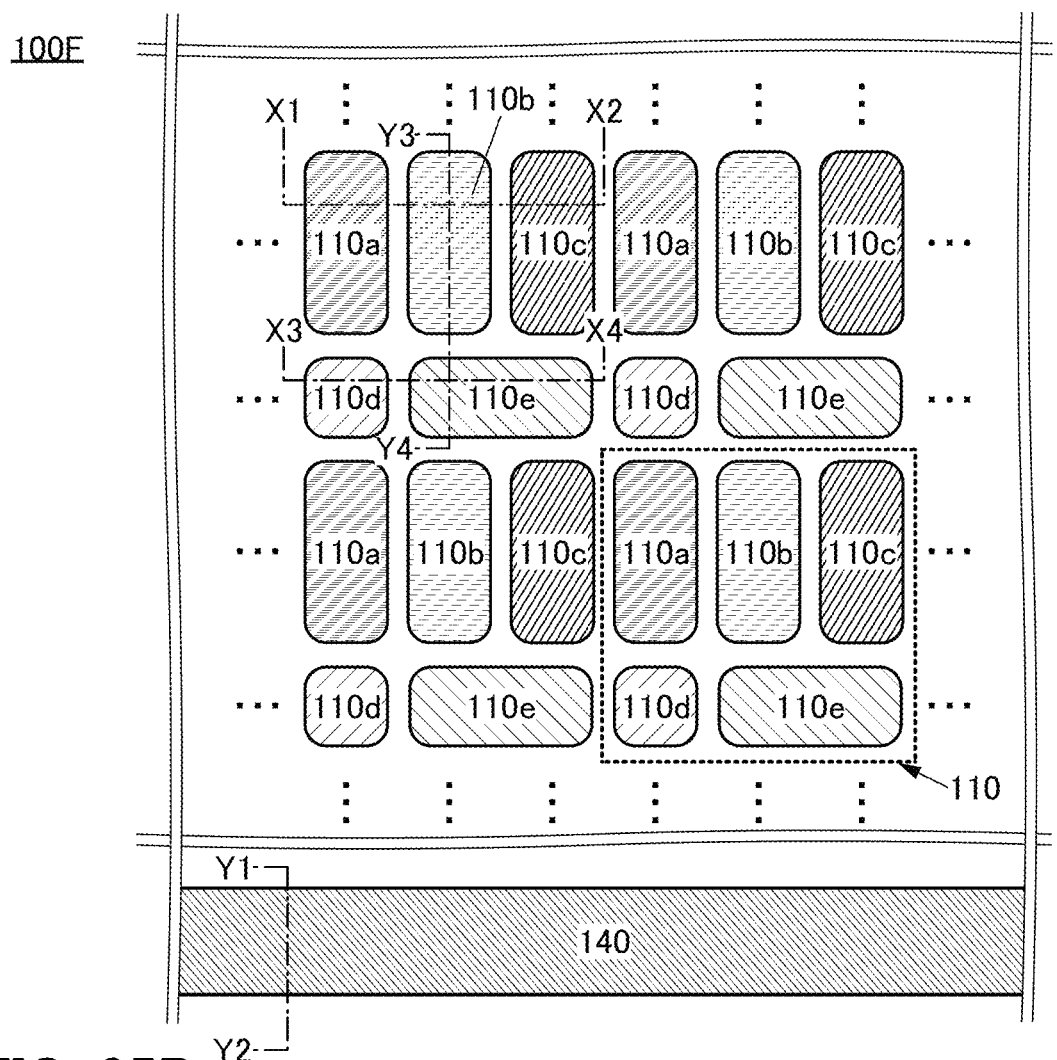
FIG. 25A is a top view illustrating an example of a display apparatus.
Figure 25B:
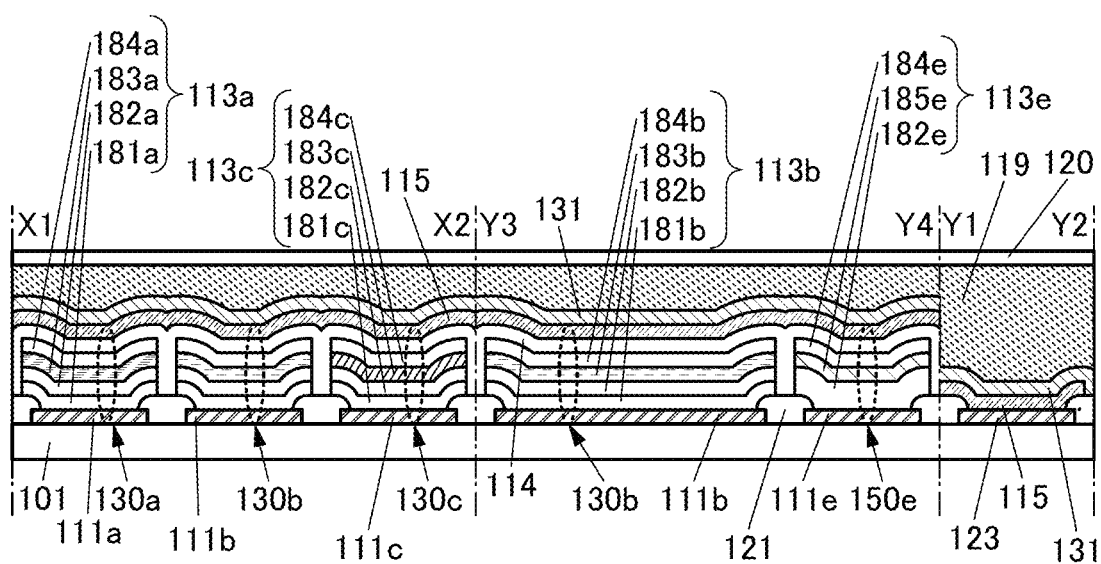
FIG. 25B is a cross-sectional view illustrating an example of the display apparatus.

FIG. 25A and FIG. 25B illustrate a display apparatus of one embodiment of the present invention.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 25A is a top view of a display apparatus 100F. The display apparatus 100F includes a display portion in which a plurality of pixels 110 are arranged in a matrix, and a connection portion 140 outside the display portion. One pixel 110 consists of five subpixels of a subpixel 110a, a subpixel 110b, a subpixel 110c, a subpixel 110d, and a subpixel 110e. The connection portion 140 can also be referred to as a cathode contact portion.

FIG. 25A illustrates an example in which the subpixels are provided in two rows and three columns in one pixel 110. The pixel 110 includes three subpixels (the subpixels 110a, 110b, and 110c) in the upper row (first row) and two subpixels (the subpixels 110d and 110e) in the lower row (second row). In other words, the pixel 110 includes two subpixels (the subpixels 110a and 110d) in the left column (first column), the subpixel 110b in the center column (second column), the subpixel 110c in the right column (third column), and the subpixel 110e across these two columns.

In this embodiment, an example is described in which the subpixels 110a, 110b, and 110c include light-emitting devices that emit light of different colors and the subpixels 110d and 110e include light-receiving devices that have different light-receiving areas. For example, the subpixels 110a, 110b, and 110c correspond to the subpixel G, the subpixel B, and the subpixel R illustrated in FIG. 14A or the like. The subpixel 110d corresponds to the subpixel PS illustrated in FIG. 14A or the like and the subpixel 110e corresponds to the subpixel IRS illustrated in FIG. 14A or the like.

Note that the kind of devices provided in the subpixels 110e may differ among the pixels. Thus, a structure may be employed in which some of the subpixels 110e correspond to the subpixels IRS and the other subpixels 110e correspond to the subpixels X (see FIG. 16B) or the subpixels IR (see FIG. 16C).

Although the top view of FIG. 25A illustrates an example in which the connection portion 140 is positioned in the lower side of the display portion, one embodiment of the present invention is not particularly limited. The connection portion 140 is provided in at least one of the upper side, the right side, the left side, and the lower side of the display portion in the top view, or may be provided to surround the four sides of the display portion. The number of connection portions 140 may be one or more.

FIG. 25B is a cross-sectional view taken along the dashed-dotted lines X1-X2, Y3-Y4, and Y1-Y2 in FIG. 25A.

As illustrated in FIG. 25B, in the display apparatus 100F, a light-emitting device 130a, a light-emitting device 130b, a light-emitting device 130c, a light-receiving device 150d (see FIG. 29B), and a light-receiving device 150e are provided over a layer 101 including transistors, and a protective layer 131 is provided to cover the light-emitting devices and the light-receiving devices. A substrate 120 is bonded to the protective layer 131 with a resin layer 119.

The layer 101 including transistors can employ a stacked-layer structure in which a plurality of transistors are provided over a substrate and an insulating layer is provided to cover these transistors, for example. Structure examples of the layer 101 including transistors will be described later in Embodiment 4.

The light-emitting devices 130a, 130b, and 130c emit light of different colors. The light-emitting devices 130a, 130b, and 130c preferably emit light of three colors, red (R), green (G), and blue (B), for example.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode is described below as an example.

The light-emitting device 130a includes a pixel electrode 111a over the layer 101 including transistors, a first layer 113a over the pixel electrode 111a, a sixth layer 114 over the first layer 113a, and a common electrode 115 over the sixth layer 114. In the light-emitting device 130a, the first layer 113a and the sixth layer 114 can be collectively referred to as an EL layer.

The first layer 113a includes a first hole-injection layer 181a over the pixel electrode 111a, a first hole-transport layer 182a over the first hole-injection layer 181a, a first light-emitting layer 183a over the first hole-transport layer 182a, and a first electron-transport layer 184a over the first light-emitting layer 183a.

The sixth layer 114 includes an electron-injection layer, for example. Alternatively, the sixth layer 114 may include a stack of an electron-transport layer and an electron-injection layer.

The light-emitting device 130b includes a pixel electrode 111b over the layer 101 including transistors, a second layer 113b over the pixel electrode 111b, the sixth layer 114 over the second layer 113b, and the common electrode 115 over the sixth layer 114. In the light-emitting device 130b, the second layer 113b and the sixth layer 114 can be collectively referred to as an EL layer.

The second layer 113b includes a second hole-injection layer 181b over the pixel electrode 111b, a second hole-transport layer 182b over the second hole-injection layer 181b, a second light-emitting layer 183b over the second hole-transport layer 182b, and a second electron-transport layer 184b over the second light-emitting layer 183b.

The light-emitting device 130c includes a pixel electrode 111c over the layer 101 including transistors, a third layer 113c over the pixel electrode 111c, the sixth layer 114 over the third layer 113c, and the common electrode 115 over the sixth layer 114. In the light-emitting device 130c, the third layer 113c and the sixth layer 114 can be collectively referred to as an EL layer.

The third layer 113c includes a third hole-injection layer 181c over the pixel electrode 111c, a third hole-transport layer 182c over the third hole-injection layer 181c, a third light-emitting layer 183c over the third hole-transport layer 182c, and a third electron-transport layer 184c over the third light-emitting layer 183c.

The light-emitting devices 130a, 130b, and 130c emit light of different colors. The light-emitting devices 130a, 130b, and 130c preferably emit light of three colors, red (R), green (G), and blue (B), for example.

The light-receiving device includes an active layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. In other words, when the light-receiving device is driven by application of reverse bias between the pixel electrode and the common electrode, light entering the light-receiving device can be sensed and electric charge can be generated and extracted as current.

The light-receiving device 150d (see FIG. 28C and FIG. 29B) includes a pixel electrode 111d over the layer 101 including transistors, a fourth layer 113d over the pixel electrode 111d, the sixth layer 114 over the fourth layer 113d, and the common electrode 115 over the sixth layer 114.

The fourth layer 113d includes a fourth hole-transport layer 182d over the pixel electrode 111d, a first active layer 185d over the fourth hole-transport layer 182d, and a fourth electron-transport layer 184d over the first active layer 185d.

The sixth layer 114 is shared by the light-emitting devices and the light-receiving devices. The sixth layer 114 includes, for example, the electron-injection layer, as described above. Alternatively, the sixth layer 114 may include a stack of an electron-transport layer and an electron-injection layer.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The light-receiving device 150e includes a pixel electrode 111e over the layer 101 including transistors, a fifth layer 113e over the pixel electrode 111e, the sixth layer 114 over the fifth layer 113e, and the common electrode 115 over the sixth layer 114.

The fifth layer 113e includes a fifth hole-transport layer 182e over the pixel electrode 111e, a second active layer 185e over the fifth hole-transport layer 182e, and a fifth electron-transport layer 184e over the second active layer 185e.

The common electrode 115 is electrically connected to a conductive layer 123 provided in the connection portion 140. Thus, the same potential is supplied to the common electrode 115 included in the light-emitting devices of the respective colors.

A conductive film that transmits visible light and infrared light is used as the electrode through which light is extracted, which is either the pixel electrode or the common electrode. A conductive film that reflects visible light and infrared light is preferably used as the electrode through which light is not extracted.

As a material that forms the pair of electrodes (the pixel electrode and the common electrode) of the light-emitting device and the light-receiving device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr), a rare earth metal such as europium (Eu) or ytterbium (Yb), an alloy containing an appropriate combination of any of these elements, graphene, or the like.

The light-emitting device and the light-receiving device preferably employ a microcavity structure. Therefore, one of the pair of electrodes of each of the light-emitting device and the light-receiving device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified. When the light-receiving device has a microcavity structure, light received by the active layer can be resonated between the electrodes, whereby the light can be intensified and the sensing accuracy of the light-receiving device can be increased.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. The near-infrared light (light at wavelengths greater than or equal to 750 nm and less than or equal to 1300 nm) transmittance and reflectivity of these electrodes preferably satisfy the above-described numerical ranges of the visible light transmittance and reflectivity.

The first layer 113a, the second layer 113b, and the third layer 113c each include a light-emitting layer. The first layer 113a, the second layer 113b, and the third layer 113c preferably include light-emitting layers that emit light of different colors.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a thermally activated delayed fluorescence (TADF) material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113a, the second layer 113b, and the third layer 113c may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

The sixth layer 114 can include one or more of a hole-injection layer, a hole-transport layer, a hole-blocking layer, an electron-blocking layer, an electron-transport layer, and an electron-injection layer. For example, in the case where the pixel electrodes 111a, 111b, and 111c each function as an anode and the common electrode 115 functions as a cathode, the sixth layer 114 preferably includes an electron-injection layer.

The hole-injection layer is a layer injecting holes from an anode to a hole-transport layer, and a layer containing a material with a high hole-injection property. Examples of a material with a high hole-injection property include a composite material containing a hole-transport material (e.g., an aromatic amine compound) and an acceptor material (electron-accepting material).

In the light-emitting device, the hole-transport layer transports holes injected from the anode by the hole-injection layer, to the light-emitting layer. In the light-receiving device, the hole-transport layer transports holes generated in the active layer on the basis of incident light, to the anode. The hole-transport layer contains a hole-transport material. The hole-transport material preferably has a hole mobility of $1\times10^{-6}$ cm$^2$/Vs or higher. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

In the light-emitting device, the electron-transport layer transports electrons injected from the cathode by the electron-injection layer, to the light-emitting layer. In the light-receiving device, the electron-transport layer transports electrons generated in the active layer on the basis of incident light, to the cathode. The electron-transport layer contains an electron-transport material. The electron-transport material preferably has an electron mobility of $1\times10^{-6}$ cm$^2$/Vs or higher. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a n-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate can be used.

Alternatively, for the electron-injection layer, an electron-transport material may be used. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a: 2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The fourth layer 113$d$ and the fifth layer 113$e$ each include an active layer. The fourth layer 113$d$ and the fifth layer 113$e$ may include active layers having the same structure or active layers having different structures. For example, with the light-receiving devices having a microcavity structure, the fourth layer 113$d$ and the fifth layer 113$e$ can sense light with different wavelengths even when the active layers have the same structure. Note that the microcavity structures can be formed by making the thicknesses of the pixel electrodes or the thicknesses of optical adjustment layers different between the light-receiving devices 150$d$ and 150$e$. In this case, the fourth layer 113$d$ and the fifth layer 113$e$ can have the same structure in some cases.

The first active layer 185$d$ and the second active layer 185$e$ each contain a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid electric charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-C71-butyric acid methyl ester (abbreviation: PC70BM), [6,6]-phenyl-C61-butyric acid methyl ester (abbreviation: PC60BM), and 1',1'',4',4''-tetrahydro-di[1,4]methanonaphthaleno[1,2:2',3',56,60:2'',3''][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, each of the fourth layer 113d and the fifth layer 113e may further include a layer containing any of a substance with a high hole-transport property, a substance with a high electron-transport property, a substance with a bipolar property (a substance with a high electron-transport property and a high hole-transport property), and the like. Each of the fourth layer 113d and the fifth layer 113e may include a variety of functional layers that can be used in the first layer 113a, the second layer 113b, and the third layer 113c.

Either a low molecular compound or a high molecular compound can be used in the light-receiving device, and an inorganic compound may also be contained. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The protective layer 131 is preferably provided over the light-emitting devices 130a, 130b, and 130c and the light-receiving devices 150d and 150e. Providing the protective layer 131 can improve the reliability of the light-emitting devices and the light-receiving devices.

There is no limitation on the conductivity of the protective layer 131. As the protective layer 131, at least one type of insulating films, semiconductor films, and conductive films can be used.

The protective layer 131 including an inorganic film can inhibit deterioration of the light-emitting devices and the light-receiving devices by preventing oxidation of the common electrode 115 and inhibiting entry of impurities (e.g., moisture and oxygen) into the light-emitting devices 130a, 130b, and 130c and the light-receiving devices 150d and 150e, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen in its composition, and nitride oxide refers to a material that contains more nitrogen than oxygen in its composition.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

End portions of the pixel electrodes 111a, 111b, and 111c are covered with an insulating layer 121.

In this specification and the like, a device formed using a metal mask or an FMM (fine metal mask, high-resolution mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made such that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of a light-emitting device having an SBS structure.

In the display apparatus of this embodiment, the distance between the light-emitting devices can be narrowed. Specifically, the distance between the light-emitting devices can be less than or equal to 1 µm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus of this embodiment includes a region where the distance between the side surface of the first layer 113a and the side surface of the second layer 113b or the distance between the side surface of the second layer 113b and the side surface of the third layer 113c is less than or equal to 1 µm, preferably less than or equal to 0.5 lam (500 nm), further preferably less than or equal to 100 nm.

Note that the distance between the light-emitting device and the light-receiving device can be set within the above range. In order to suppress leakage between the light-emitting device and the light-receiving device, the distance between the light-emitting device and the light-receiving device is preferably larger than the distance between the light-emitting devices. For example, the distance between the light-emitting device and the light-receiving device can be set to 8 µm or less, 5 µm or less, or 3 µm or less.

[Example of Method for Fabricating Display Apparatus]

Next, an example of a method for fabricating a display apparatus is described with reference to FIG. 26 to FIG. 29. FIG. 26A to FIG. 26D each illustrate a cross section along the dashed-dotted line X1-X2, a cross section along the dashed-dotted line X3-X4, and a cross section along the dashed-dotted line Y1-Y2 in FIG. 25A side by side. FIG. 27 to FIG. 29 are similar to FIG. 26.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Thin films included in the display apparatus (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display apparatus can be processed by a photolithography method or the like. Alternatively, thin films may be processed by a nanoimprinting method, a sandblasting method, a lift-off method, or the like.

Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. Light exposure may be performed by liquid immersion exposure technique. As the light used for light exposure, extreme ultraviolet (EUV) light or X-rays may also be used. Furthermore, instead of the light used for the light exposure, an electron beam can also be used. It is preferable to use extreme ultraviolet light, X-rays, or an electron beam because they can perform extremely fine processing. Note that a photomask is not needed when light exposure is performed by scanning with a beam such as an electron beam.

For etching of thin films, a dry etching method, a wet etching method, a sandblasting method, or the like can be used.

Figure 26A:
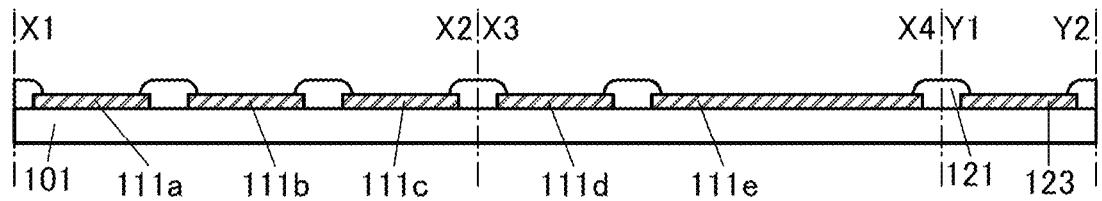
FIG. 26A to FIG. 26D are diagrams illustrating an example of a method for fabricating a display apparatus.

As illustrated in FIG. 26A, first, the pixel electrodes 111a, 111b, 111c, 111d, and 111e and the conductive layer 123 are formed over the layer 101 including transistors. The pixel electrodes are provided in the display portion, and the conductive layer 123 is provided in the connection portion 140.

Next, the insulating layer 121 that covers end portions of the pixel electrodes 111a, 111b, 111c, 111d, and 111e and end portions of the conductive layer 123 is formed. Then, as illustrated in FIG. 26B, a first hole-injection layer 181A, a first hole-transport layer 182A, a first light-emitting layer 183A, and a first electron-transport layer 184A are formed in this order over the pixel electrodes and the insulating layer 121, a first sacrificial layer 118A is formed over the first electron-transport layer 184A, and a second sacrificial layer 119A is formed over the first sacrificial layer 118A.

Figure 26B:
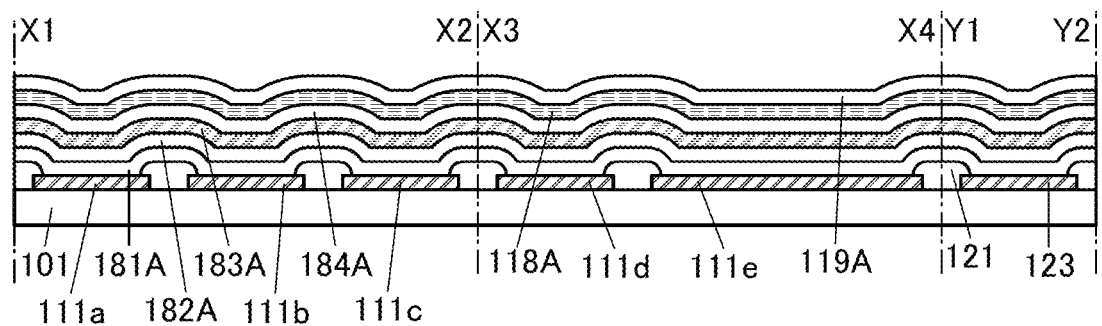

FIG. 26B illustrates an example in which, in the cross section along Y1-Y2, the first hole-injection layer 181A, the first hole-transport layer 182A, the first light-emitting layer 183A, the first electron-transport layer 184A, the first sacrificial layer 118A, and the second sacrificial layer 119A are formed over the conductive layer 123, but one embodiment of the present invention is not limited thereto.

For example, the first hole-injection layer 181A, the first hole-transport layer 182A, the first light-emitting layer 183A, the first electron-transport layer 184A, and the first sacrificial layer 118A do not necessarily overlap with the conductive layer 123. End portions of the first hole-injection layer 181A, the first hole-transport layer 182A, the first light-emitting layer 183A, and the first electron-transport layer 184A on the connection portion 140 side may be positioned closer to the inner side than end portions of the first sacrificial layer 118A and the second sacrificial layer 119A. For example, by using a mask for specifying a film formation area (also referred to as an area mask, a rough metal mask, or the like to be distinguished from a fine metal mask), the first hole-injection layer 181A, the first hole-transport layer 182A, the first light-emitting layer 183A, and the first electron-transport layer 184A can be formed in a region different from a region where the first sacrificial layer 118A and the second sacrificial layer 119A are formed. In one embodiment of the present invention, the light-emitting device is formed using a resist mask; by using a combination of a resist mask and an area mask as described above, the light-emitting device can be formed in a relatively simple process.

Materials that can be used for the pixel electrodes are as described above. For formation of the pixel electrodes, a sputtering method or a vacuum evaporation method can be used, for example.

The insulating layer 121 can have a single-layer structure or a stacked-layer structure using one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121 that covers the end portions of the pixel electrodes, impurities are less likely to enter the light-emitting devices as compared with the case where an organic insulating film is used; therefore, the reliability of the light-emitting devices can be improved. When an organic insulating film is used as the insulating layer 121 that covers the end portions of the pixel electrodes, high step coverage can be obtained as compared with the case where an inorganic insulating film is used; therefore, an influence of the shape of the pixel electrodes can be small. Therefore, a short circuit in the light-emitting devices can be prevented. Specifically, when an organic insulating film is used as the insulating layer 121, the insulating layer 121 can be processed into a tapered shape or the like. In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°.

Note that the insulating layer 121 is not necessarily provided. The aperture ratio of the subpixel can sometimes be increased without providing the insulating layer 121. Alternatively, the distance between subpixels can be shortened and the resolution or the definition of the display apparatus can sometimes be increased.

The first hole-injection layer 181A, the first hole-transport layer 182A, the first light-emitting layer 183A, and the first electron-transport layer 184A are layers to be the first hole-injection layer 181a, the first hole-transport layer 182a, the first light-emitting layer 183a, and the first electron-transport layer 184a, respectively. Thus, the above-described structures that can be used for the first hole-injection layer 181a, the first hole-transport layer 182a, the first light-emitting layer 183a, and the first electron-transport layer 184a can be used for the respective layers. Each of the first hole-injection layer 181A, the first hole-transport layer 182A, the first light-emitting layer 183A, and the first electron-transport layer 184A can be formed by a method such as an evaporation method (including a vacuum evaporation method), a transfer method, a printing method, an inkjet method, a coating method, or the like. Each of the first hole-injection layer 181A, the first hole-transport layer 182A, the first light-emitting layer 183A, and the first electron-transport layer 184A may be formed using a premix material. Note that in this specification and the like, a premix material is a composite material in which a plurality of materials are combined or mixed in advance.

Although this embodiment shows an example in which the sacrificial layer has a two-layer structure of the first sacrificial layer and the second sacrificial layer, the sacrificial layer may have a single-layer structure or a stacked-layer structure of three or more layers. The sacrificial layer is formed using a film highly resistant to the processing conditions of the first hole-injection layer 181A, the first hole-transport layer 182A, the first light-emitting layer 183A, the first electron-transport layer 184A, and a variety of functional layers to be formed in later steps (e.g., a hole-injection layer, a hole-transport layer, a light-emitting layer, an electron-transport layer, and an active layer), specifically, a film that has high etching selectivity.

The sacrificial layer can be formed by a sputtering method, an ALD method (a thermal ALD method and a PEALD method), or a vacuum evaporation method, for example. A formation method that causes little damage to an EL layer is preferred, and an ALD method or a vacuum evaporation method is preferred for the formation of the sacrificial layer over a sputtering method.

As the sacrificial layer, a film that can be removed by a wet etching method is preferably used. The use of a wet etching method can reduce damage to the first hole-injection layer 181A, the first hole-transport layer 182A, the first light-emitting layer 183A, and the first electron-transport layer 184A in processing of the sacrificial layer, compared to the case of using a dry etching method.

In the method for fabricating the display apparatus of this embodiment, it is preferred that the functional layers (e.g., the hole-injection layer, the hole-transport layer, the light-emitting layer, the active layer, the electron-transport layer, and the like) included in the light-emitting device and the light-receiving device not be easily processed in the steps of processing the sacrificial layers, and that the sacrificial layers not be easily processed in the steps of processing the functional layers. In consideration of the above, the materials and a processing method for the sacrificial layers and processing methods for the functional layers are preferably selected.

The sacrificial layers can each be formed using an inorganic film such as a metal film, an alloy film, a metal oxide film, a semiconductor film, or an inorganic insulating film, for example.

For the sacrificial layers, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used.

For the sacrificial layers, a metal oxide such as In—Ga—Zn oxide can be used. As the sacrificial layer, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. Specifically, M is preferably one or more of gallium, aluminum, and yttrium.

As the sacrificial layers, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layers. As the sacrificial layers, an aluminum oxide film can be formed by an ALD method, for example. The use of an ALD method is preferable, in which case damage to a base (especially, the EL layer or the like) can be reduced.

For example, the sacrificial layers can have a stacked-layer structure of an In—Ga—Zn oxide film formed by a sputtering method and an aluminum oxide film formed by an ALD method over the In—Ga—Zn oxide film. Alternatively, the sacrificial layers can have a stacked-layer structure of an aluminum oxide film formed by an ALD method and an In—Ga—Zn oxide film formed by a sputtering method over the aluminum oxide film. Further alternatively, the sacrificial layers can have a single-layer structure of an aluminum oxide film formed by an ALD method.

Figure 26C:
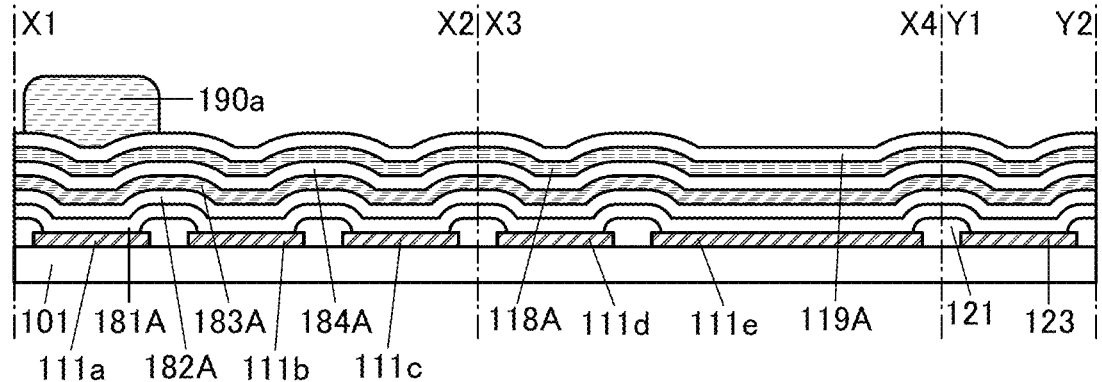

Next, a resist mask 190*a* is formed over the second sacrificial layer 119A as illustrated in FIG. 26C. The resist mask can be formed by application of a photosensitive resin (photoresist), light exposure, and development. The resist mask 190*a* is provided at a position overlapping with the pixel electrode 111*a*. It is preferable that the resist mask 190*a* not overlap with the pixel electrodes 111*b*, 111*c*, 111*d*, and 111*e* and the conductive layer 123. In the case where the resist mask 190*a* overlaps with the pixel electrode 111*b*, 111*c*, 111*d*, or 111*e* or the conductive layer 123, the insulating layer 121 is preferably positioned therebetween.

Figure 26D:
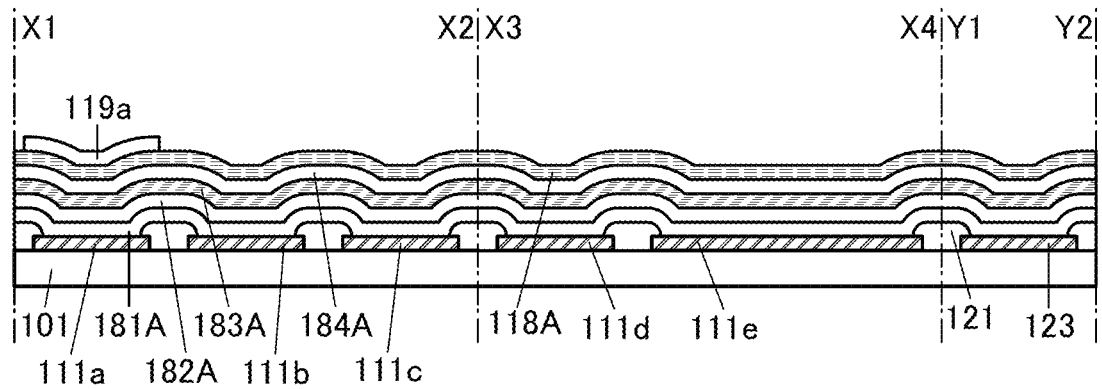

Then, as illustrated in FIG. 26D, part of the second sacrificial layer 119A is removed with the use of the resist mask 190*a*. Thus, a region of the second sacrificial layer 119A that does not overlap with the resist mask 190*a* can be removed. As a result, the second sacrificial layer 119*a* remains at a position overlapping with the pixel electrode 111*a*. After that, the resist mask 190*a* is removed.

Figure 27A:
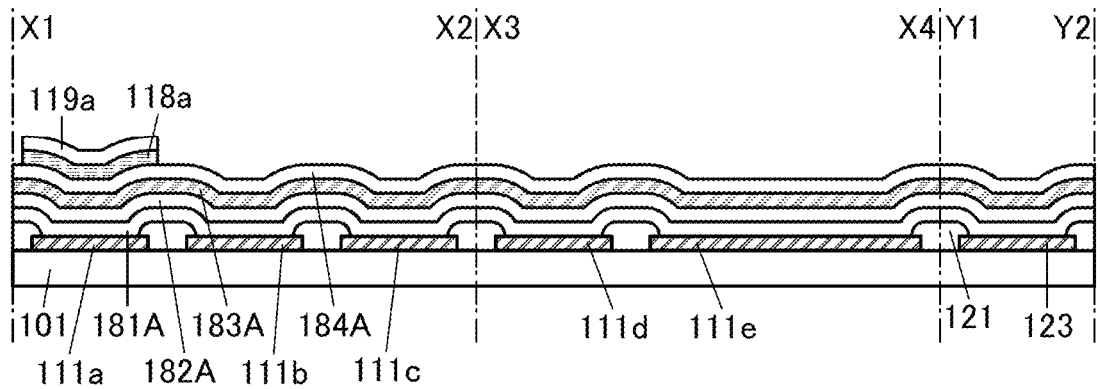
FIG. 27A to FIG. 27C are diagrams illustrating an example of a method for fabricating a display apparatus.

Next, as illustrated in FIG. 27A, part of the first sacrificial layer 118A is removed with the use of the second sacrificial layer 119*a*. Thus, a region of the first sacrificial layer 118A that does not overlap with the second sacrificial layer 119*a* can be removed. As a result, a stacked-layer structure of the first sacrificial layer 118*a* and the second sacrificial layer 119*a* remains at a position overlapping with the pixel electrode 111*a*.

Figure 27B:
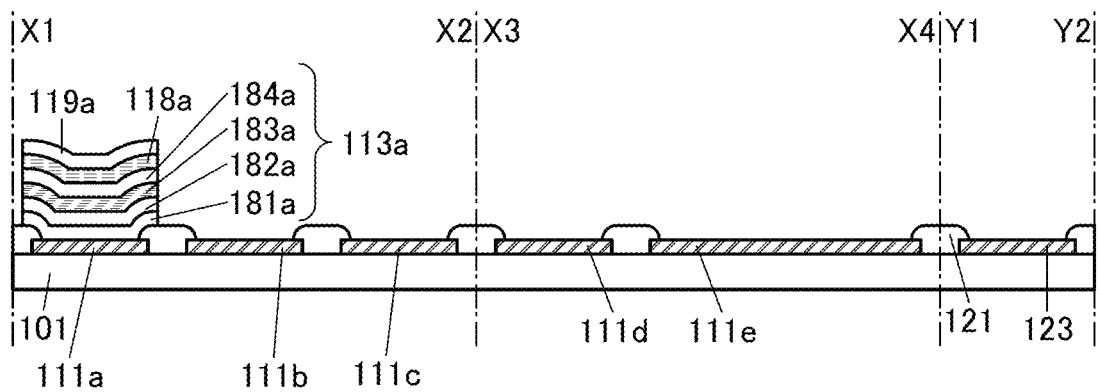

Next, as illustrated in FIG. 27B, part of the first hole-injection layer 181A, part of the first hole-transport layer 182A, part of the first light-emitting layer 183A, and part of the first electron-transport layer 184A are removed with the use of the first sacrificial layer 118*a* and the second sacrificial layer 119*a*. Thus, regions of the first hole-injection layer 181A, the first hole-transport layer 182A, the first light-emitting layer 183A, and the first electron-transport layer 184A that do not overlap with the first sacrificial layer 118*a* and the second sacrificial layer 119*a* can be removed. As a result, the pixel electrodes 111*b*, 111*c*, 111*d*, and 111*e* and the conductive layer 123 are exposed. Moreover, a stacked-layer structure of the first hole-injection layer 181*a*, the first hole-transport layer 182*a*, the first light-emitting layer 183*a*, the first electron-transport layer 184*a*, the first sacrificial layer 118*a*, and the second sacrificial layer 119*a* remains over the pixel electrode 111*a*. Note that the stacked-layer structure of the first hole-injection layer 181*a*, the first hole-transport layer 182*a*, the first light-emitting layer 183*a*, and the first electron-transport layer 184*a* is also referred to as the first layer 113*a*.

The first sacrificial layer 118A and the second sacrificial layer 119A can each be processed by a wet etching method or a dry etching method. The first sacrificial layer 118A and the second sacrificial layer 119A are preferably processed by anisotropic etching.

The use of a wet etching method can reduce damage to the first hole-injection layer 181A, the first hole-transport layer 182A, the first light-emitting layer 183A, and the first electron-transport layer 184A in processing of the sacrificial layer, compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method in which a gas containing no oxygen is used as an etching gas, the first hole-injection layer 181A, the first hole-transport layer 182A, the first light-emitting layer 183A, and the first electron-transport layer 184A can be inhibited from deteriorating. In the case of using a dry etching method, it is preferable to use $CF_4$, $C_4F_8$, $SF_6$, $CHF_3$, $Cl_2$, $H_2O$, $BCl_3$, or a gas containing a noble gas (also referred to as rare gas) such as He as the etching gas, for example.

When the sacrificial layer has a stacked-layer structure, after some of the layers are processed with the use of the resist mask 190*a* and the resist mask 190*a* is removed, the rest of the layers can be processed with the use of some of the layers as a hard mask.

For example, after the second sacrificial layer 119A is processed with the use of the resist mask 190*a*, the resist mask 190*a* is removed by ashing using oxygen plasma. At this time, the first sacrificial layer 118A is positioned on the outermost surface and the first hole-injection layer 181A, the first hole-transport layer 182A, the first light-emitting layer 183A, and the first electron-transport layer 184A are not exposed; thus, the first hole-injection layer 181A, the first hole-transport layer 182A, the first light-emitting layer 183A, and the first electron-transport layer 184A can be inhibited from being damaged in the step of removing the resist mask 190*a*. Then, the first sacrificial layer 118A can be processed with the use of the second sacrificial layer 119*a* as a hard mask and the first hole-injection layer 181A, the first hole-transport layer 182A, the first light-emitting layer 183A, and the first electron-transport layer 184A can be processed with the use of the first sacrificial layer 118*a* and the second sacrificial layer 119*a* as a hard mask.

The first hole-injection layer 181A, the first hole-transport layer 182A, the first light-emitting layer 183A, and the first electron-transport layer 184A are preferably processed by anisotropic etching. Anisotropic dry etching is particularly preferable. As an etching gas, a gas containing nitrogen, a gas containing hydrogen, a gas containing a noble gas, a gas containing nitrogen and argon, a gas containing nitrogen and hydrogen, or the like is preferably used. Since a gas containing oxygen is not used as the etching gas, the first hole-injection layer 181A, the first hole-transport layer 182A, the first light-emitting layer 183A, and the first electron-transport layer 184A can be inhibited from deteriorating.

Figure 27C:
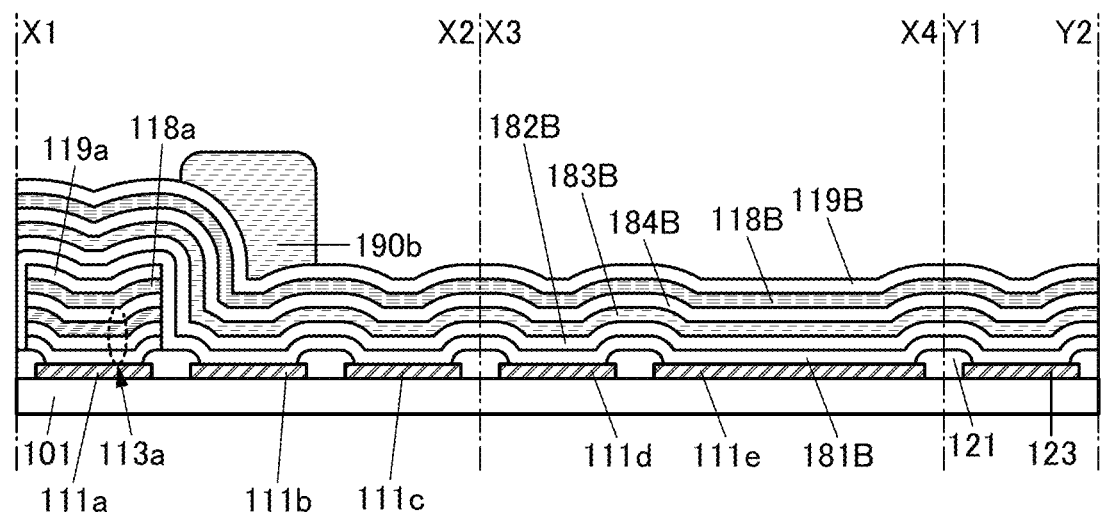

Next, as illustrated in FIG. 27C, a second hole-injection layer 181B, a second hole-transport layer 182B, a second light-emitting layer 183B, and a second electron-transport layer 184B are formed in this order over the second sacrificial layer 119*a*, the pixel electrodes 111*b*, 111*c*, 111*d*, and 111*e*, and the insulating layer 121, a first sacrificial layer 118B is formed over the second electron-transport layer 184B, and a second sacrificial layer 119B is formed over the first sacrificial layer 118B.

The second hole-injection layer 181B, the second hole-transport layer 182B, the second light-emitting layer 183B, and the second electron-transport layer 184B are layers to be the second hole-injection layer 181*b*, the second hole-transport layer 182*b*, the second light-emitting layer 183*b*, and the second electron-transport layer 184*b*, respectively. The second light-emitting layer 183*b* emits light of a color that differs from the color of the light emitted from the first light-emitting layer 183*a*. Structures, materials, and the like that can be used for the second hole-injection layer 181*b*, the second hole-transport layer 182*b*, the second light-emitting layer 183*b*, and the second electron-transport layer 184*b* are similar to those for the first hole-injection layer 181*a*, the first hole-transport layer 182*a*, the first light-emitting layer 183*a*, and the first electron-transport layer 184*a*. The second hole-transport layer 182B, the second light-emitting layer 183B, and the second electron-transport layer 184B can be formed by methods similar to those for the first hole-injection layer 181A, the first hole-transport layer 182A, the first light-emitting layer 183A, and the first electron-transport layer 184A, respectively.

The first sacrificial layer 118B and the second sacrificial layer 119B can be formed using materials that can be used for the first sacrificial layer 118A and the second sacrificial layer 119A.

Next, a resist mask 190*b* is formed over the first sacrificial layer 118B as illustrated in FIG. 27C. The resist mask 190*b* is provided at a position overlapping with the pixel electrode 111*b*.

Figure 28A:
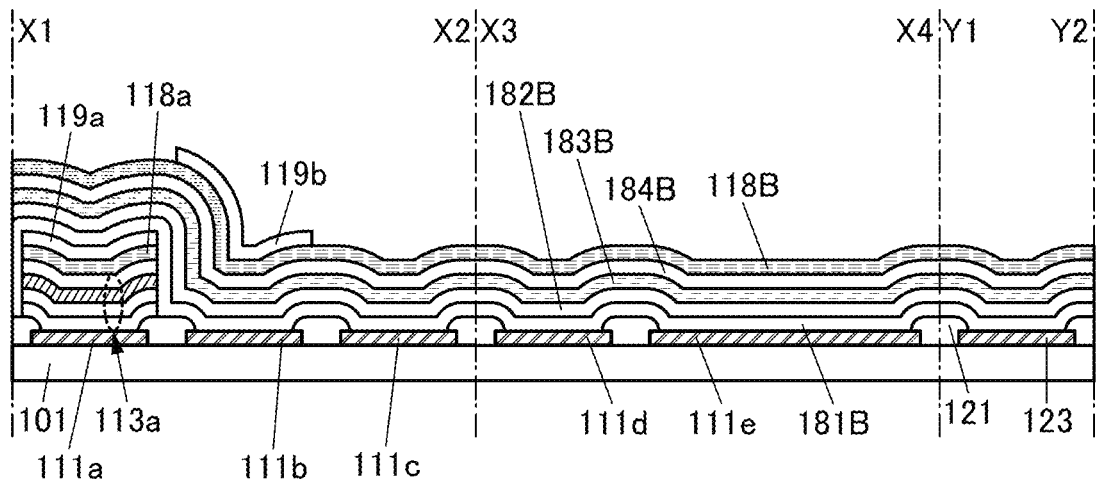
FIG. 28A to FIG. 28C are diagrams illustrating an example of a method for fabricating a display apparatus.

Next, part of the second sacrificial layer 119B is removed with the use of the resist mask 190*b*. Thus, a region of the second sacrificial layer 119B that does not overlap with the resist mask 190*b* can be removed. As a result, the second sacrificial layer 119*b* remains at a position overlapping with the pixel electrode 111*b*. After that, the resist mask 190*b* is removed as illustrated in FIG. 28A.

Figure 28B:
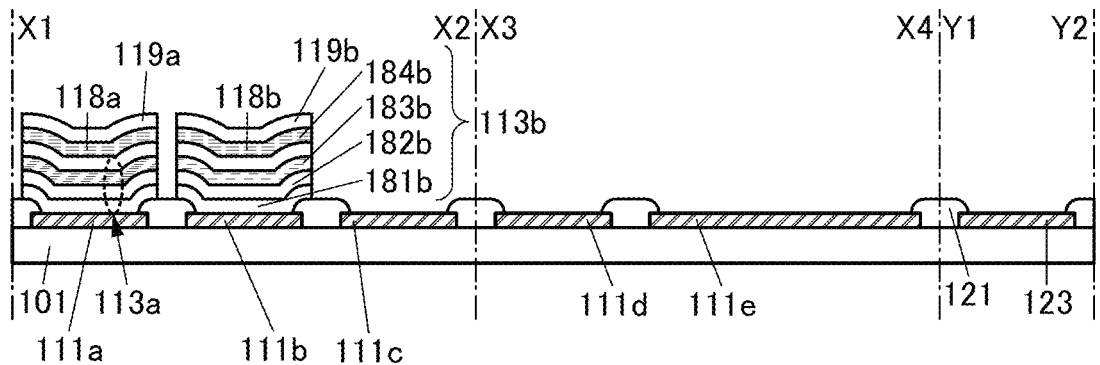

Next, the first sacrificial layer 118B is processed with the use of the second sacrificial layer 119*b* as a hard mask, whereby the first sacrificial layer 118*b* is formed. Then, as illustrated in FIG. 28B, the second hole-injection layer 181B, the second hole-transport layer 182B, the second light-emitting layer 183B, and the second electron-transport layer 184B are processed with the use of the first sacrificial layer 118*b* and the second sacrificial layer 119*b* as a hard mask, whereby the second hole-injection layer 181*b*, the second hole-transport layer 182*b*, the second light-emitting layer 183*b*, and the second electron-transport layer 184*b* are formed. Note that the stacked-layer structure of the second hole-injection layer 181*b*, the second hole-transport layer 182*b*, the second light-emitting layer 183*b*, and the second electron-transport layer 184*b* is also referred to as the second layer 113*b*.

The first sacrificial layer 118B and the second sacrificial layer 119B can be processed by methods that can be used for processing the first sacrificial layer 118A and the second sacrificial layer 119A. The second hole-injection layer 181B, the second hole-transport layer 182B, the second light-emitting layer 183B, and the second electron-transport layer 184B can be processed by methods that can be used for processing the first hole-injection layer 181A, the first hole-transport layer 182A, the first light-emitting layer 183A, and the first electron-transport layer 184A. The resist mask 190b can be removed by a method and at a timing which can be applied for the removal of the resist mask 190a.

In a similar manner, a stacked-layer structure of the third layer 113c, a first sacrificial layer 118c, and a second sacrificial layer 119c is formed over the pixel electrode 111c, a stacked-layer structure of the fourth layer 113d, a first sacrificial layer 118d, and a second sacrificial layer 119d is formed over the pixel electrode 111d, and a stacked-layer structure of the fifth layer 113e, a first sacrificial layer 118e, and a second sacrificial layer 119e is formed over the pixel electrode 111e. Note that an example in which the fourth layer 113d and the fifth layer 113e have different structures is described in this embodiment. In the case where the fourth layer 113d and the fifth layer 113e have the same structure, these layers can be formed in the same step.

Figure 28C:
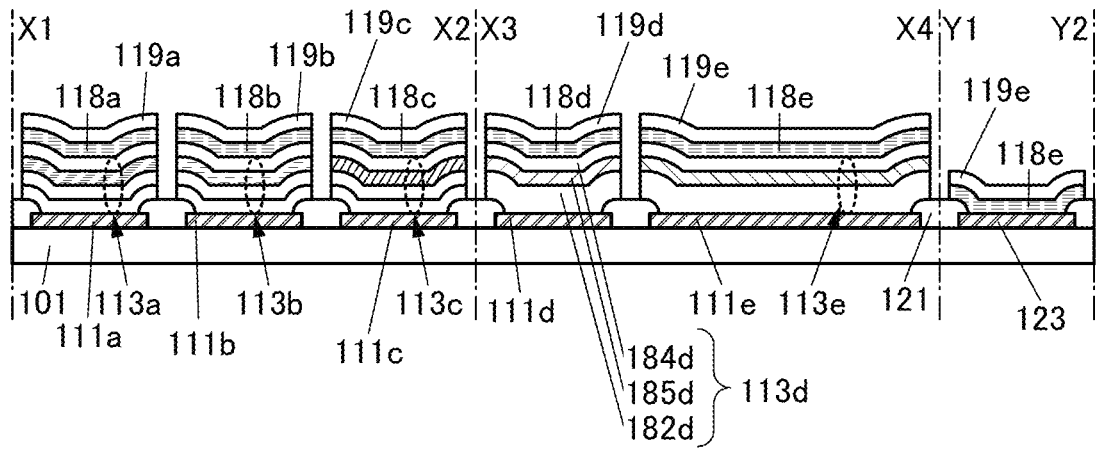

A resist mask provided for forming the fifth layer 113e is preferably provided to overlap also with the conductive layer 123. Thus, a stacked-layer structure of the first sacrificial layer 118e and the second sacrificial layer 119e remains over the conductive layer 123 as illustrated in FIG. 28C. Such a structure is preferable because the conductive layer 123 can be inhibited from being damaged in the next step of removing the first sacrificial layer and the second sacrificial layer.

Figure 29A:
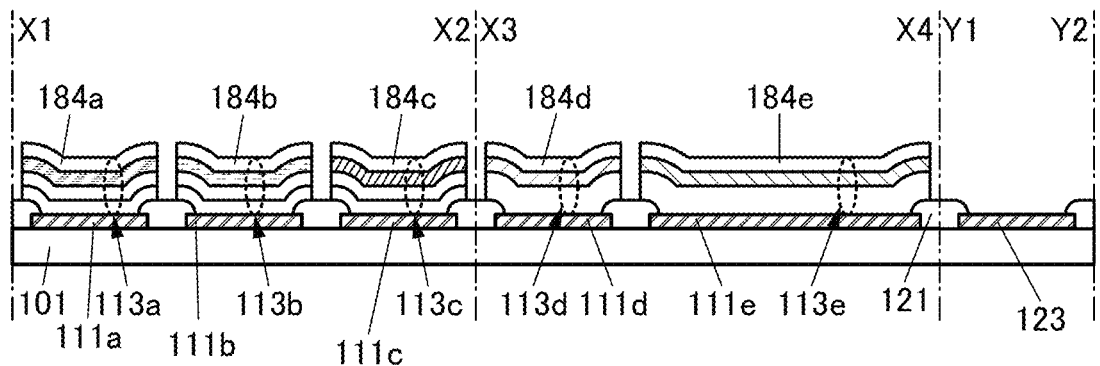
FIG. 29A to FIG. 29C are diagrams illustrating an example of a method for fabricating a display apparatus.

Next, the first sacrificial layers 118a, 118b, 118c, 118d, and 118e and the second sacrificial layers 119a, 119b, 119c, 119d, and 119e are removed as illustrated in FIG. 29A. Thus, the first electron-transport layer 184a is exposed over the pixel electrode 111a, the second electron-transport layer 184b is exposed over the pixel electrode 111b, the third electron-transport layer 184c is exposed over the pixel electrode 111c, the fourth electron-transport layer 184d is exposed over the pixel electrode 111d, the fifth electron-transport layer 184e is exposed over the pixel electrode 111e, and the conductive layer 123 is exposed in the connection portion 140.

The step of removing the sacrificial layers can be performed by a method similar to that for the step of processing the sacrificial layers. In particular, the use of a wet etching method can reduce damage to the first layer 113a, the second layer 113b, the third layer 113c, the fourth layer 113d, and the fifth layer 113e at the time of removing the sacrificial layers, as compared to the case of using a dry etching method.

Figure 29B:
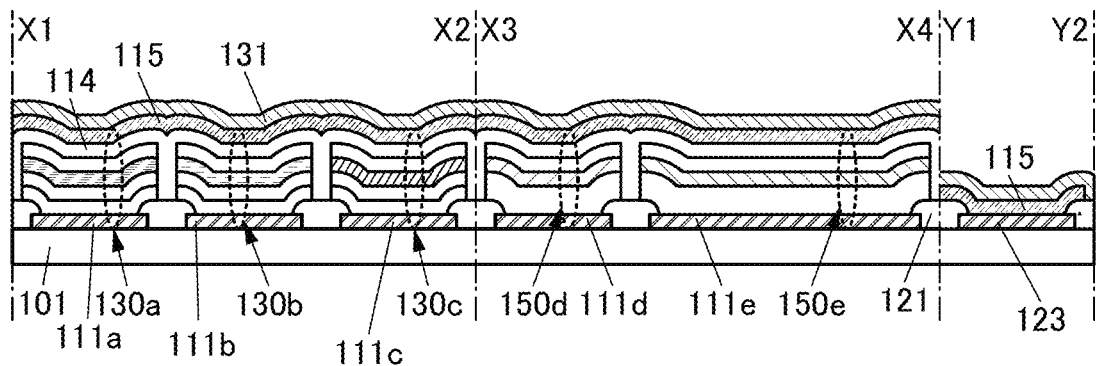

Next, as illustrated in FIG. 29B, the sixth layer 114 is formed to cover the first layer 113a, the second layer 113b, the third layer 113c, the fourth layer 113d, the fifth layer 113e, and the insulating layer 121, and the common electrode 115 is formed over the sixth layer 114, the insulating layer 121, and the conductive layer 123.

Materials that can be used for the sixth layer 114 are as described above. Layers included in the sixth layer 114 can each be formed by a method such as an evaporation method (including a vacuum evaporation method), a transfer method, a printing method, an inkjet method, or a coating method. The layers included in the sixth layer 114 may be formed using a premix material. Note that the sixth layer 114 is not necessarily provided when not needed.

Materials that can be used for the common electrode 115 are as described above. For formation of the common electrode 115, a sputtering method or a vacuum evaporation method can be used, for example.

Then, as illustrated in FIG. 29B, the protective layer 131 is formed over the common electrode 115.

Materials that can be used for the protective layer 131 are as described above. Examples of methods for forming the protective layer 131 include a vacuum evaporation method, a sputtering method, a CVD method, and an ALD method. The protective layer 131 may have a single-layer structure or a stacked-layer structure. For example, the protective layer 131 may have a stacked-layer structure of two layers formed by different formation methods.

Figure 29C:
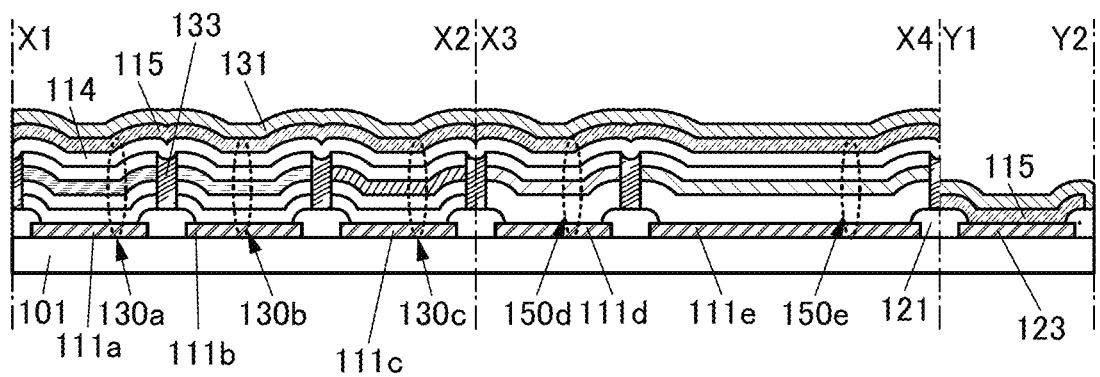

Note that FIG. 29B illustrates an example in which the sixth layer 114 is also formed in a region between the first layer 113a and the second layer 113b, for example; however, as illustrated in FIG. 29C, a space 133 may be formed in the region.

The space 133 contains, for example, any one or more selected from air, nitrogen, oxygen, carbon dioxide, and Group 18 elements (typically, helium, neon, argon, xenon, and krypton).

In the case where the refractive index of the space 133 is lower than the refractive index of the sixth layer 114, light emitted from the light-emitting device is reflected by the interface between the sixth layer 114 and the space 133. Thus, light emitted from the light-emitting device can be inhibited from entering an adjacent pixel (or subpixel). With the structure, mixture of light of different colors can be inhibited, so that the display quality of the display apparatus can be improved.

Then, the substrate 120 is bonded to the protective layer 131 with the resin layer 119, whereby the display apparatus 100F illustrated in FIG. 25B can be fabricated.

As described above, in the method for fabricating the display apparatus of one embodiment of the present invention, an island-shaped EL layer is formed by processing an EL layer formed on the entire surface, not by a pattern of a metal mask; thus, the island-shaped EL layer can have a uniform thickness. In addition, a high-resolution display apparatus or a display apparatus with a high aperture ratio, which has been difficult to achieve, can be fabricated. Moreover, a high-resolution display apparatus or a display apparatus with a high aperture ratio, which incorporates a light-receiving device and has a function of sensing light, can be fabricated.

The first layer, the second layer, and the third layer included in the light-emitting devices of different colors are formed in separate steps. Accordingly, the respective EL layers can be formed to have structures (a material, thickness, and the like) appropriate for the light-emitting devices of different colors. Thus, the light-emitting devices can have excellent characteristics.

[Structure Example 2 of Display Apparatus]

Figure 30A:
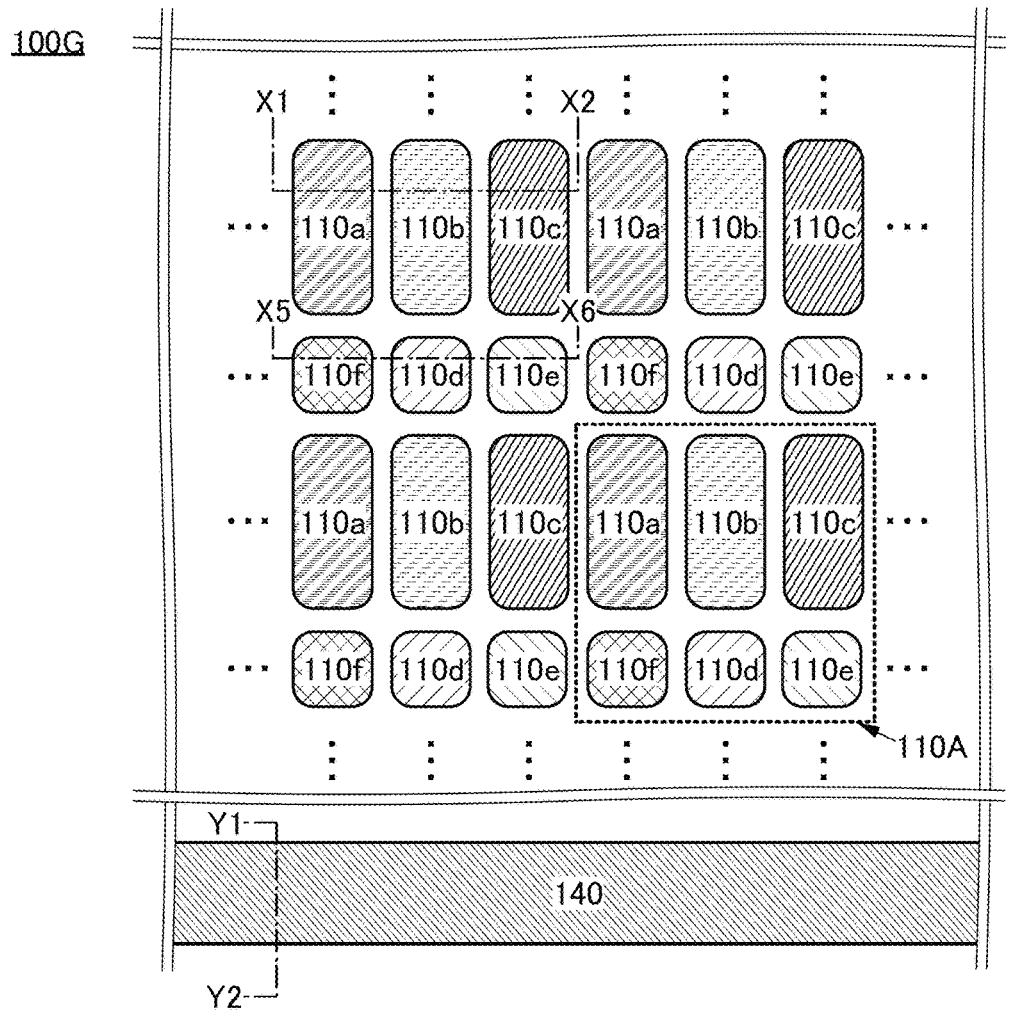
FIG. 30A is a top view illustrating an example of a display apparatus.
Figure 30B:
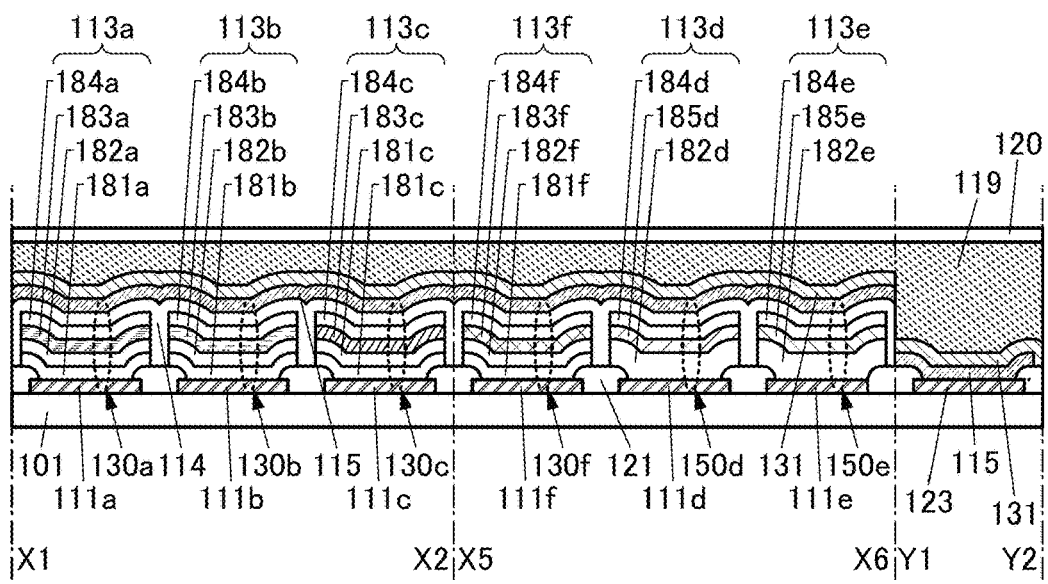
FIG. 30B is a cross-sectional view illustrating an example of the display apparatus.

FIG. 30A and FIG. 30B illustrate an example different from the display apparatus 100F illustrated in FIG. 25A and FIG. 25B.

A display apparatus 100G illustrated in FIG. 30A includes a display portion in which a plurality of pixels 110A are arranged in a matrix, and the connection portion 140 outside the display portion. One pixel 110A consists of six subpixels of the subpixel 110a, the subpixel 110b, the subpixel 110c, the subpixel 110d, the subpixel 110e, and a subpixel 110f.

FIG. 30A illustrates an example in which the subpixels are provided in two rows and three columns in one pixel 110A. The pixel 110A includes three subpixels (the subpixel 110a, the subpixel 110b, and the subpixel 110c) in the upper row (first row) and three subpixels (the subpixel 110d, the subpixel 110e, and the subpixel 110f) in the lower row (second row). In other words, the pixel 110A includes two subpixels (the subpixel 110a and the subpixel 110f) in the left column (first column), two subpixels (the subpixel 110b and the subpixel 110d) in the center column (second column), and two subpixels (the subpixel 110c and the subpixel 110e) in the right column (third column).

In this embodiment, an example is described in which the subpixel 110a, the subpixel 110b, the subpixel 110c, and the subpixel 110f include light-emitting devices that emit light in different wavelength ranges and the subpixels 110d and 110e include light-receiving devices that have sensitivity in different wavelength ranges. For example, the subpixel 110a, the subpixel 110b, the subpixel 110c, the subpixel 110d, the subpixel 110e, and the subpixel 110f respectively correspond to the subpixel G, the subpixel B, the subpixel R, the subpixel IR, the subpixel PS, and the subpixel IRS illustrated in FIG. 21A or the like.

FIG. 30B is a cross-sectional view taken along the dashed-dotted lines X1-X2, X5-X6, and Y1-Y2 in FIG. 30A.

As illustrated in FIG. 30B, in the display apparatus 100G, the light-emitting device 130a, the light-emitting device 130b, the light-emitting device 130c, the light-emitting device 130f, the light-receiving device 150d, and the light-receiving device 150e are provided over the layer 101 including transistors, and the protective layer 131 is provided to cover the light-emitting devices and the light-receiving devices. The substrate 120 is bonded to the protective layer 131 with the resin layer 119.

The light-emitting device 130a, the light-emitting device 130b, the light-emitting device 130c, and the light-emitting device 130f emit light in different wavelength ranges. The light-emitting device 130f preferably emits infrared (IR) light, for example.

The light-emitting device 130f includes a pixel electrode 111f over the layer 101 including transistors, a seventh layer 113f over the pixel electrode 111f, the sixth layer 114 over the seventh layer 113f, and the common electrode 115 over the sixth layer 114. In the light-emitting device 130f, the seventh layer 113f and the sixth layer 114 can be collectively referred to as an EL layer.

The seventh layer 113f includes a seventh hole-injection layer 181f over the pixel electrode 111f, a seventh hole-transport layer 182f over the seventh hole-injection layer 181f, a fourth light-emitting layer 183f over the seventh hole-transport layer 182f, and a seventh electron-transport layer 184f over the fourth light-emitting layer 183f.

The above description can be referred to for the light-emitting device 130a, the light-emitting device 130b, the light-emitting device 130c, the light-receiving device 150d, and the light-receiving device 150e; thus, the detailed description thereof is omitted.

The above description of the method for fabricating the display apparatus 100F can be referred to for a method for fabricating the display apparatus 100G; thus, the detailed description thereof is omitted. The light-emitting device 130f can be formed in a manner similar to those of the light-emitting device 130a to the light-emitting device 130c. Note that the order of forming the light-emitting device 130a, the light-emitting device 130b, the light-emitting device 130c, the light-emitting device 130f, the light-receiving device 150d, and the light-receiving device 150e is not particularly limited.

This embodiment can be combined with the other embodiments as appropriate.

Embodiment 4

In this embodiment, a display apparatus of one embodiment of the present invention will be described with reference to FIG. 31 and FIG. 32.

The display apparatus in this embodiment can be a high-definition display apparatus or large-sized display apparatus. Accordingly, the display apparatus of this embodiment can be used for display portions of a digital camera, a digital video camera, a digital photo frame, a mobile phone, a portable game machine, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Note that in this specification and the like, a structure in which a connector such as a flexible printed circuit (FPC) or a TCP (Tape Carrier Package) is attached to a display apparatus, or a structure in which an integrated circuit (IC) is mounted on a display apparatus by a COG (Chip On Glass) method, a COF (Chip On Film) method, or the like is sometimes referred to as a display panel module or a display module, or simply referred to as a display panel.

[Display Apparatus 100H]

Figure 31:
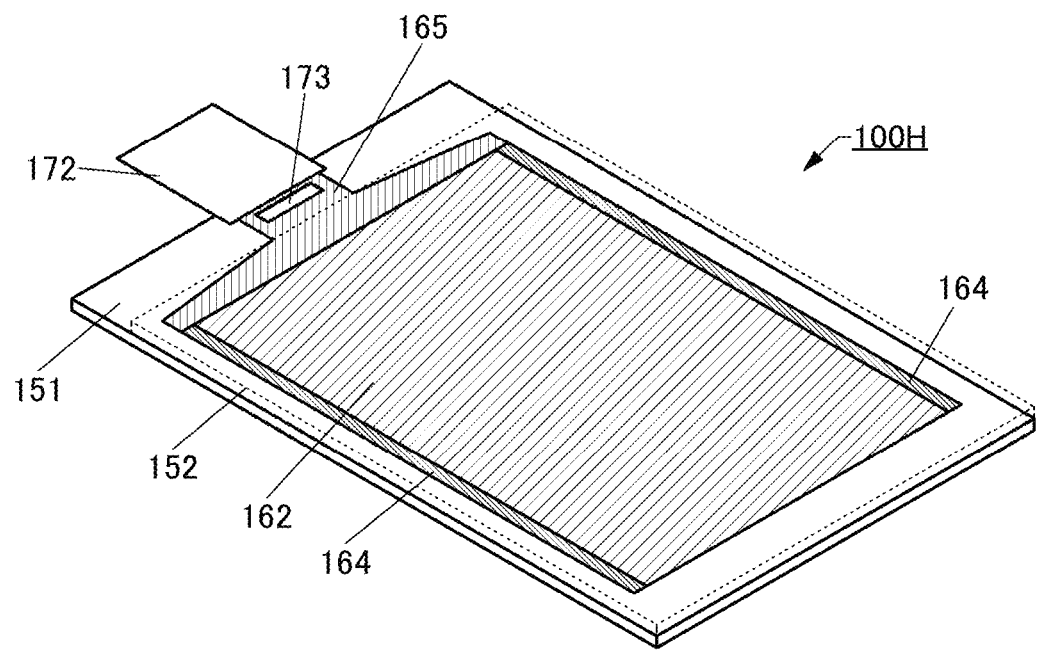
FIG. 31 is a perspective view illustrating an example of a display apparatus.

FIG. 31 is a perspective view of a display apparatus 100H, and FIG. 32A is a cross-sectional view of the display apparatus 100H.

The display apparatus 100H has a structure in which a substrate 152 and a substrate 151 are bonded to each other. In FIG. 31, the substrate 152 is denoted by a dashed line.

The display apparatus 100H includes a display portion 162, a circuit 164, a wiring 165, and the like. FIG. 31 illustrates an example in which an IC 173 and an FPC 172 are mounted on the display apparatus 100H. Thus, the structure illustrated in FIG. 31 can be regarded as a display module including the display apparatus 100H, the integrated circuit (IC), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 31 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display apparatus 100H and the display module are not necessarily provided with an IC. The IC may be mounted on the FPC by a COF method or the like.

FIG. 32A illustrates an example of cross sections of part of a region including the FPC 172, part of the circuit 164, part of the display portion 162, and part of a region including an end portion of the display apparatus 100H.

The display apparatus 100H illustrated in FIG. 32A includes a transistor 201, a transistor 205a, a transistor 205e, the light-emitting device 130a, the light-receiving device 150e, and the like between the substrate 151 and the substrate 152. The light-emitting device 130a emits red light, green light, or blue light, for example. Alternatively, the light-emitting device 130a may emit infrared light. The light-receiving device 150e senses infrared light, for example. Alternatively, the light-receiving device 150e may sense visible light or both visible light and infrared light.

In the case where a pixel of the display apparatus includes three kinds of subpixels including light-emitting devices exhibiting different colors, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 131 and the substrate 152 are bonded to each other with an adhesive layer 142. A solid sealing structure, a hollow sealing structure, or the like can be employed to seal the light-emitting devices. In FIG. 32A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. In that case, the adhesive layer 142 may be provided not to overlap with the light-emitting device. The space may be filled with a resin different from that of the frame-like adhesive layer 142.

The light-emitting device 130a has a stacked-layer structure similar to that of the light-emitting device 130a illustrated in FIG. 25B, and the light-receiving device 150e has a stacked-layer structure similar to that of the light-receiving device 150e illustrated in FIG. 25B. Embodiment 3 can be referred to for the details of the light-emitting device and the light-receiving device. End portions of the light-emitting device 130a and end portions of the light-receiving device 150e are covered with the protective layer 131.

The pixel electrodes 111a and 111e are each electrically connected to conductive layers 222b included in the transistors 205a and 205e through openings provided in an insulating layer 214.

End portions of the pixel electrodes are covered with the insulating layer 121. The pixel electrode contains a material that reflects visible light, and the common electrode contains a material that transmits visible light.

Light from the light-emitting device is emitted toward the substrate 152 side. The light-receiving device senses light entering from the substrate 152 side. Thus, for the substrate 152, a material that has high visible-light- and infrared-light-transmitting properties is preferably used.

A stacked-layer structure including the substrate 151 and the components thereover up to the insulating layer 214 corresponds to the layer 101 including transistors in Embodiment 3.

The transistor 201, the transistor 205a, and the transistor 205e are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100H. This can inhibit entry of impurities from the end portion of the display apparatus 100H through the organic insulating film. Alternatively, the organic insulating film may be formed such that its end portion is positioned on the inner side compared to the end portion of the display apparatus 100H, to prevent the organic insulating film from being exposed at the end portion of the display apparatus 100H.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 32A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100H can be increased.

Each of the transistor 201, the transistor 205a, and the transistor 205e includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure may be employed. Alternatively, gates may be provided above and below a semiconductor layer where a channel is formed.

The structure in which the semiconductor layer where a channel is formed is provided between two gates is employed for the transistor 201, the transistor 205a, and the transistor 205e. The two gates may be connected to each other and supplied with the same signal to drive the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and either of an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon and single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

FIG. 32B and FIG. 32C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 32B illustrates an example of the transistor 209 in which the insulating layer 225 covers a top surface and a side surface of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source, and the other functions as a drain.

In the transistor 210 illustrated in FIG. 32C, the insulating layer 225 overlaps with the channel formation region 231i of the semiconductor layer 231 and does not overlap with the low-resistance regions 231n. The structure illustrated in FIG. 32C is obtained by processing the insulating layer 225 with the conductive layer 223 as a mask, for example. In FIG. 32C, the insulating layer 215 is provided to cover the insulating layer 225 and the conductive layer 223, and the conductive layer 222a and the conductive layer 222b are connected to the corresponding low-resistance regions 231n through the openings in the insulating layer 215.

A connection portion 204 is provided in a region of the substrate 151 that does not overlap with the substrate 152. In the connection portion 204, the wiring 165 is electrically connected to the FPC 172 through a conductive layer 166 and a connection layer 242. An example is illustrated in which the conductive layer 166 is a conductive film obtained by processing the same conductive film as the pixel electrode. On a top surface of the connection portion 204, the conductive layer 166 is exposed. Thus, the connection portion 204 and the FPC 172 can be electrically connected to each other through the connection layer 242.

A light-blocking layer 148 is preferably provided on the surface of the substrate 152 on the substrate 151 side. A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 provided to cover the light-emitting device inhibits an impurity such as water from entering the light-emitting device. As a result, the reliability of the light-emitting device can be enhanced.

In the region 228 in the vicinity of the end portion of the display apparatus 100H, the insulating layer 215 and the protective layer 131 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display apparatus 100H can be enhanced.

For each of the substrate 151 and the substrate 152, glass, quartz, ceramics, sapphire, a resin, a metal, an alloy, a semiconductor, or the like can be used. The substrate on the side from which light from the light-emitting device is extracted is formed using a material that transmits the light. When the substrate 151 and the substrate 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

This embodiment can be combined with the other embodiments as appropriate.

Embodiment 5

In this embodiment, a light-emitting device that can be used for the display apparatus of one embodiment of the present invention will be described.

Figure 33A:
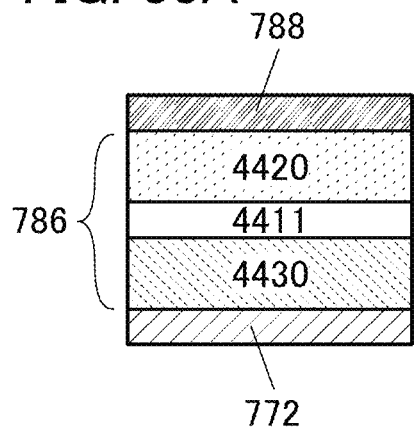
FIG. 33A to FIG. 33D are diagrams illustrating structure examples of a light-emitting device.

A light-emitting device illustrated in FIG. 33A includes an electrode 772, an EL layer 786, and an electrode 788. One of the electrode 772 and the electrode 788 functions as an anode and the other functions as a cathode. One of the electrode 772 and the electrode 788 functions as a pixel electrode and the other functions as a common electrode. One of the electrode 772 and the electrode 788, through which light is extracted, preferably has a visible-light-transmitting property, and the other preferably reflects visible light.

The EL layer 786 included in the light-emitting device can be formed of a plurality of layers such as a layer 4420, a light-emitting layer 4411, and a layer 4430, as illustrated in FIG. 33A. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can serve as a single light-emitting unit, and the structure in FIG. 33A is referred to as a single structure in this specification.

Figure 33B:
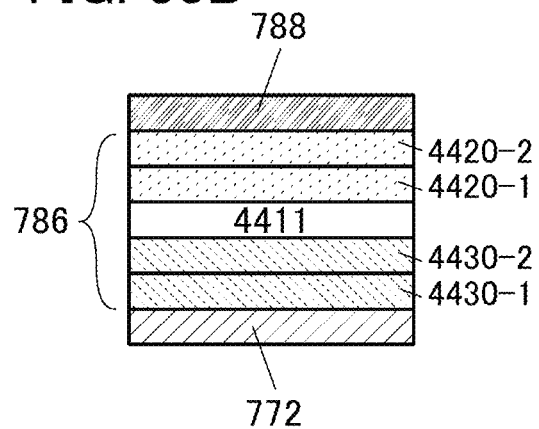

FIG. 33B is a modification example of the EL layer 786 included in the light-emitting device illustrated in FIG. 33A. Specifically, the light-emitting device illustrated in FIG. 33B includes a layer 4430-1 over the electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the electrode 788 over the layer 4420-2. For example, when the electrode 772 is an anode and the electrode 788 is a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the electrode 772 is a cathode and the electrode 788 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 33C:
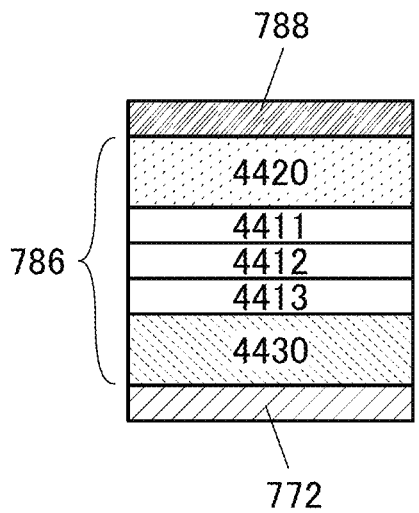

Note that a structure in which a plurality of light-emitting layers (the light-emitting layer 4411, a light-emitting layer 4412, and a light-emitting layer 4413) are provided between the layer 4420 and the layer 4430 as illustrated in FIG. 33C is a variation of the single structure.

Figure 33D:
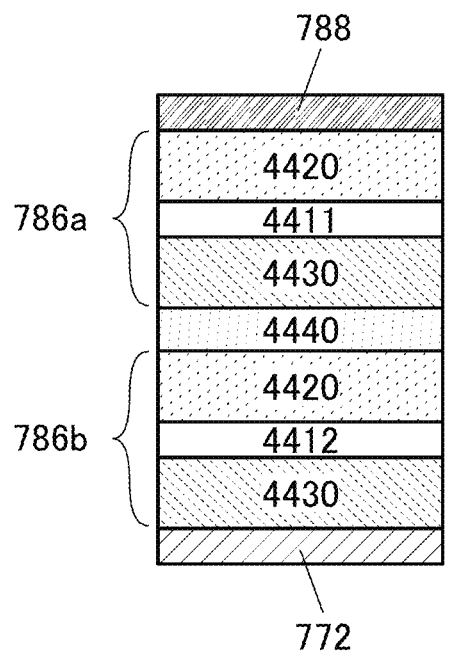

A structure in which a plurality of light-emitting units (an EL layer 786a and an EL layer 786b) are connected in series with an intermediate layer 4440 (also referred to as a charge-generation layer) therebetween as illustrated in FIG. 33D is referred to as a tandem structure in this specification. Without limitation thereto, the tandem structure may be referred to as a stack structure, for example. The tandem structure enables a light-emitting device to emit light at high luminance.

Note that also in FIG. 33C and FIG. 33D, the layer 4420 and the layer 4430 can each have a stacked-layer structure of two or more layers as illustrated in FIG. 33B.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. In the case of containing two light-emitting substances, the light-emitting substances are selected such that their emission colors are complementary. For example, when an emission color of a first light-emitting layer and an emission color of a second light-emitting layer are complementary colors, the light-emitting device can be configured to emit white light as a whole. In the case of containing three or more light-emitting substances, their emission colors are mixed to obtain white light emission. The same applies to a light-emitting device including two or more light-emitting layers. For example, when the emission colors of the light-emitting layer 4411, the light-emitting layer 4412, and the light-emitting layer 4413 illustrated in FIG. 33C are mixed, a white-light-emitting device with a single structure can be obtained.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of color spectral components of R, G, and B.

[Modification Example of Display Apparatus]

Structure examples of light-emitting devices will be described with reference to FIG. 34 to FIG. 37.

Figure 34A:
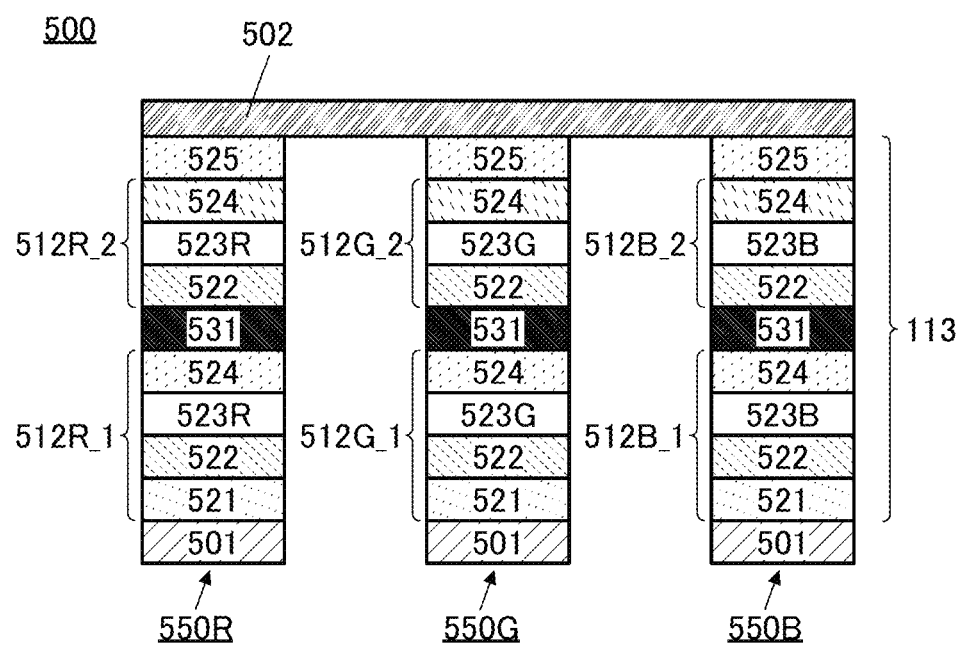
FIG. 34A and FIG. 34B are cross-sectional views illustrating examples of a display apparatus.

FIG. 34A is a schematic cross-sectional view of a display apparatus 500. The display apparatus 500 includes a light-emitting device 550R that emits red light, a light-emitting device 550G that emits green light, and a light-emitting device 550B that emits blue light. Note that the description of the light-receiving device included in the display apparatus is omitted in this embodiment.

The light-emitting device 550R has a structure in which between a pair of electrodes (an electrode 501 and an electrode 502), two light-emitting units (a light-emitting unit 512R_1 and a light-emitting unit 512R_2) are stacked with an intermediate layer 531 therebetween. Similarly, the light-emitting device 550G includes a light-emitting unit 512G_1 and a light-emitting unit 512G_2, and the light-emitting device 550B includes a light-emitting unit 512B_1 and a light-emitting unit 512B_2.

The electrode 501 functions as a pixel electrode and is provided in every light-emitting device. The electrode 502 functions as a common electrode and is shared by a plurality of light-emitting devices.

The light-emitting unit 512R_1 includes a layer 521, a layer 522, a light-emitting layer 523R, a layer 524, and the like. The light-emitting unit 512R_2 includes the layer 522, the light-emitting layer 523R, the layer 524, and the like. The light-emitting device 550R includes a layer 525 and the like between the light-emitting unit 512R_2 and the electrode 502. Note that the layer 525 can also be regarded as part of the light-emitting unit 512R_2.

The layer 521 includes, for example, a layer containing a substance with a high hole-injection property (hole-injection layer). The layer 522 includes, for example, a layer containing a substance with a high hole-transport property (hole-transport layer). The layer 524 includes, for example, a layer containing a substance with a high electron-transport property (electron-transport layer). The layer 525 includes, for example, a layer containing a substance with a high electron-injection property (electron-injection layer).

Alternatively, the layer 521 may include an electron-injection layer, the layer 522 may include an electron-transport layer, the layer 524 may include a hole-transport layer, and the layer 525 may include a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

FIG. 34A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The intermediate layer 531 has a function of injecting electrons into one of the light-emitting unit 512R_1 and the light-emitting unit 512R_2 and injecting holes into the other when voltage is applied between the electrode 501 and the electrode 502. The intermediate layer 531 can also be referred to as a charge-generation layer.

For example, the intermediate layer 531 can be suitably formed using a material that can be used for the electron-injection layer, such as lithium fluoride. For another example, the intermediate layer can be suitably formed using a material that can be used for the hole-injection layer. A layer containing a hole-transport material and an acceptor material (electron-accepting material) can be used as the intermediate layer. A layer containing an electron-transport material and a donor material can be used as the intermediate layer. Forming the intermediate layer including such a layer can suppress an increase in the driving voltage that would be caused by stacking light-emitting units.

Note that the light-emitting layer 523R included in the light-emitting device 550R contains a light-emitting substance that emits red light, a light-emitting layer 523G included in the light-emitting device 550G contains a light-emitting substance that emits green light, and a light-emitting layer 523B included in the light-emitting device 550B contains a light-emitting substance that emits blue light. Note that the light-emitting device 550G and the light-emitting device 550B have a structure in which the light-emitting layer 523R included in the light-emitting device 550R is replaced with the light-emitting layer 523G and the light-emitting layer 523B, respectively, and the other components are similar to those of the light-emitting device 550R.

The structure (material, thickness, and the like) of the layer 521, the layer 522, the layer 524, and the layer 525 may be the same or different from each other among the light-emitting devices of different colors.

A structure in which a plurality of light-emitting units are connected in series with the intermediate layer 531 therebetween as in the light-emitting device 550R, the light-emitting device 550G, and the light-emitting device 550B is referred to as a tandem structure in this specification. By contrast, a structure in which one light-emitting unit is provided between a pair of electrodes is referred to as a single structure. Note that in this specification and the like, the term "tandem structure" is used; however, without being limited to this, the tandem structure may be referred to as a stack structure, for example. The tandem structure enables a light-emitting device to emit light at high luminance. Furthermore, the tandem structure reduces the amount of current needed for obtaining the same luminance as compared with a single structure, and thus can improve the reliability.

A structure in which light-emitting layers of light-emitting devices are separately formed as in the light-emitting device 550R, the light-emitting device 550G, and the light-emitting device 550B is referred to as an SBS (Side By Side) structure in some cases. The SBS structure can optimize materials and structures of light-emitting devices and thus can extend freedom of choice of materials and structures, whereby the luminance and the reliability can be easily improved.

The display apparatus 500 can be regarded as employing a tandem structure and an SBS structure. Thus, the display apparatus 500 can take advantages of both the tandem structure and the SBS structure. As illustrated in FIG. 34A, two light-emitting units are formed in series in the display apparatus 500, and this structure may be referred to as a two-unit tandem structure. In the two-unit tandem structure illustrated in FIG. 34A, a second light-emitting unit including a red-light-emitting layer is stacked over a first light-emitting unit including a red-light-emitting layer. Similarly, in the two-unit tandem structure illustrated in FIG. 34A, a second light-emitting unit including a green-light-emitting layer is stacked over a first light-emitting unit including a green-light-emitting layer, and a second light-emitting unit including a blue-light-emitting layer is stacked over a first light-emitting unit including a blue-light-emitting layer.

In FIG. 34A, the light-emitting unit 512R_1, the intermediate layer 531, the light-emitting unit 512R_2, and the layer 525 can be formed as an island-shaped layer. The light-emitting unit 512G_1, the intermediate layer 531, the light-emitting unit 512G_2, and the layer 525 can be formed as an island-shaped layer. The light-emitting unit 512B_1, the intermediate layer 531, the light-emitting unit 512B_2, and the layer 525 can be formed as an island-shaped layer. That is, a layer 113 illustrated in FIG. 34A corresponds to the first layer 113a, the second layer 113b, or the third layer 113c illustrated in FIG. 25B or the like.

Figure 34B:
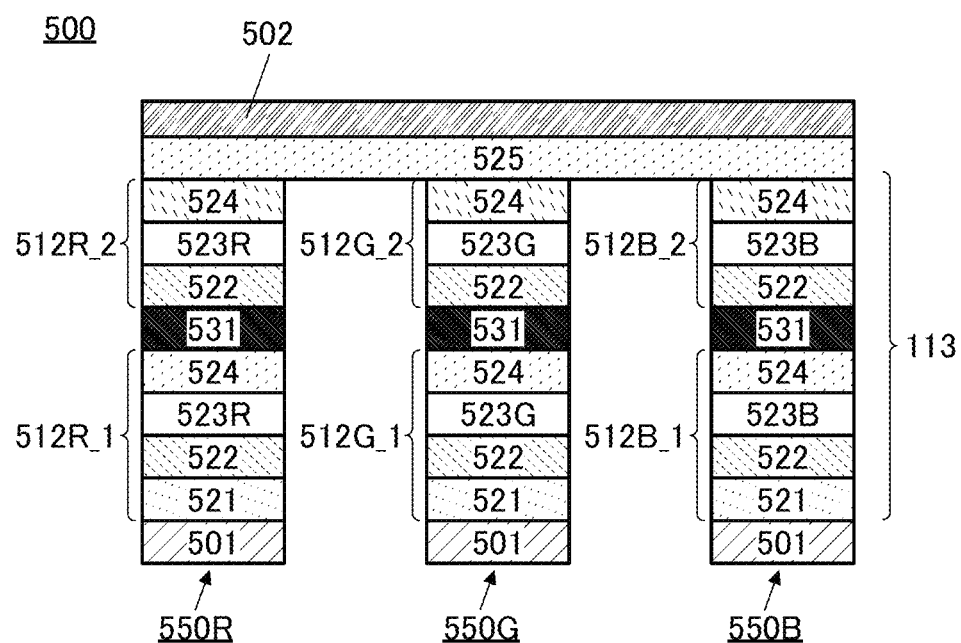

FIG. 34B illustrates a modification example of the display apparatus 500 illustrated in FIG. 34A. The display apparatus 500 illustrated in FIG. 34B is an example of the case where like the electrode 502, the layer 525 is shared by the light-emitting devices. In this case, the layer 525 can be referred to as a common layer. By providing one or more common layers for a plurality of light-emitting devices in this manner, the fabrication process can be simplified, resulting in a reduction in manufacturing cost.

In FIG. 34A, the light-emitting unit 512R_1, the intermediate layer 531, and the light-emitting unit 512R_2 can be formed as an island-shaped layer. The light-emitting unit 512G_1, the intermediate layer 531, and the light-emitting unit 512G_2 can be formed as an island-shaped layer. The light-emitting unit 512B_1, the intermediate layer 531, and the light-emitting unit 512B_2 can be formed as an island-shaped layer. That is, the layer 113 illustrated in FIG. 34B corresponds to the first layer 113a, the second layer 113b, or the third layer 113c illustrated in FIG. 25B or the like. The layer 525 corresponds to the sixth layer 114 illustrated in FIG. 25B. Note that also in FIG. 35 to FIG. 37, a layer corresponding to the first layer 113a, the second layer 113b, or the third layer 113c illustrated in FIG. 25B or the like is denoted by the layer 113.

Figure 35A:
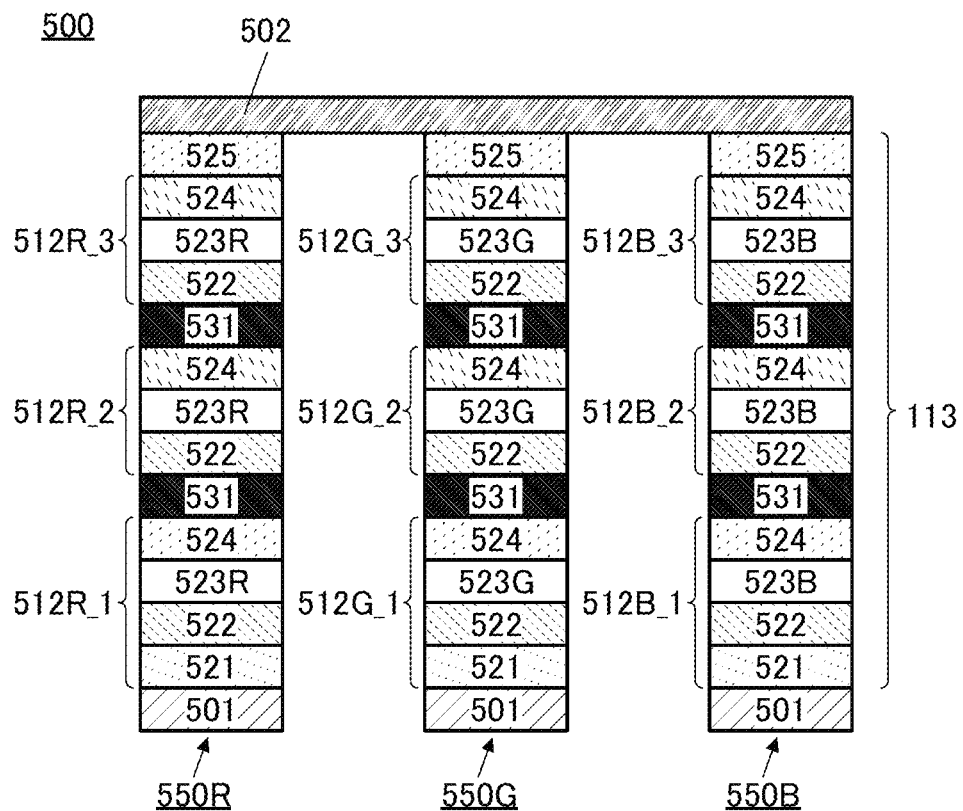
FIG. 35A and FIG. 35B are cross-sectional views illustrating examples of a display apparatus.

The display apparatus 500 illustrated in FIG. 35A is an example in which three light-emitting units are stacked. In the light-emitting device 550R in FIG. 35A, a light-emitting unit 512R_3 is further stacked over the light-emitting unit 512R_2 with another intermediate layer 531 therebetween. The light-emitting unit 512R_3 includes the layer 522, the light-emitting layer 523R, the layer 524, and the like. The light-emitting unit 512R_3 can have a structure similar to that of the light-emitting unit 512R_2. The same applies to a light-emitting unit 512G_3 included in the light-emitting device 550G and a light-emitting unit 512B_3 included in the light-emitting device 550B.

Figure 35B:
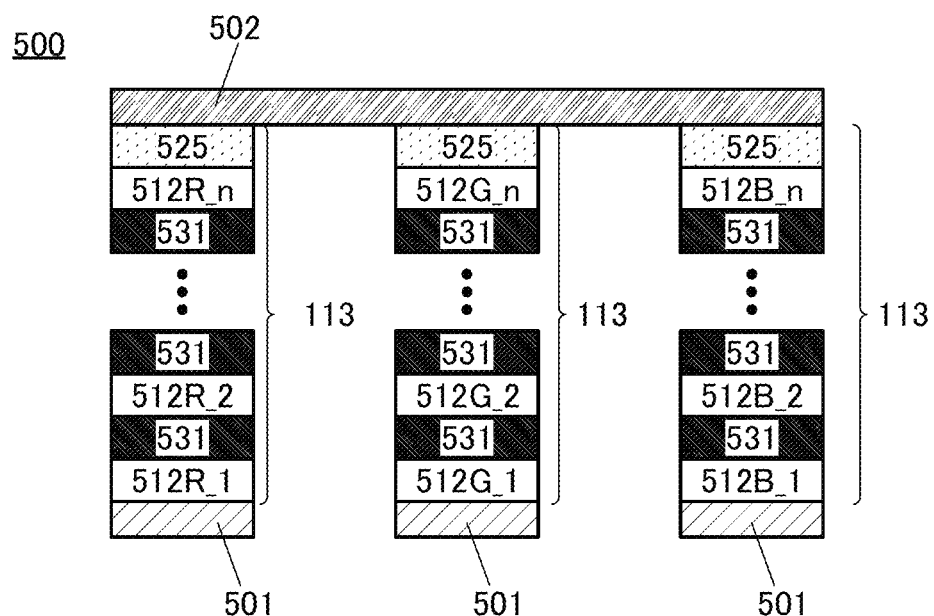

FIG. 35B illustrates an example in which n light-emitting units (n is an integer greater than or equal to 2) are stacked.

When the number of stacked light-emitting units is increased in the above manner, luminance obtained from the light-emitting device with the same amount of current can be increased in accordance with the number of stacked layers. Moreover, increasing the number of stacked light-emitting units can reduce current necessary for obtaining the same luminance; thus, power consumption of the light-emitting device can be reduced in accordance with the number of stacked layers.

Figure 36A:
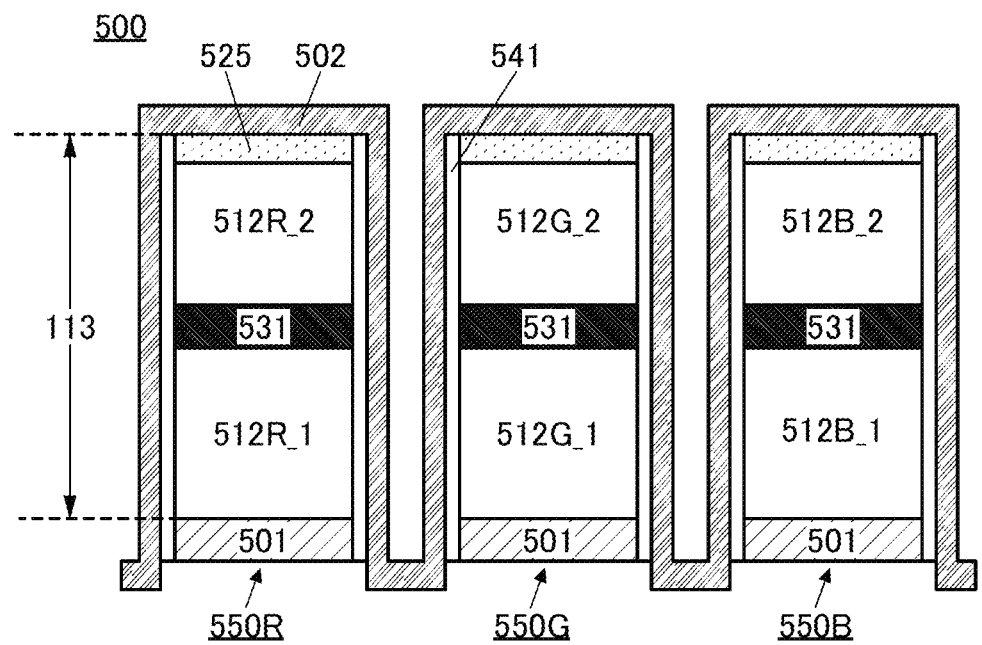
FIG. 36A and FIG. 36B are cross-sectional views illustrating examples of a display apparatus.

The display apparatus 500 illustrated in FIG. 36A is an example in which two adjacent light-emitting devices are apart from each other and the electrode 502 is provided along the side surfaces of the light-emitting units and the intermediate layers 531.

Here, the intermediate layer 531 and the electrode 502 might be electrically short-circuited when in contact with each other. Thus, the intermediate layer 531 and the electrode 502 are preferably insulated from each other.

FIG. 36A illustrates an example in which an insulating layer 541 is provided to cover the side surfaces of the electrode 501, the light-emitting units, and the intermediate layer 531. The insulating layer 541 can be referred to as a sidewall, a sidewall protective layer, a sidewall insulating film, or the like. With the insulating layer 541, the intermediate layer 531 and the electrode 502 can be electrically insulated from each other.

The side surfaces of the light-emitting units and the intermediate layer 531 are preferably perpendicular to or substantially perpendicular to the formation surface. For example, the angle between the formation surface and these side surfaces is preferably greater than or equal to 60° and less than or equal to 90°.

Figure 36B:
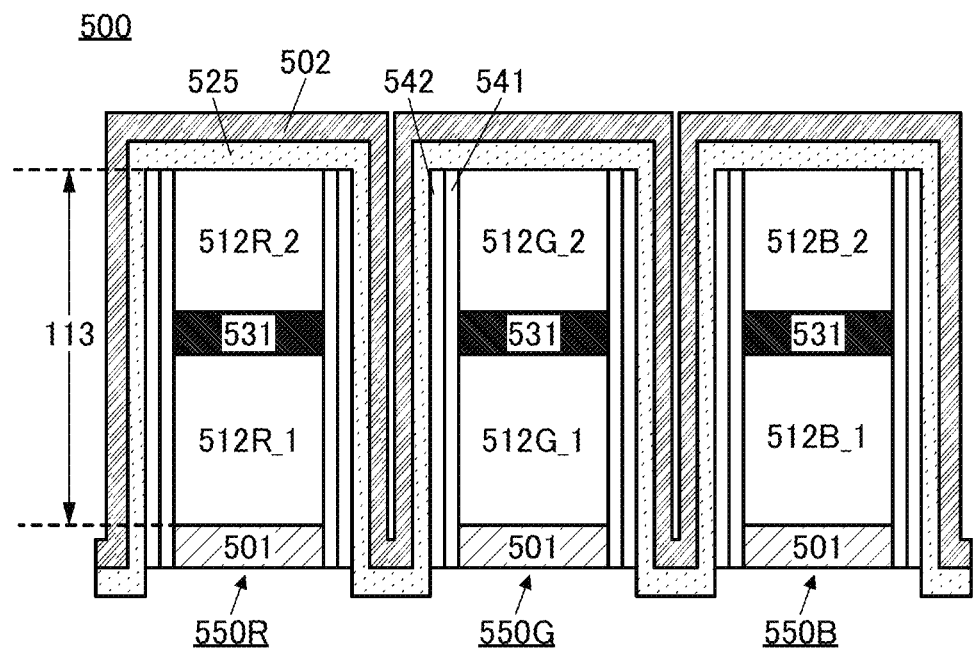

FIG. 36B illustrates an example in which the layer 525 and the electrode 502 are provided along the side surfaces of the light-emitting units and the intermediate layers 531. Furthermore, a two-layer structure of the insulating layer 541 and an insulating layer 542 is provided as a sidewall protective layer.

Figure 37A:
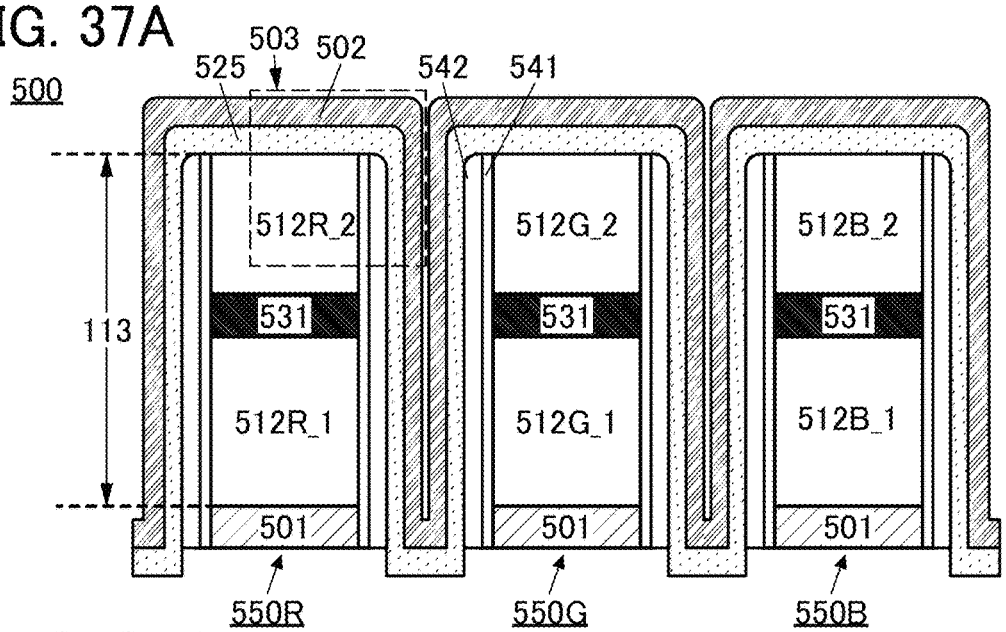
FIG. 37A to FIG. 37C are cross-sectional views illustrating examples of a display apparatus.
Figure 37B:
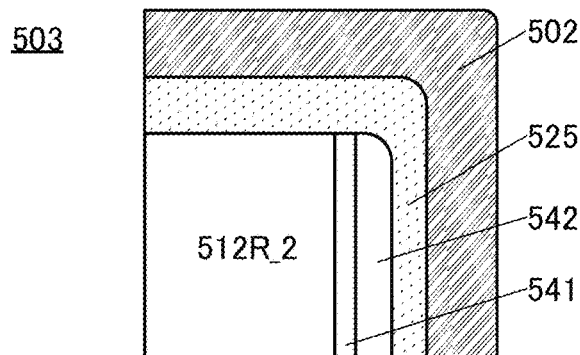

FIG. 37A illustrates a modification example of FIG. 36B. FIG. 37B is an enlarged view of a region 503 illustrated in FIG. 37A. The shape of an end portion of the insulating layer 542 in FIG. 37A is different from that in FIG. 36B. The shape of the end portion of the insulating layer 542 is different and the layer 525 and the electrode 502 are formed along the shape of the insulating layer 542; accordingly, the shapes of the layer 525 and the electrode 502 are also different. FIG. 37A is different from FIG. 36B in that the thickness of the insulating layer 542 is larger than the thickness of the insulating layer 541. The shape of the end portion of the insulating layer 542 can be a rounded shape as in FIG. 37B. For example, the end portion of the insulating layer 542 is rounded as illustrated in FIG. 37B when an upper portion of the insulating layer 542 is etched by anisotropic etching in formation of the insulating layer 542 by a dry etching method. The rounded end portion of the insulating layer 542 is suitable because coverage with the layer 525 and the electrode 502 can be increased. As illustrated in FIG. 37A and FIG. 37B, the end portion is easily rounded in some cases when the thickness of the insulating layer 542 is larger than the thickness of the insulating layer 541.

Owing to the insulating layer 541 (and the insulating layer 542) functioning as the sidewall protective layer, the electrode 502 and the intermediate layer 531 can be prevented from being electrically short-circuited. Furthermore, the insulating layer 541 (and the insulating layer 542) covers the side surfaces of the electrode 501, whereby the electrode 501 and the electrode 502 can be prevented from being electrically short-circuited. Thus, an electric short circuit at corner portions of four corners of the light-emitting device can be prevented.

An inorganic insulating film is preferably used for each of the insulating layer 541 and the insulating layer 542. For example, an oxide or a nitride such as silicon oxide, silicon oxynitride, silicon nitride oxide, silicon nitride, aluminum oxide, aluminum oxynitride, or hafnium oxide can be used. Yttrium oxide, zirconium oxide, gallium oxide, tantalum oxide, magnesium oxide, lanthanum oxide, cerium oxide, neodymium oxide, or the like may be used.

The insulating layer 541 and the insulating layer 542 can be formed by any of a variety of film formation methods such as a sputtering method, an evaporation method, a CVD method, and an ALD method, for example. In particular, the insulating layer 541 that is formed directly on the light-emitting units and the intermediate layer 531 is preferably formed by an ALD method, which causes little damage on a formation layer. At this time, the insulating layer 542 is preferably formed by a sputtering method, in which case the productivity can be increased.

For example, an aluminum oxide film formed by an ALD method can be used as the insulating layer 541 and a silicon nitride film formed by a sputtering method can be used as the insulating layer 542.

One or both of the insulating layer 541 and the insulating layer 542 preferably have a function of a barrier insulating film against at least one of water and oxygen. Alternatively, one or both of the insulating layer 541 and the insulating layer 542 preferably have a function of inhibiting diffusion of at least one of water and oxygen. Alternatively, one or both of the insulating layer 541 and the insulating layer 542 preferably have a function of capturing or fixing (also referred to as gettering) at least one of water and oxygen.

Note that in this specification and the like, a barrier insulating film refers to an insulating film having a barrier property. In this specification and the like, a barrier property refers to a function of inhibiting diffusion of a targeted substance (also referred to as having low permeability). Alternatively, a barrier property refers to a function of capturing or fixing (also referred to as gettering) a targeted substance.

When one or both of the insulating layer 541 and the insulating layer 542 have a function of the barrier insulating film or a gettering function, entry of impurities (typically, water or oxygen) that would diffuse into the light-emitting devices from the outside can be suppressed. With such a structure, the display apparatus can have high reliability.

Figure 37C:
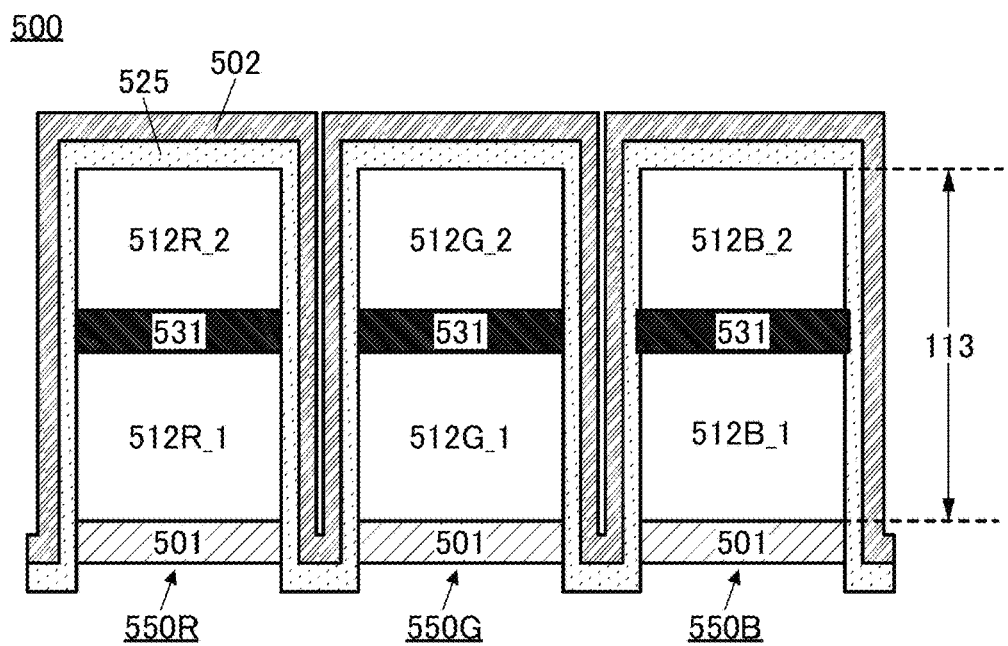

As illustrated in FIG. 37C, the insulating layer 541 and the insulating layer 542 that function as the sidewall protective layer are not necessarily provided. In FIG. 37C, the layer 525 is provided in contact with the side surfaces of the light-emitting units and the intermediate layers 531.

There is no particular limitation on the light-emitting material of the light-emitting layer in the display apparatus 500. For example, in the display apparatus 500 illustrated in FIG. 34A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a fluorescent material, the light-emitting layer 523G included in the light-emitting unit 512G_2 contains a fluorescent material, the light-emitting layer 523B included in the light-emitting unit 512B_1 contains a fluorescent material, and the light-emitting layer 523B included in the light-emitting unit 512B_2 contains a fluorescent material.

Alternatively, in the display apparatus 500 illustrated in FIG. 34A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a phosphorescent material, the light-emitting layer 523G included in the light-emitting unit 512G_2 contains a phosphorescent material, the light-emitting layer 523B included in the light-emitting unit 512B_1 contains a fluorescent material, and the light-emitting layer 523B included in the light-emitting unit 512B_2 contains a fluorescent material.

Note that in the display apparatus of one embodiment of the present invention, all the light-emitting layers may contain fluorescent materials or all the light-emitting layers may contain phosphorescent materials.

Alternatively, the display apparatus 500 illustrated in FIG. 34A may employ a structure in which the light-emitting layer 523R included in the light-emitting unit 512R_1 contains a phosphorescent material and the light-emitting layer 523R included in the light-emitting unit 512R_2 contains a fluorescent material, or a structure in which the light-emitting layer 523R included in the light-emitting unit 512R_1 contains a fluorescent material and the light-emitting layer 523R included in the light-emitting unit 512R_2 contains a phosphorescent material, i.e., a structure in which a light-emitting layer in a first unit and a light-emitting layer in a second unit are formed using different light-emitting materials. Note that here, the light-emitting unit 512R_1 and the light-emitting unit 512R_2 are described, and the same structure can also be employed for the light-emitting unit 512G_1 and the light-emitting unit 512G_2, and the light-emitting unit 512B_1 and the light-emitting unit 512B_2.

This embodiment can be combined with the other embodiments as appropriate.

Embodiment 6

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region. Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 7

In this embodiment, electronic devices of one embodiment of the present invention will be described with reference to FIG. 38 to FIG. 40.

An electronic device of this embodiment is provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include a digital camera, a digital video camera, a digital photo frame, a mobile phone, a portable game machine, a portable information terminal, and an audio reproducing device in addition to electronic devices with a relatively large screen, such as a television device, a desktop or laptop personal computer, a monitor of a computer or the like, digital signage, and a large game machine such as a pachinko machine.

In particular, a display apparatus of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display apparatus with high definition and high resolution, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 38A:
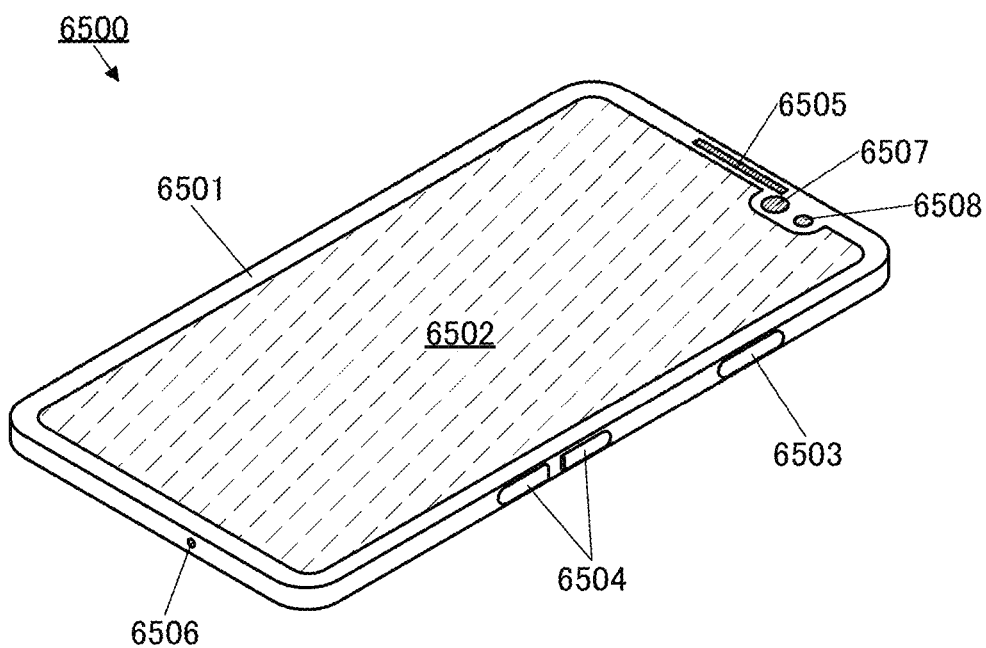
FIG. 38A and FIG. 38B are diagrams illustrating an example of an electronic device.

An electronic device 6500 illustrated in FIG. 38A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 38B:
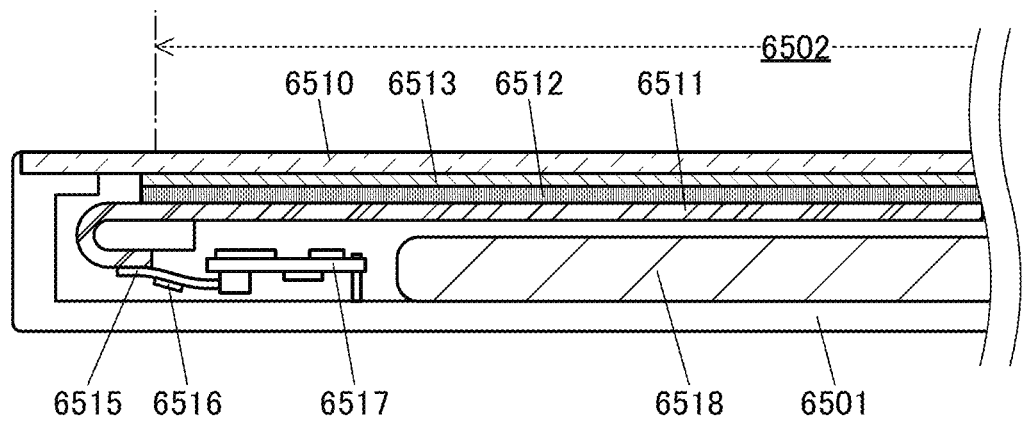

FIG. 38B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of a pixel portion, whereby an electronic device with a narrow bezel can be achieved.

Figure 39A:
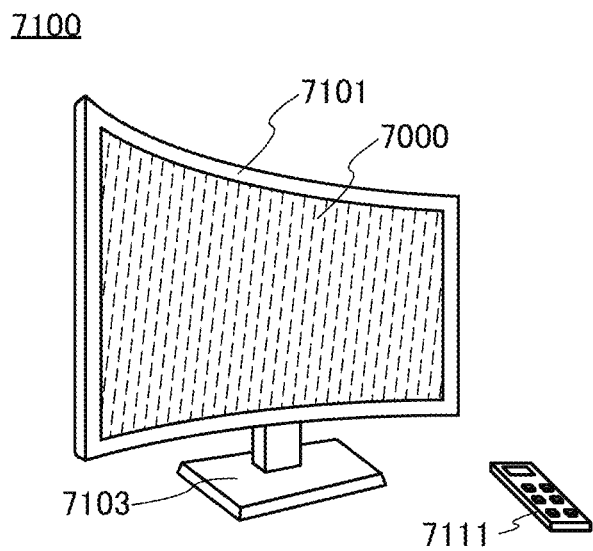
FIG. 39A to FIG. 39D are diagrams illustrating examples of electronic devices.

FIG. 39A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 39A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 39B:
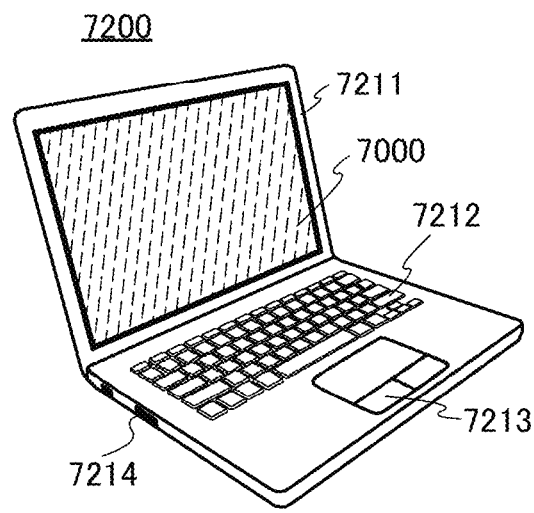

FIG. 39B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 39C:
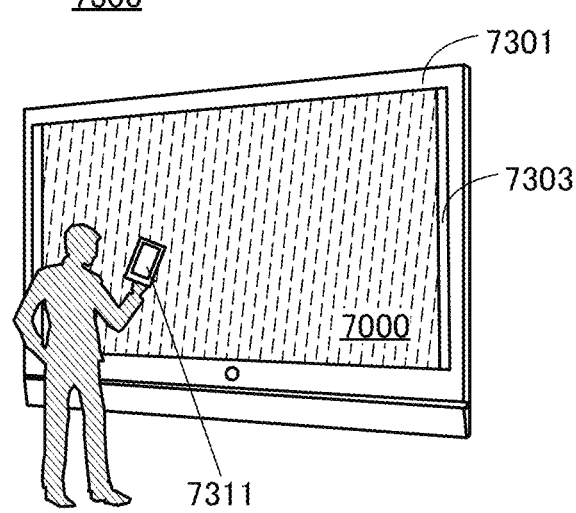
Figure 39D:
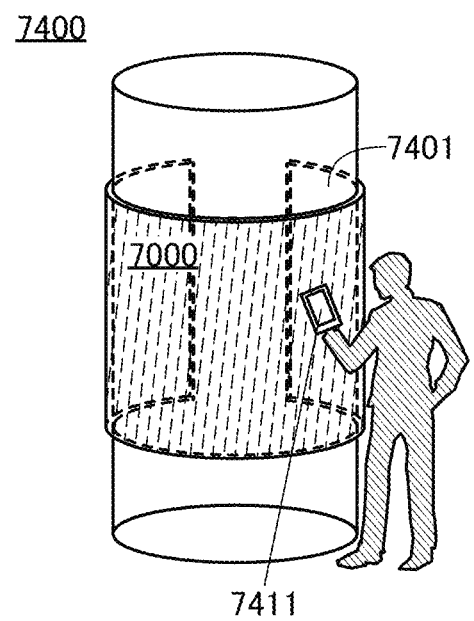

FIG. 39C and FIG. 39D illustrate examples of digital signage.

Digital signage 7300 illustrated in FIG. 39C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 39D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 39C and FIG. 39D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 39C and FIG. 39D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 40A to FIG. 40F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic devices illustrated in FIG. 40A to FIG. 40F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a recording medium (an external recording medium or a recording medium incorporated in the camera), a function of displaying the taken image on the display portion, or the like.

The electronic devices illustrated in FIG. 40A to FIG. 40F will be described in detail below.

Figure 40A:
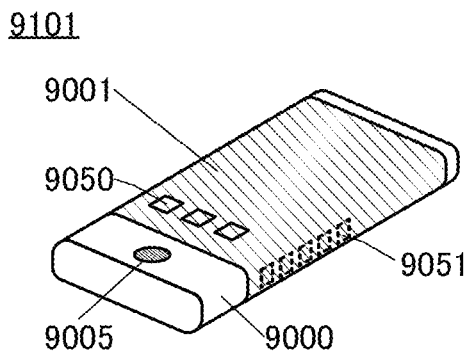
FIG. 40A to FIG. 40F are diagrams illustrating examples of electronic devices.

FIG. 40A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 40A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 40C:
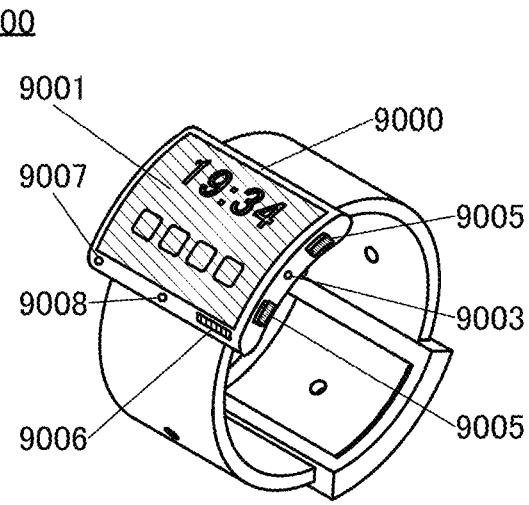
Figure 40B:
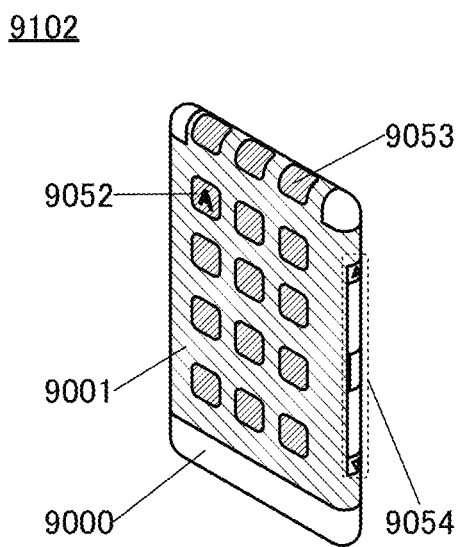

FIG. 40B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 40C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 40D:
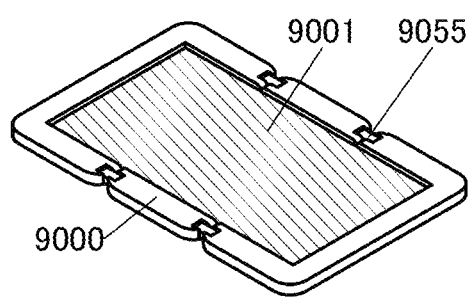
Figure 40E:
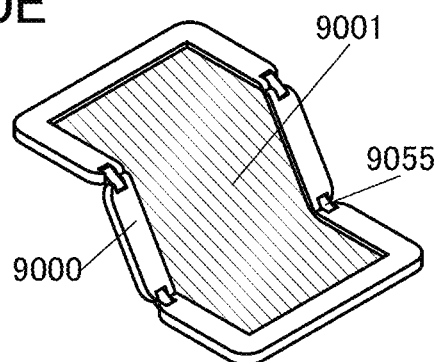
Figure 40F:
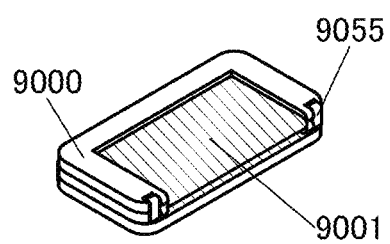

FIG. 40D to FIG. 40F are perspective views illustrating a foldable portable information terminal 9201. FIG. 40D is a perspective view of an opened state of the portable information terminal 9201, FIG. 40F is a perspective view of a folded state thereof, and FIG. 40E is a perspective view of a state in the middle of change from one of FIG. 40D and FIG. 40F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

The display apparatus and the electronic device of one embodiment of the present invention can be incorporated in an inside wall or an outside wall of a house or a building or the interior or the exterior of a vehicle.

Figure 41:
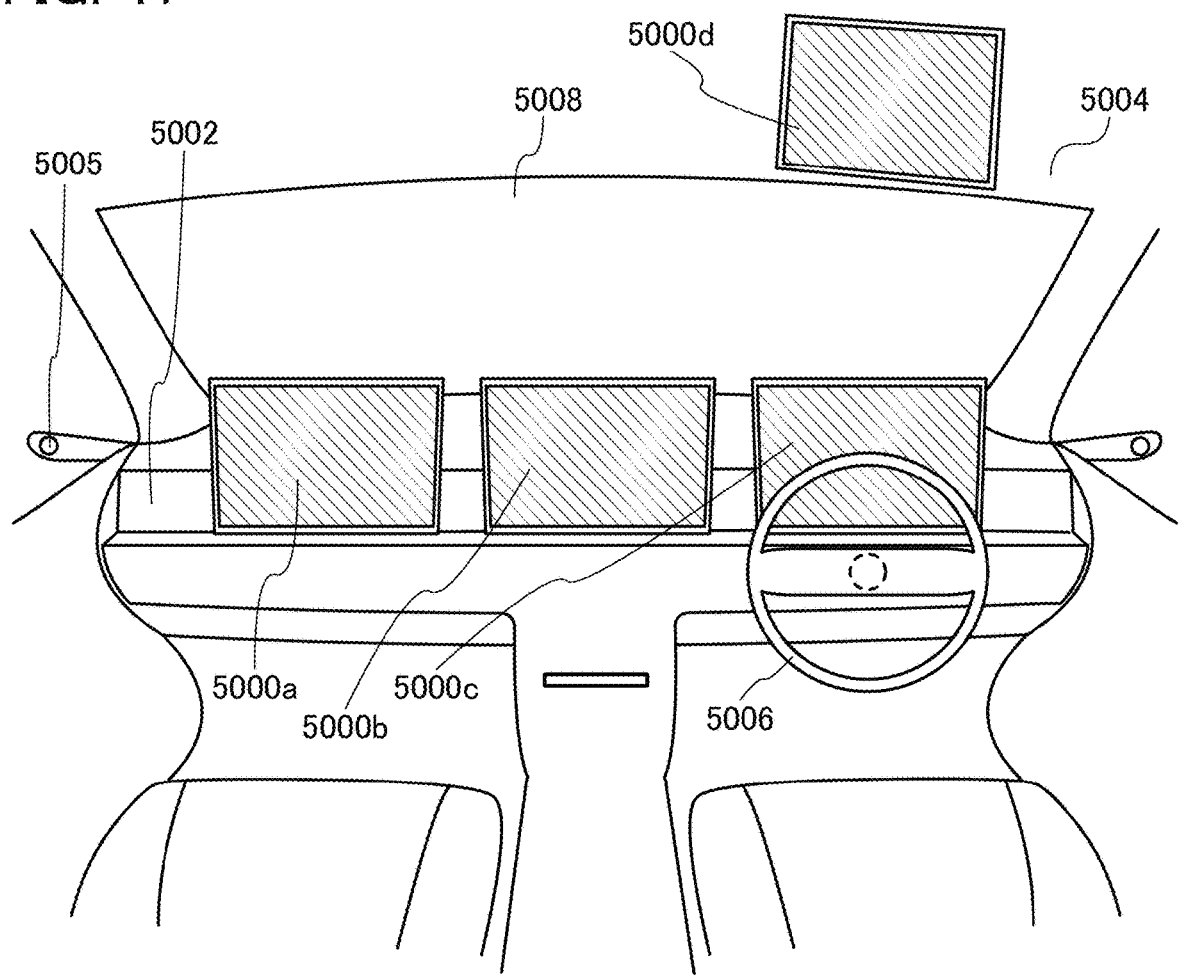
FIG. 41 is a diagram illustrating an example of a vehicle.

FIG. 41 illustrates an example in which the display apparatus of one embodiment of the present invention is installed in a vehicle. In the vehicle illustrated in FIG. 41, a display apparatus 5000*a*, a display apparatus 5000*b*, and a display apparatus 5000*c* are installed on a dashboard 5002. A display apparatus 5000*d* is installed on a ceiling 5004 on the driver's seat side. Note that in the example illustrated in FIG. 41, the display apparatus 5000*d* is installed in, but not limited to, a right-hand drive vehicle; installation in a left-hand drive vehicle is also possible. In that case, the left and right of the components arranged in FIG. 41 are reversed. FIG. 41 illustrates a steering wheel 5006, a windshield 5008, and the like that are arranged around a driver's seat and a front passenger seat.

It is preferable that one or more of the display apparatus 5000*a* to the display apparatus 5000*d* have a near touch sensor function. With the near touch sensor function, the user can operate the display apparatus without staring at the display apparatus. In particular, a driver can operate the display apparatus without significantly moving the line of sight from the front side, which can enhance the safety while the vehicle is driven and stopped. A display portion of each of the display apparatus 5000*a* to the display apparatus 5000*d* has a diagonal preferably greater than or equal to 5 inches, further preferably greater than or equal to 10 inches. A display apparatus in which a display portion has a diagonal of approximately 13 inches can be suitably used as each of the display apparatus 5000*a* to the display apparatus 5000*d*, for example.

Note that the display apparatus 5000*a* to the display apparatus 5000*d* may be flexible. The flexible display apparatuses can be incorporated along even a curved surface. For example, the display apparatuses can be provided along a curved surface such as the dashboard 5002 or the ceiling 5004.

A plurality of cameras 5005 may be provided outside the vehicle. The cameras 5005 can capture images of the surroundings of the vehicle, e.g., the situations at the rear side. Although the cameras 5005 are provided instead of side mirrors in the example illustrated in FIG. 41, both the side mirrors and the cameras may be provided.

As the cameras 5005, a CCD camera, a CMOS camera, or the like can be used. In addition, an infrared camera may be used in combination with such a camera. The infrared camera, which has a higher output level with a higher temperature of an object, can detect or extract a living body such as a human or an animal.

Images captured with the cameras 5005 can be output to one or more of the display apparatus 5000*a* to the display apparatus 5000*d*. The display apparatus 5000*a* to the display apparatus 5000*d* are mainly used for supporting driving of the vehicle. Images of the situations at the rear side are captured at a wide angle of view with the cameras 5005, and the images are displayed on one or more of the display apparatus 5000*a* to the display apparatus 5000*d* so that the driver can see a blind area for avoiding an accident.

A distance image sensor may be provided, for example, over a roof of the vehicle, and an image obtained by the distance image sensor may be displayed on one or more of the display apparatus 5000*a* to the display apparatus 5000*d*. As the distance image sensor, an image sensor, LIDAR (Light Detection and Ranging), or the like can be used. When an image obtained by the image sensor and the image obtained by the distance image sensor are displayed on one or more of the display apparatus 5000*a* to the display apparatus 5000*d*, more pieces of information can be provided to the driver to support driving.

One or more of the display apparatus 5000*a* to the display apparatus 5000*d* may have a function of displaying map information, traffic information, television images, DVD images, and the like.

A display panel having an image capturing function is preferably used for at least one of the display apparatus 5000*a* to the display apparatus 5000*d*. For example, when the driver touches the display panel, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the steering wheel, adjustment of the direction of the cameras 5005, setting of brightness, setting of an air conditioner, setting of the speed (frequency) of wipers, volume setting of audio, and reading of the playlist of the audio are preferably performed after authentication.

A vehicle can be brought into a state where the vehicle can be driven, e.g., a state where an engine is started, after the driver is authenticated by biometric authentication. This is preferable because a key, which is conventionally necessary, is unnecessary.

This embodiment can be combined with the other embodiments as appropriate.

REFERENCE NUMERALS

AL: wiring, C11: capacitor, CDB: wiring, CL: wiring, EL: light-emitting device, ELB: light-emitting device, ELG: light-emitting device, ELR: light-emitting device, IVB: wiring, M11: transistor, M12: transistor, M13: transistor, M14: transistor, M15: transistor, PD1: light-receiving device, PD2: light-receiving device, RE[i+1]: wiring, RE[i]: wiring, RE[k]: wiring, RE: wiring, RS[i+1]: wiring, RS[i]: wiring, RS: wiring, SCL: wiring, SE[i+1]: wiring, SE[i]: wiring, SE[k]: wiring, SE: wiring, SFB: wiring, SFR: wiring, SH: node, SL: wiring, SLB[/+1]: wiring, SLB[j]: wiring, SLB: wiring, SLG[/+1]: wiring, SLG[j]: wiring, SLG: wiring, SLR[j+1]: wiring, SLR[j]: wiring, SLR: wiring, $S_{OUT}$: signal, SW[i+1]: wiring, SW[i]: wiring, SW[k]: wiring, SW: wiring, T11: time, T12: time, T13: time, T14: time, T21: time, T22: time, T23: time, T24: time, T31: time, T32: time, T33: time, T34: time, T41: time, T42: time, T43: time, T44: time, T51: time, TX[i+1]: wiring, TX[i]: wiring, TX[k]: wiring, TX: wiring, VCL: wiring, VCP: wiring, VIV: wiring, VPI: wiring, VRS: wiring, VRSF: wiring, WX[j+1]: wiring, WX[j]: wiring, WX: wiring, 10: display apparatus, 11A: display portion, 11B: display portion, 11C: display portion, 11D: display portion, 11E: display portion, 11: display portion, 12: driver circuit portion, 13: driver circuit portion, 14: driver circuit portion, 15: circuit portion, 21B: pixel circuit, 21B[i+1,j+1]: pixel circuit, 21B[i+1,j]: pixel circuit, 21B[i,j+1]: pixel circuit, 21B[i,j]: pixel circuit, 21G: pixel circuit, 21G[i+1,j+1]: pixel circuit, 21G[i+1,j]: pixel circuit, 21G[i,j+1]: pixel circuit, 21G[i,j]: pixel circuit, 21IR: pixel circuit, 21R: pixel circuit, 21R[i+1,j+1]: pixel circuit, 21R [i+1,j]: pixel circuit, 21R[i,j+1]: pixel circuit, 21R[i,j]: pixel circuit, 21: pixel circuit, 22[*i*+1,*j*+1]: pixel circuit, 22[*i*+1,*j*]: pixel circuit, 22[*i*,*j*+1]: pixel circuit, 22[*i*,*j*]: pixel circuit, 22[*k*,*j*+1]: pixel circuit, 22[*k*,*j*]: pixel circuit, 22: pixel circuit, 30[*i*+1,*j*+1]: pixel, 30[*i*+1,*j*]: pixel, 30[*i*,*j*+1]: pixel, 30[*i*,*j*]: pixel, 30: pixel, 31B: light, 31G: light, 31IR: infrared light, 31R: light, 32G: reflected light, 32IR: reflected light, 32R: light, 50: circuit, 51[*j*]: circuit, 51: circuit, 52[*j*]: circuit, 52: circuit, 53[*j*]: circuit, 53: circuit, 54: circuit, 55: circuit, 56: circuit, 61: transistor, 62: transistor, 63: transistor, 64: transistor, 65: transistor, 66: transistor, 67: transistor, 68: transistor, 69: transistor, 71: transistor, 72: transistor, 73: transistor, 74: transistor, 81: capacitor, 82: capacitor, 83: capacitor, 84: capacitor, 91: blood vessel, 93: biological tissue, 100A: display apparatus, 100B: display apparatus, 100C: display apparatus, 100D: display apparatus, 100E: display apparatus, 100F: display apparatus, 100G: display apparatus, 100H: display apparatus, 100: display apparatus, 101: layer, 102: substrate, 103: housing, 104: light source, 105: protection member, 106: substrate, 108: object, 110*a*: subpixel, 110A: pixel, 110*b*: subpixel, 110*c*: subpixel, 110*d*: subpixel, 110*e*: subpixel, 110*f*: subpixel, 110: pixel, 111*a*: pixel electrode, 111*b*: pixel electrode, 111*c*: pixel electrode, 111*d*: pixel electrode, 111*e*: pixel electrode, 111*f*: pixel electrode, 113*a*: first layer, 113*b*: second layer, 113*c*: third layer, 113*d*: fourth layer, 113*e*: fifth layer, 113*f*: seventh layer, 113: layer, 114: sixth layer, 115: common electrode, 118A: first sacrificial layer, 118*a*: first sacrificial layer, 118B: first sacrificial layer, 118*b*: first sacrificial layer, 118*c*: first sacrificial layer, 118*d*: first sacrificial layer, 118*e*: first sacrificial layer, 119A: second sacrificial layer, 119*a*: second sacrificial layer, 119B: second sacrificial layer, 119*b*: second sacrificial layer, 119*c*: second sacrificial layer, 119*d*: second sacrificial layer, 119*e*: second sacrificial layer, 119: resin layer, 120: substrate, 121: insulating layer, 123: conductive layer, 130*a*: light-emitting device, 130B: light-emitting device, 130*b*: light-emitting device, 130*c*: light-emitting device, 130*f*: light-emitting device, 130G: light-emitting device, 130IR: light-emitting device, 130R: light-emitting device, 131: protective layer, 133: space, 140: connection portion, 142: adhesive layer, 148: light-blocking layer, 150*d*: light-receiving device, 150*e*: light-receiving device, 150IRS: light-receiving device, 150PS: light-receiving device, 151: substrate, 152: substrate, 162: display portion, 164: circuit, 165: wiring, 166: conductive layer, 172: FPC, 173: IC, 180A: pixel, 180B: pixel, 180C: pixel, 180D: pixel, 181A: first hole-injection layer, 181*a*: first hole-injection layer, 181B: second hole-injection layer, 181*b*: second hole-injection layer, 181*c*: third hole-injection layer, 181*f*: seventh hole-injection layer, 182A: first hole-transport layer, 182*a*: first hole-transport layer, 182B: second hole-transport layer, 182*b*: second hole-transport layer, 182*c*: third hole-transport layer, 182*d*: fourth hole-transport layer, 182*e*: fifth hole-transport layer, 182*f*: seventh hole-transport layer, 183A: first light-emitting layer, 183*a*: first light-emitting layer, 183B: second light-emitting layer, 183*b*: second light-emitting layer, 183*c*: third light-emitting layer, 183*f*: fourth light-emitting layer, 184A: first electron-transport layer, 184*a*: first electron-transport layer, 184B: second electron-transport layer, 184*b*: second electron-transport layer, 184*c*: third electron-transport layer, 184*d*: fourth electron-transport layer, 184*e*: fifth electron-transport layer, 184*f*: seventh electron-transport layer, 185*d*: first active layer, 185*e*: second active layer, 190*a*: resist mask, 190*b*: resist mask, 201: transistor, 204: connection portion, 205*a*: transistor, 205*e*: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: low-resistance region, 231: semiconductor layer, 242: connection layer, 400: portable information terminal, 402: housing, 404: display portion, 406: finger, 408: region, 410: region, 412: image, 500: display apparatus, 501: electrode, 502: electrode, 503: region, 512B_1: light-emitting unit, 512B_2: light-emitting unit, 512B_3: light-emitting unit, 512G_1: light-emitting unit, 512G_2: light-emitting unit, 512G_3: light-emitting unit, 512R_1: light-emitting unit, 512R_2: light-emitting unit, 512R_3: light-emitting unit, 521: layer, 522: layer, 523B: light-emitting layer, 523G: light-emitting layer, 523R: light-emitting layer, 524: layer, 525: layer, 531: intermediate layer, 541: insulating layer, 542: insulating layer, 550B: light-emitting device, 550G: light-emitting device, 550R: light-emitting device, 772: electrode, 786*a*: EL layer, 786*b*: EL layer, 786: EL layer, 788: electrode, 4411: light-emitting layer, 4412: light-emitting layer, 4413: light-emitting layer, 4420: layer, 4430: layer, 4440: intermediate layer, 5000*a*: display apparatus, 5000*b*: display apparatus, 5000*c*: display apparatus, 5000*d*: display apparatus, 5002: dashboard, 5004: ceiling, 5005: camera, 5006: steering wheel, 5008: windshield, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A semiconductor device comprising a plurality of pixels,
   wherein the pixels each comprise a first pixel circuit,
   wherein the first pixel circuit comprises a first light-receiving device, a second light-receiving device, a first transistor, a second transistor, a third transistor, a fourth transistor, a fifth transistor, a capacitor, and a first wiring,
   wherein one electrode of the first light-receiving device is electrically connected to the first wiring,
   wherein the other electrode of the first light-receiving device is electrically connected to one of a source and a drain of the first transistor,
   wherein one electrode of the second light-receiving device is electrically connected to the first wiring,
   wherein the other electrode of the second light-receiving device is electrically connected to one of a source and a drain of the second transistor,
   wherein the other of the source and the drain of the second transistor is electrically connected to the other of the source and the drain of the first transistor,
   wherein the other of the source and the drain of the first transistor is electrically connected to one electrode of the capacitor,
   wherein the other of the source and the drain of the first transistor is electrically connected to one of a source and a drain of the third transistor,
   wherein the other of the source and the drain of the first transistor is electrically connected to a gate of the fourth transistor, and
   wherein one of a source and a drain of the fourth transistor is electrically connected to one of a source and a drain of the fifth transistor.

2. The semiconductor device according to claim 1,
   wherein the first light-receiving device is configured to sense visible light, and
   wherein the second light-receiving device is configured to sense infrared light.

3. The semiconductor device according to claim 1, further comprising a second wiring,
   wherein the second wiring is electrically connected to the other of the source and the drain of the third transistor, and
   wherein a potential of the second wiring is lower than a potential of the first wiring.

4. The semiconductor device according to claim 1, further comprising a second wiring,
   wherein the second wiring is electrically connected to the other of the source and the drain of the third transistor, and
   wherein a potential of the second wiring is higher than a potential of the first wiring.

5. The semiconductor device according to claim 1,
   wherein the pixels each comprise a second pixel circuit,
   wherein the second pixel circuit comprises a first light-emitting device,
   wherein the first light-emitting device is configured to emit visible light, and
   wherein one electrode of the first light-emitting device is electrically connected to the first wiring.

6. The semiconductor device according to claim 5, further comprising a layer,
   wherein the first light-receiving device and the first light-emitting device are provided over the layer.

7. The semiconductor device according to claim 6,
   wherein the layer comprises the first transistor, the second transistor, the third transistor, the fourth transistor, and the fifth transistor.

8. The semiconductor device according to claim 1,
   wherein the pixels each comprise a third pixel circuit,
   wherein the third pixel circuit comprises a second light-emitting device,
   wherein the second light-emitting device is configured to emit infrared light, and
   wherein one electrode of the second light-emitting device is electrically connected to the first wiring.

9. An electronic device comprising:
   the semiconductor device according to claim 1;
   a second light-emitting device; and
   a housing,
   wherein the second light-emitting device is configured to emit infrared light, and
   wherein the second light-emitting device is configured to emit light to an outside through the semiconductor device.

* * * * *